US 8,344,917 B2

United States Patent
Misra et al.

(10) Patent No.: US 8,344,917 B2
(45) Date of Patent: Jan. 1, 2013

(54) METHODS AND SYSTEMS FOR CONTEXT INITIALIZATION IN VIDEO CODING AND DECODING

(75) Inventors: Kiran Misra, Vancouver, WA (US); Christopher A. Segall, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 12/895,676

(22) Filed: Sep. 30, 2010

(65) Prior Publication Data

US 2012/0081241 A1 Apr. 5, 2012

(51) Int. Cl.
*H03M 7/00* (2006.01)
(52) U.S. Cl. .......................................... 341/107; 341/51
(58) Field of Classification Search .................. 341/107, 341/51, 50; 382/239, 247; 375/240.24
See application file for complete search history.

(56) References Cited

U.S. PATENT DOCUMENTS

| | | | |
|---|---|---|---|
| 5,557,332 A | 9/1996 | Koyanagi et al. | |
| 5,809,176 A | 9/1998 | Yajima | |
| 7,262,722 B1 | 8/2007 | Jahanghir et al. | |
| 7,289,673 B2 * | 10/2007 | Lin et al. | 382/236 |
| 7,305,036 B2 | 12/2007 | MacInnis et al. | |
| 7,480,335 B2 * | 1/2009 | Payson | 375/240.25 |
| 7,636,395 B2 | 12/2009 | Yongang et al. | |
| 7,656,320 B2 * | 2/2010 | Schneider | 341/54 |
| 7,813,431 B2 * | 10/2010 | MacInnis | 375/240.24 |
| 7,843,997 B2 * | 11/2010 | Hellman | 375/240.18 |
| 7,925,099 B2 * | 4/2011 | Ramirez et al. | 382/232 |
| 7,937,397 B2 * | 5/2011 | Pickens | 707/750 |
| 2003/0189982 A1 | 10/2003 | MacInnis | |
| 2004/0228410 A1 | 11/2004 | Ameres et al. | |
| 2004/0258162 A1 | 12/2004 | Gordon et al. | |
| 2006/0126744 A1 | 6/2006 | Peng et al. | |
| 2007/0009047 A1 | 1/2007 | Shim et al. | |
| 2007/0133678 A1 | 6/2007 | Sakai | |
| 2007/0183491 A1 | 8/2007 | Pearson et al. | |
| 2008/0013622 A1 | 1/2008 | Bao et al. | |
| 2008/0063082 A1 | 3/2008 | Watanabe et al. | |
| 2008/0170615 A1 | 7/2008 | Sekiguchi et al. | |
| 2008/0181298 A1 | 7/2008 | Shi et al. | |
| 2008/0181304 A1 | 7/2008 | Sekiguchi et al. | |
| 2008/0187053 A1 | 8/2008 | Zhao et al. | |
| 2008/0219349 A1 | 9/2008 | Huang et al. | |
| 2008/0310745 A1 | 12/2008 | Ye et al. | |
| 2009/0196355 A1 | 8/2009 | Kao et al. | |
| 2009/0245349 A1 | 10/2009 | Zhao et al. | |
| 2010/0098155 A1 | 4/2010 | Demircin et al. | |
| 2010/0135416 A1 | 6/2010 | Huang et al. | |
| 2010/0142618 A1 | 6/2010 | Pandit et al. | |

(Continued)

FOREIGN PATENT DOCUMENTS

JP 2006-014113 A 1/2006

(Continued)

OTHER PUBLICATIONS

International Search Report—PCT/JP2011/066634—Mailing Date Oct. 25, 2011.

(Continued)

*Primary Examiner* — Brian Young
(74) *Attorney, Agent, or Firm* — Kristine Elizabeth Matthews; David C. Ripma

(57) ABSTRACT

Aspects of the present invention are related to systems and methods for context model initialization in entropy encoders and decoders.

19 Claims, 32 Drawing Sheets

U.S. PATENT DOCUMENTS

| | | |
|---|---|---|
| 2011/0026604 A1 | 2/2011 | Zhao et al. |
| 2011/0200115 A1 | 8/2011 | Hayashi et al. |

FOREIGN PATENT DOCUMENTS

| | | |
|---|---|---|
| JP | 2007-201938 A | 8/2007 |
| JP | 2007-300455 A | 11/2007 |
| WO | 2006/051796 A1 | 5/2006 |
| WO | 2009/119888 A1 | 10/2009 |
| WO | 2010095528 A1 | 8/2010 |

OTHER PUBLICATIONS

International Search Report—PCT/JP2011/066633—Mailing Date Oct. 25, 2011.

Andrew Segall et al., "A Highly Efficient and Highly Parallel System for Video Coding," Joint Collaborative Team on Video Coding (JCT-VC) of ITU-T SG16 WP3 and ISO/IEC JTC1/SC29/WG11 JCTVC-A105, Apr. 2010, pp. 25-28, Dresden, DE.

PCT/JP2009/056778—International Search Report and Written Opinion of the International Searching Authority—Date of Mailing Jun. 23, 2009.

PCT/JP2009/056778—International Search Report Corrected Version—Associated with Report Date of Mailing Jun. 23, 2009.

Erik B. Van Der Tol, Egbert G. T. Jaspers and Rob H. Gelderblom, "Mapping of H.264 decoding on a multiprocessor architecture," Image and Video Communications and Processing 2003 (Proceedings Volume), Editor(s) Bhaskaran Vasudev, T. Russell Hsing, Andrew G. Tescher and Touradj Ebrahimi, Proceedings of the SPIE, vol. 5022, pp. 707-718, May 7, 2003, USA.

Gary Sullivan, Ajay Luthra and Thomas Wiegand, "Editors' Text for ISO/IEC 14496-10:2005 (AVC 3rd Edition)," ISO/IEC JTC1/SC29/WG11 MPEG05/N7081, Apr. 2005, Section 6.3, Section 7.3.3, Section 9.3, Busan, KR.

ITU-T—Telecommunication Standardization Sector of ITU—Recommendation H.264—"Advanced video coding for generic audio visual services," Mar. 2010.

Joint Collaborative Team on Video Coding (JCT-VC) of ITU-T SG16 WP3 and ISO/IEC JTC1/SC29/WG11, "Test Model under Consideration," Document: JCTVC-A205, Jun. 6, 2010.

H.264/MPEG-4 AVC [Joint Video Team of ITU-T VCEG and ISO/IEC MPEG, "H.264: Advanced video coding for generic audiovisual services," ITU-T Rec. H.264 and ISO/IEC 14496-10 (MPEG4—Part 10), Nov. 2007].

Jie Zhao and Andrew Segall, "New Results using Entropy Slices for Parallel Decoding," VCEG-AI32, ITU—Telecommunications Standardization Sector, Study Group 16, Question 6, Video Coding Experts Group, Jul. 16-18, 2008, pp. 1-9, Meeting Berlin, Germany.

Jie Zhao and Andrew Segall, "Parallel entropy decoding for high resolution video coding," Proc. of SPIE-IS&T Electronic Imaging, SPIE vol. 7257, Jan. 19, 2009, pp. 725706-1-725706-11.

Marpe, Schwarz and Wiegand, "Context-Based Adaptive Binary Arithmetic Coding in the H.264/AVC Video Compression Standard," IEEE Transactions on Circuits and Systems for Video Technology, vol. 13, No. 7, Jul. 2003, pp. 620-636.

Extended European Search Report—Application No. 09725979.0-2223—Report dated Feb. 15, 2011.

International Search Report—International Application No. PCT/JP2010/068541—Date of mailing Dec. 7, 2010.

USPTO Office Action—U.S. Appl. No. 12/058,301—Mailing Date Jul. 22, 2011.

International Search Report—International Application No. PCT/JP/2011/073156—Mailing Date Jan. 10, 2012.

Kiran Misra, Jie Zhao, and Andrew Segall, "Entropy Slices for Parallel Entropy Coding," Joint Collaborative Team on Video Coding (JCT-VC) of ITU-T SG16 WP3 and ISO/IEC JTC1/SC29/WG11, Jul. 2010, pp. 1-6, 2nd Meeting, Geneva, CH.

Martin Winken et al., "Description of video coding technology proposal by Fraunhofer HHI," Joint Collaborative Team on Video Coding (JCT-VC) of ITU-T SG16 Wp3 and ISO/IEC JTC1/SC29/WG11, Apr. 2010, pp. 14-17, 1st Meeting, Dresden, DE.

International Search Report—International Patent Application No. PCT/JP2011/073150—Mailing Date Dec. 27, 2011.

Written Opinion of the International Searching Authority—International Patent Application No. PCT/JP2011/073150—Mailing Date Dec. 27, 2011.

USPTO Office Action—U.S. Appl. No. 12/058,301—Mailing Date Feb. 1, 2012.

USPTO Office Action—U.S. Appl. No. 12/579,236—Mailing Date Jan. 12, 2012.

Peng Zhang, Don Xie, and Wen Gao, "Variable-bin-rate CABAC engine for H.264/AVC high definition real-time decoding," IEEE Transactions on Very Large Scale Integration (VLSI) Systems , Mar. 2009, pp. 417-426, vol. 17 No. 3, IEEE Educational Activities Department Piscataway, NJ, USA.

USPTO Office Action—U.S. Appl. No. 12/579,236—Mailing Date May 23, 2012.

USPTO Office Action—U.S. Appl. No. 12/837,337—Mailing Date May 24, 2012.

Sharp, "Entropy slices for parallel entropy decoding," Telecommunication Standardization Sector, International Telecommunication Union, COM 16-C 405-E, pp. 1-9, Apr. 2008.

Chinese Office Action—Application No. 200980110928.2—Issuing Date Apr. 18, 2012.

Japanese Office Action—Patent Application No. 2010-537070—Mailing Date May 8, 2012.

* cited by examiner

METHODS AND SYSTEMS FOR CONTEXT INITIALIZATION IN VIDEO CODING AND DECODING

FIELD OF THE INVENTION

Embodiments of the present invention relate generally to video coding and, in particular, some embodiments of the present invention relate to methods and systems for context initialization in parallel video encoding and parallel video decoding.

BACKGROUND

State-of-the-art video-coding methods and standards, for example, H.264/MPEG-4 AVC (H.264/AVC) and JCT-VC Test Model under Consideration (TMuC), may provide higher coding efficiency than older methods and standards at the expense of higher complexity. Increasing quality requirements and resolution requirements on video coding methods and standards may also increase their complexity. Decoders that support parallel decoding may improve decoding speeds and reduce memory requirements. Additionally, advances in multi-core processors may make encoders and decoders that support parallel decoding desirable.

H.264/MPEG-4 AVC [Joint Video Team of ITU-T VCEG and ISO/IEC MPEG, "H.264: Advanced video coding for generic audiovisual services," ITU-T Rec. H.264 and ISO/IEC 14496-10 (MPEG4—Part 10), November 2007], which is hereby incorporated by reference herein in its entirety, is a video codec (coder/decoder) specification that uses macroblock prediction followed by residual coding to reduce temporal and spatial redundancy in a video sequence for compression efficiency.

Test Model under Consideration (TMuC) [JCT-VC A205, "Test Model under Consideration," Jun. 16, 2010], which is hereby incorporated by reference herein in its entirety, is the initial test model of JCT-VC. TMuC, using a basic coding unit called a coding tree block (CTB) that can have variable sizes, may provide more flexibility than H.264/AVC.

SUMMARY

Some embodiments of the present invention comprise methods and systems for parallel entropy encoding. Some embodiments of the present invention comprise methods and systems for parallel entropy decoding.

According to a first aspect of the present invention, a plurality of context models used for entropy coding may be initialized, using a context table, at the start of an entropy slice.

According to a second aspect of the present invention, a plurality of context models used for entropy coding may be initialized, using a context table, at a starting elementary unit in a row in an entropy slice.

The foregoing and other objectives, features, and advantages of the invention will be more readily understood upon consideration of the following detailed description of the invention taken in conjunction with the accompanying drawings.

BRIEF DESCRIPTION OF THE SEVERAL DRAWINGS

Figure 14:
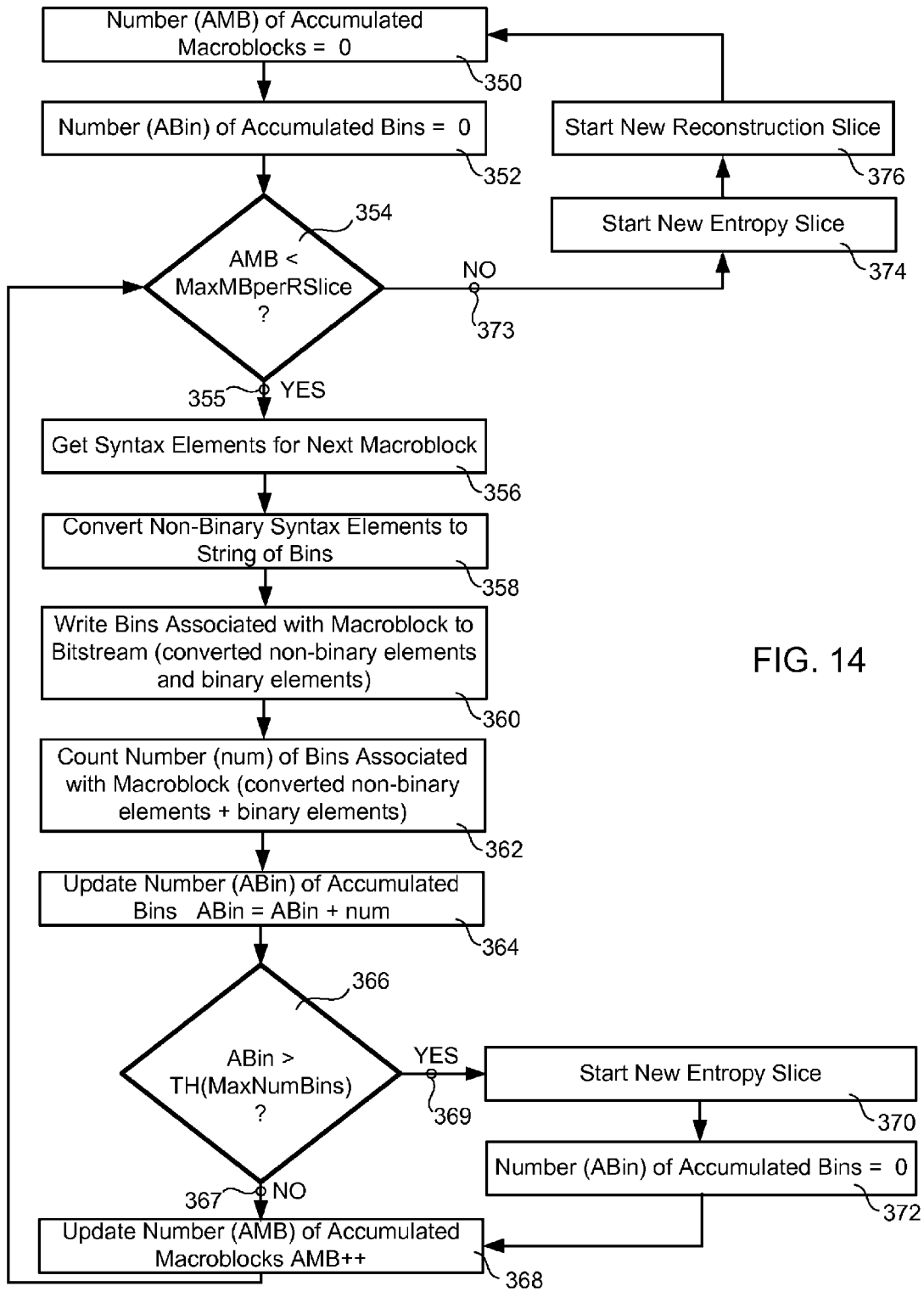
Figure 15:
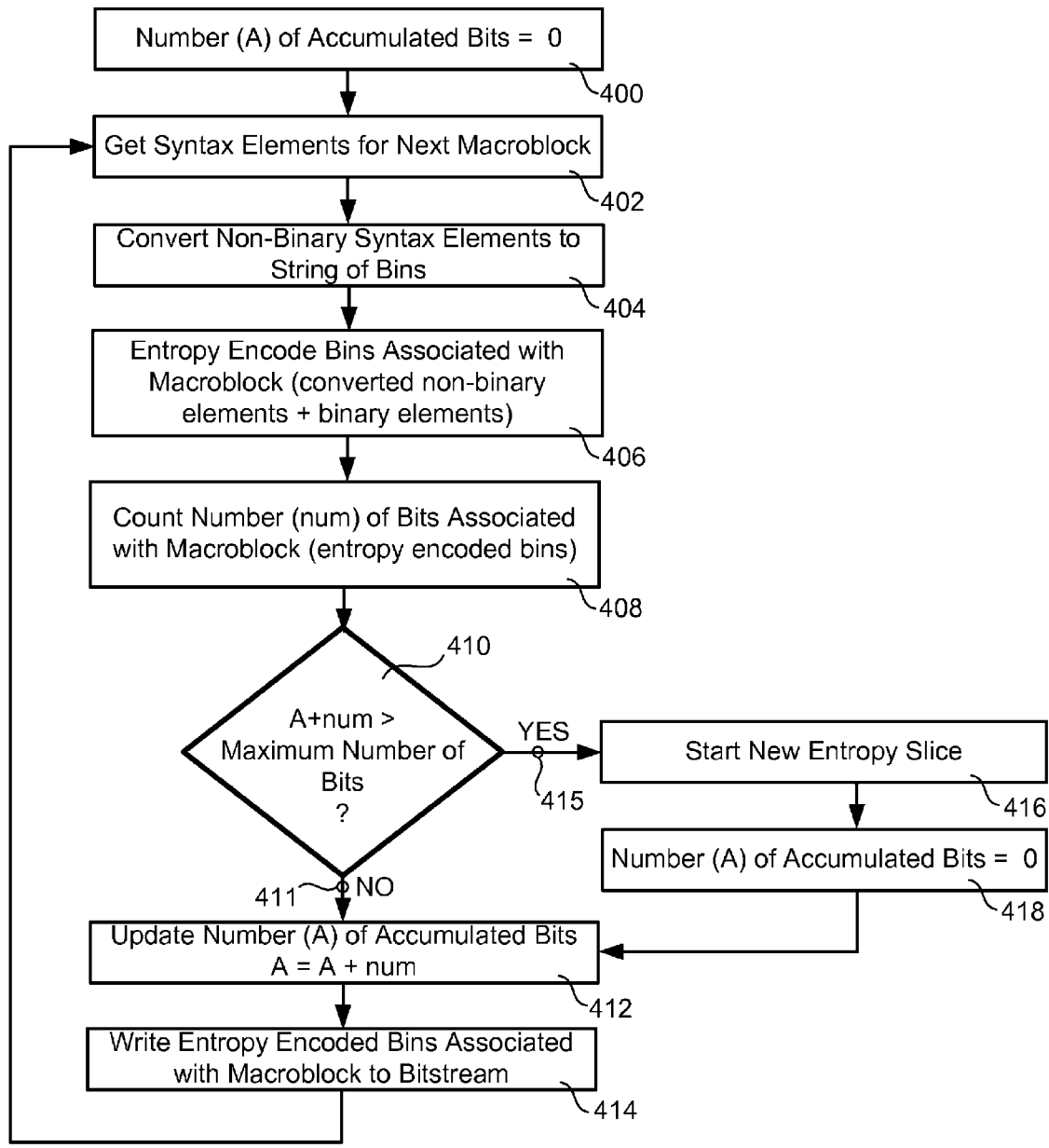
Figure 16:
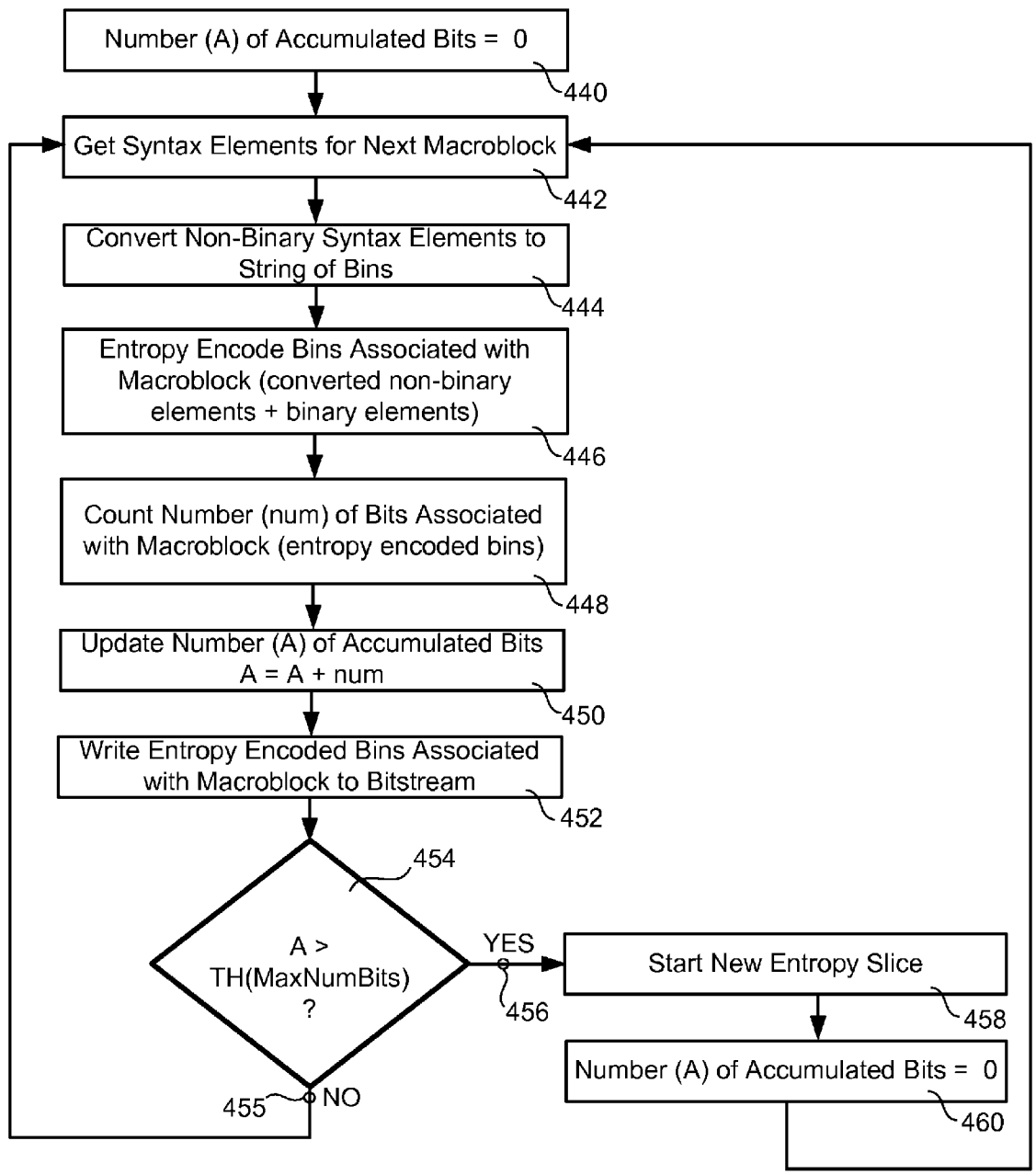
Figure 17:
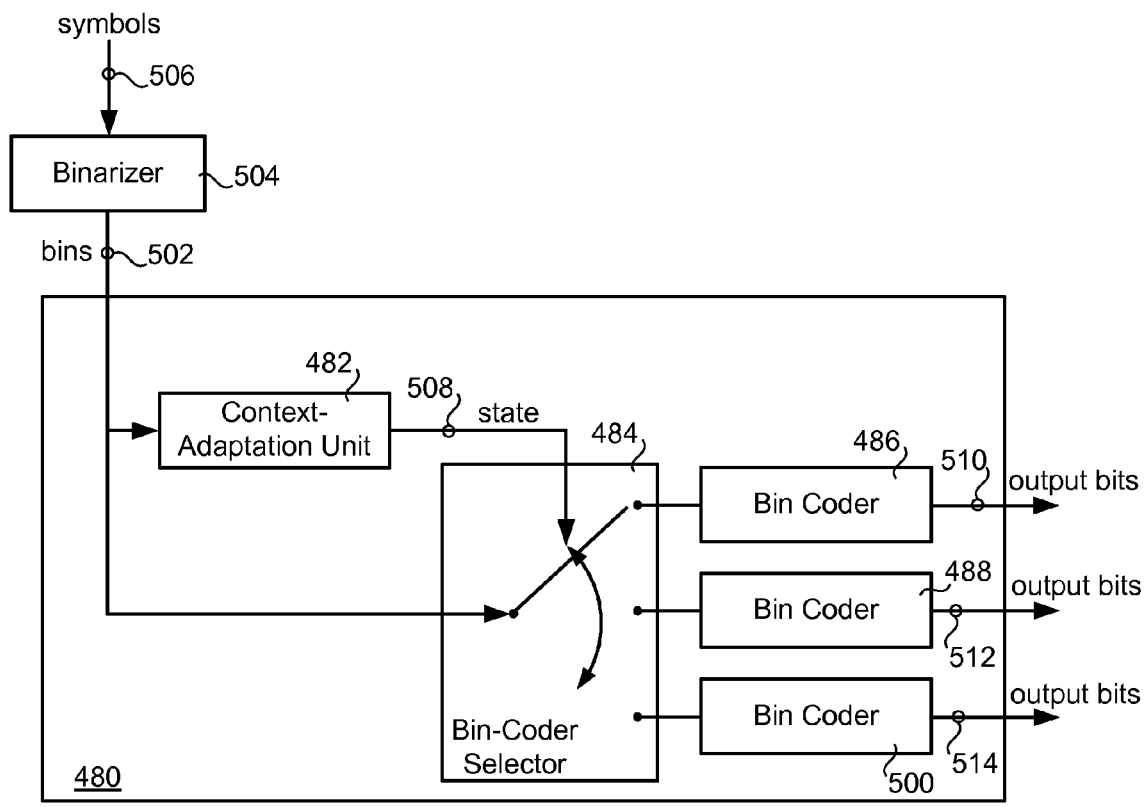
Figure 18:
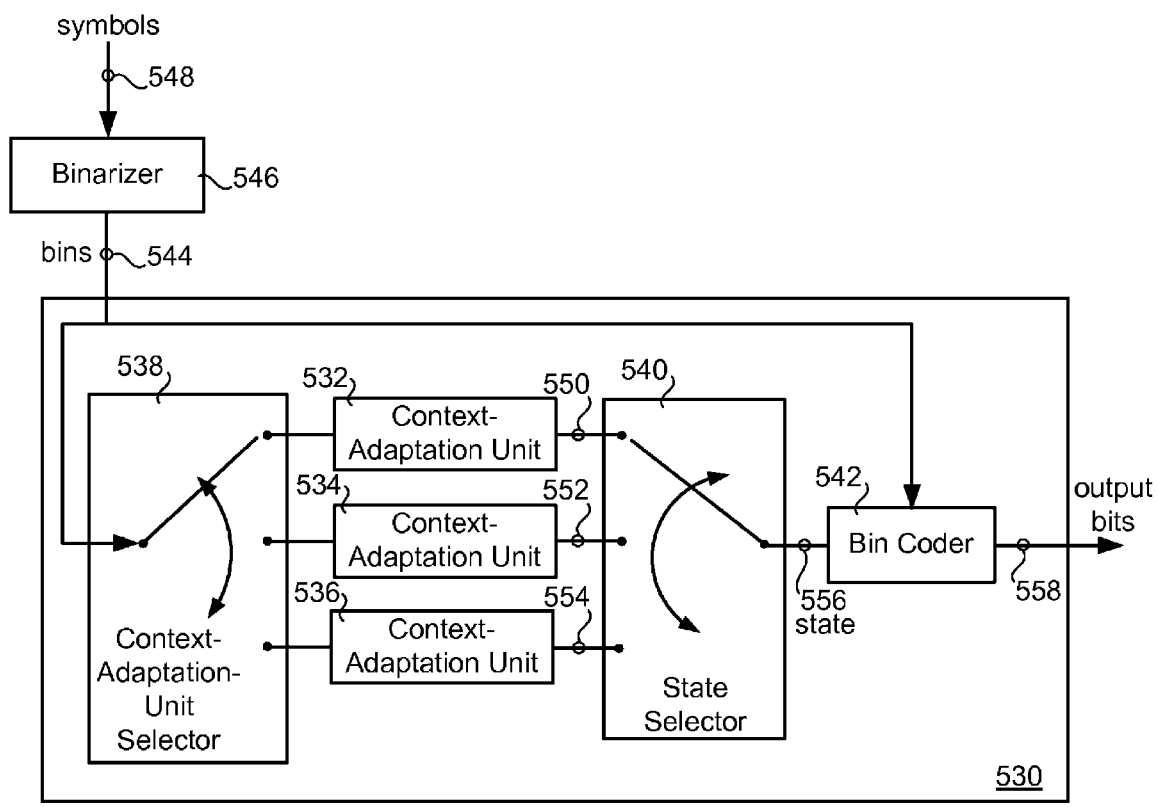
Figure 19:
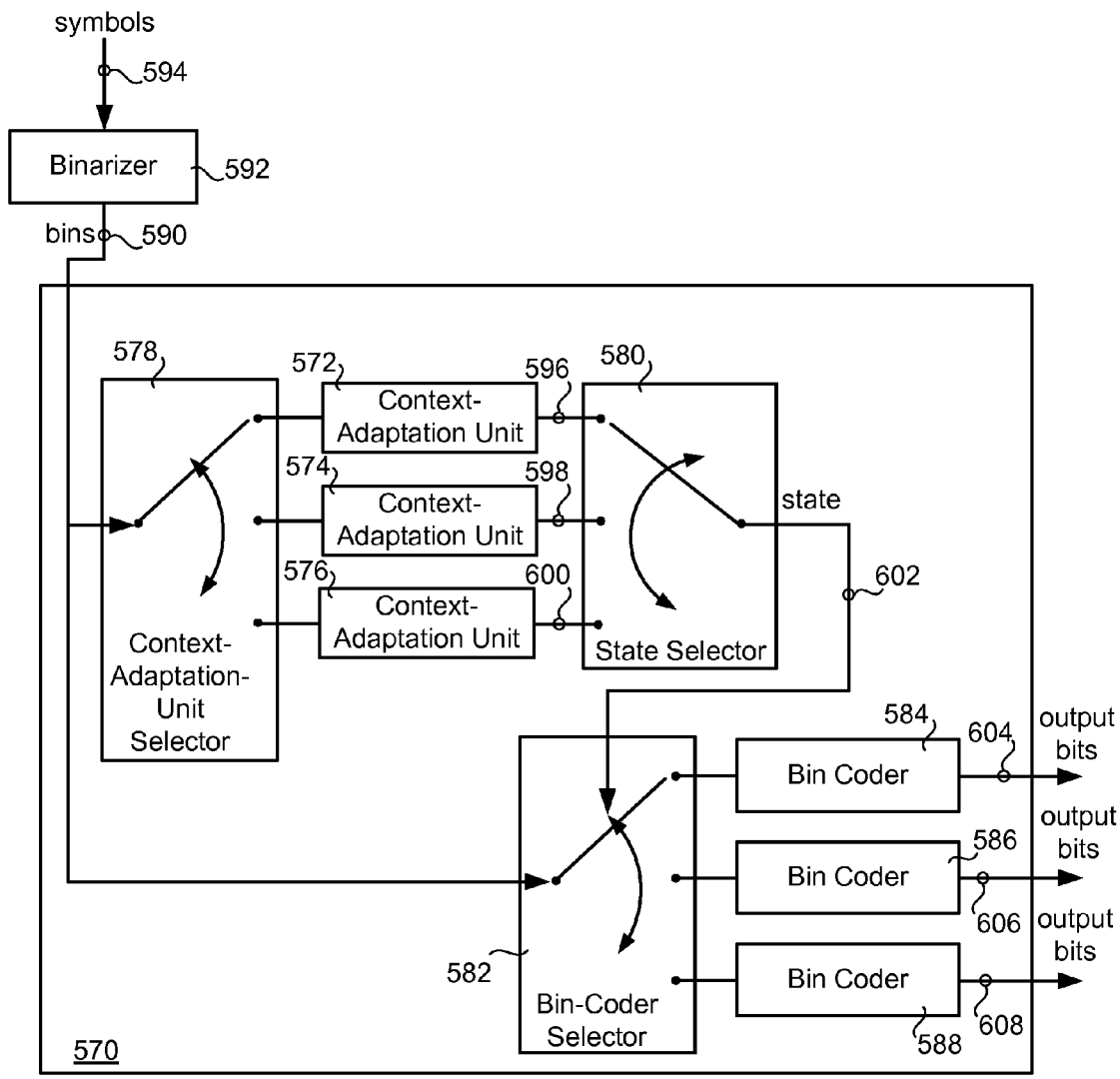
Figure 20:
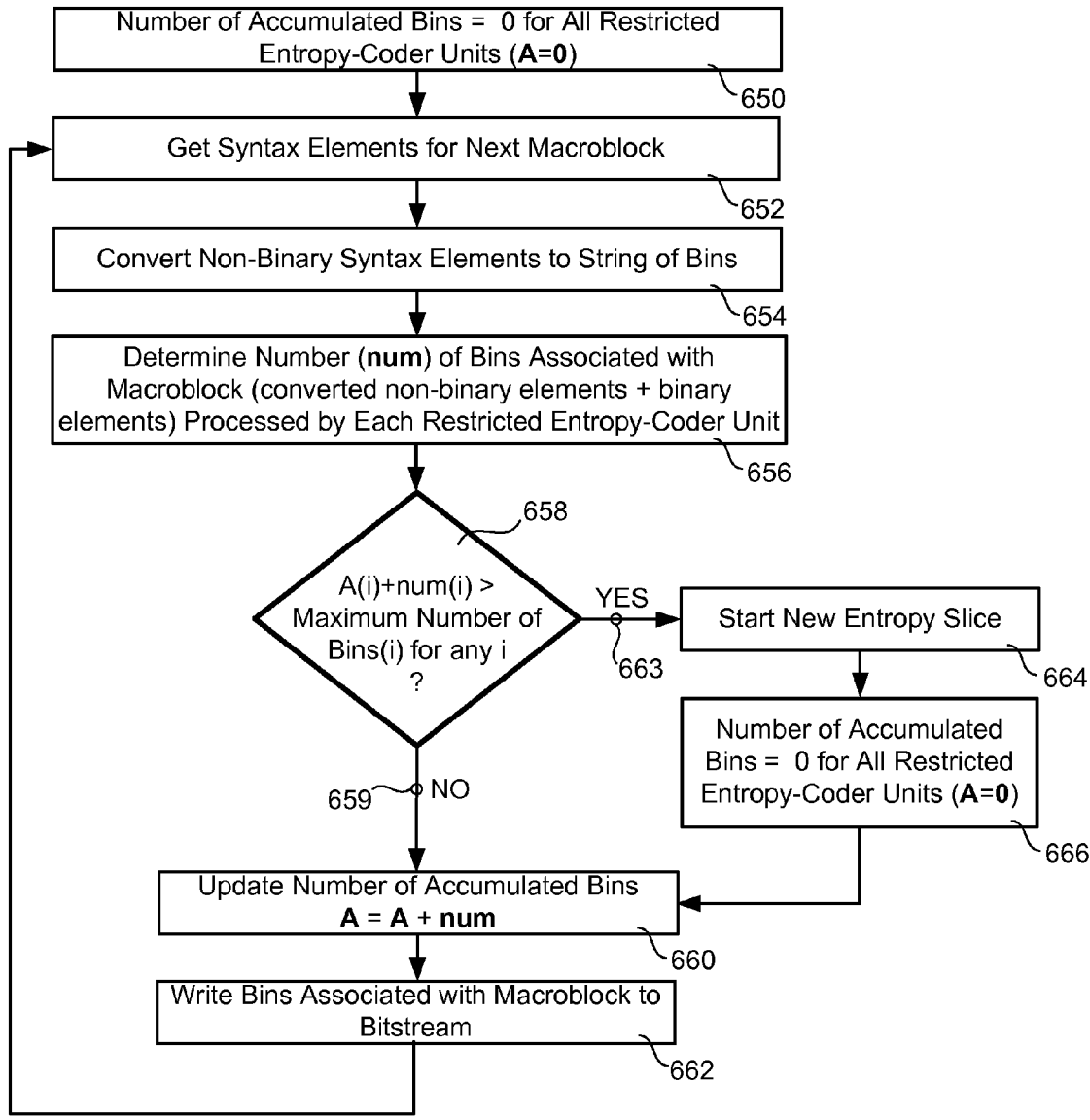
Figure 21:
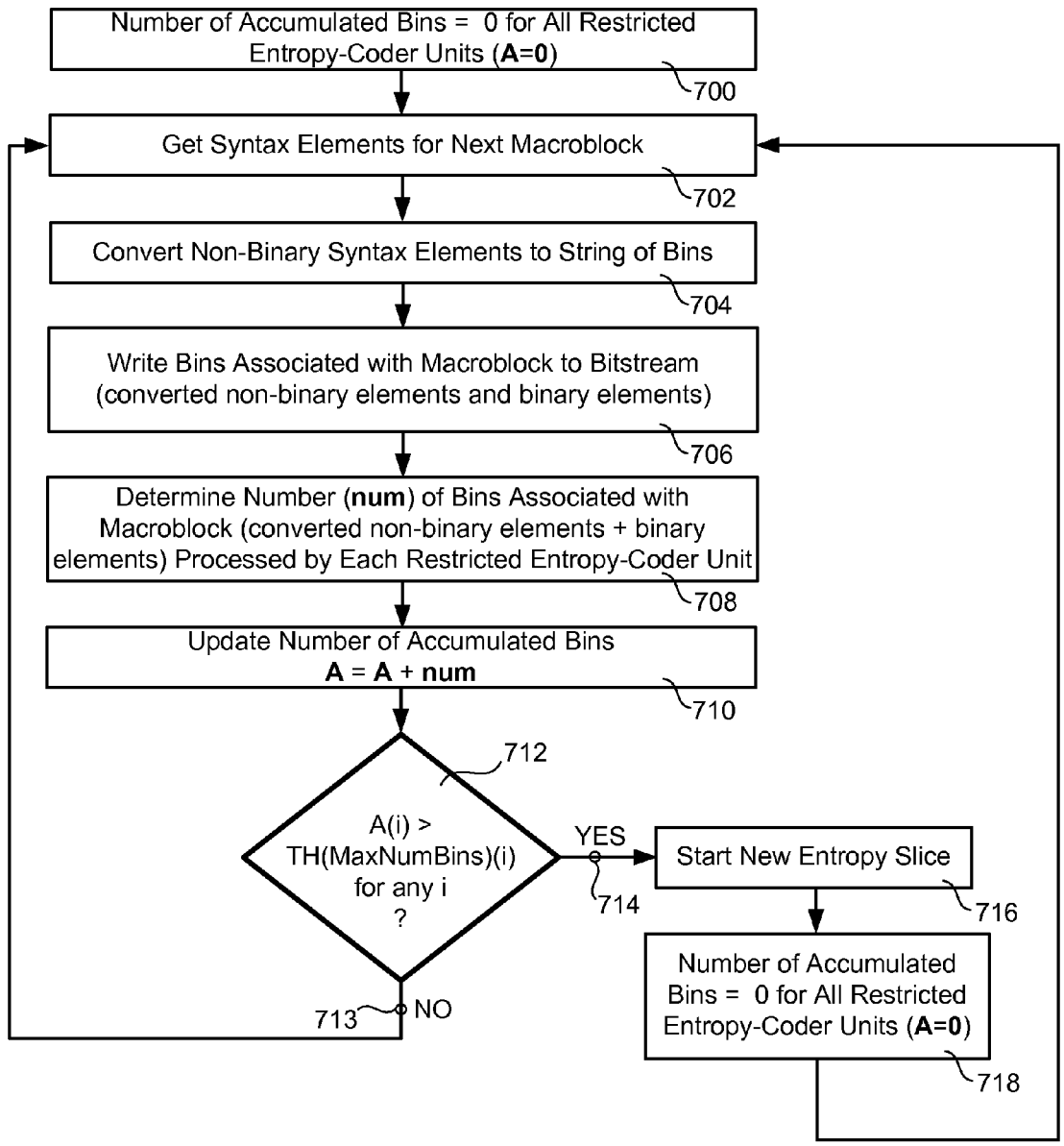
Figure 22:
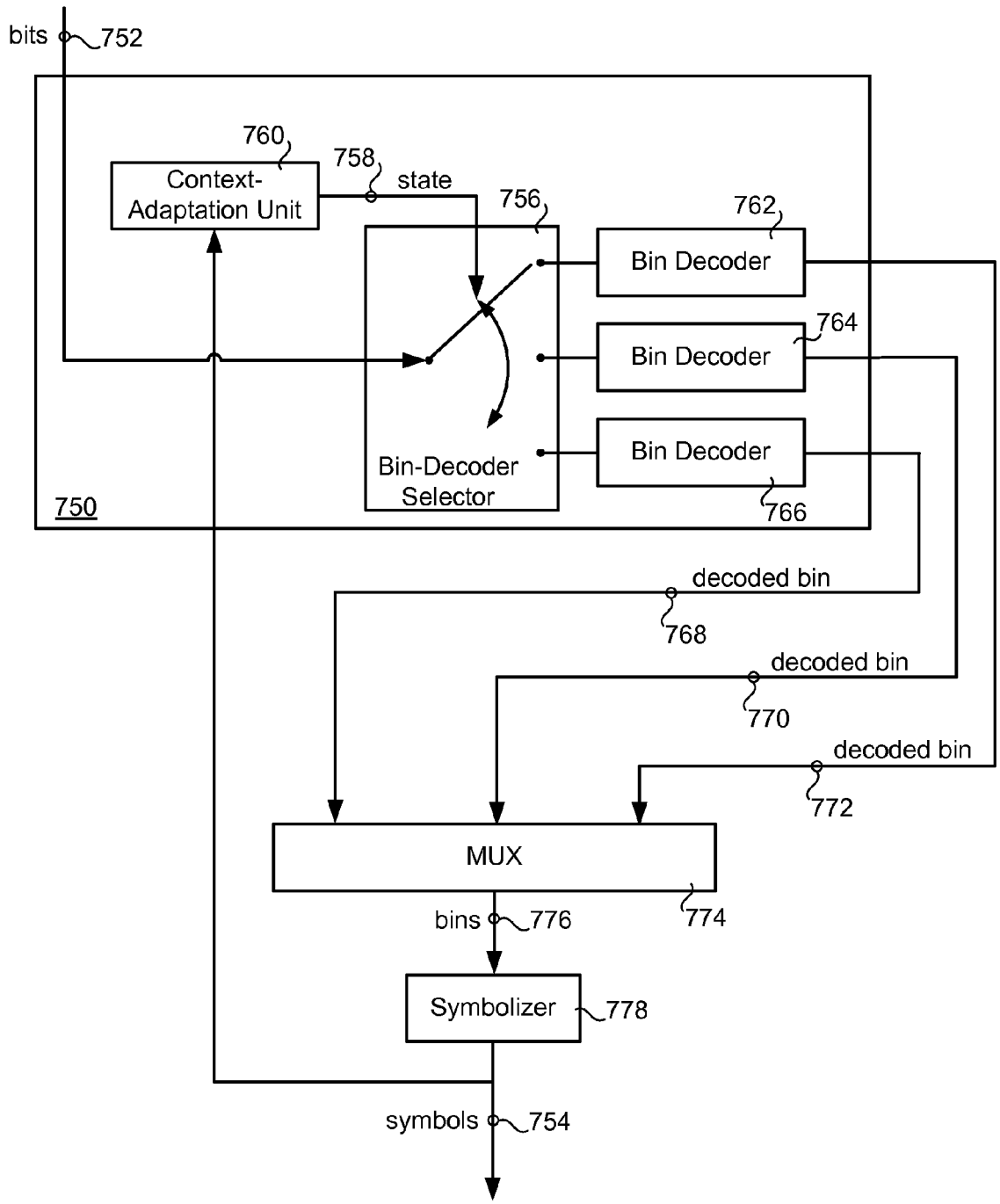
Figure 23:
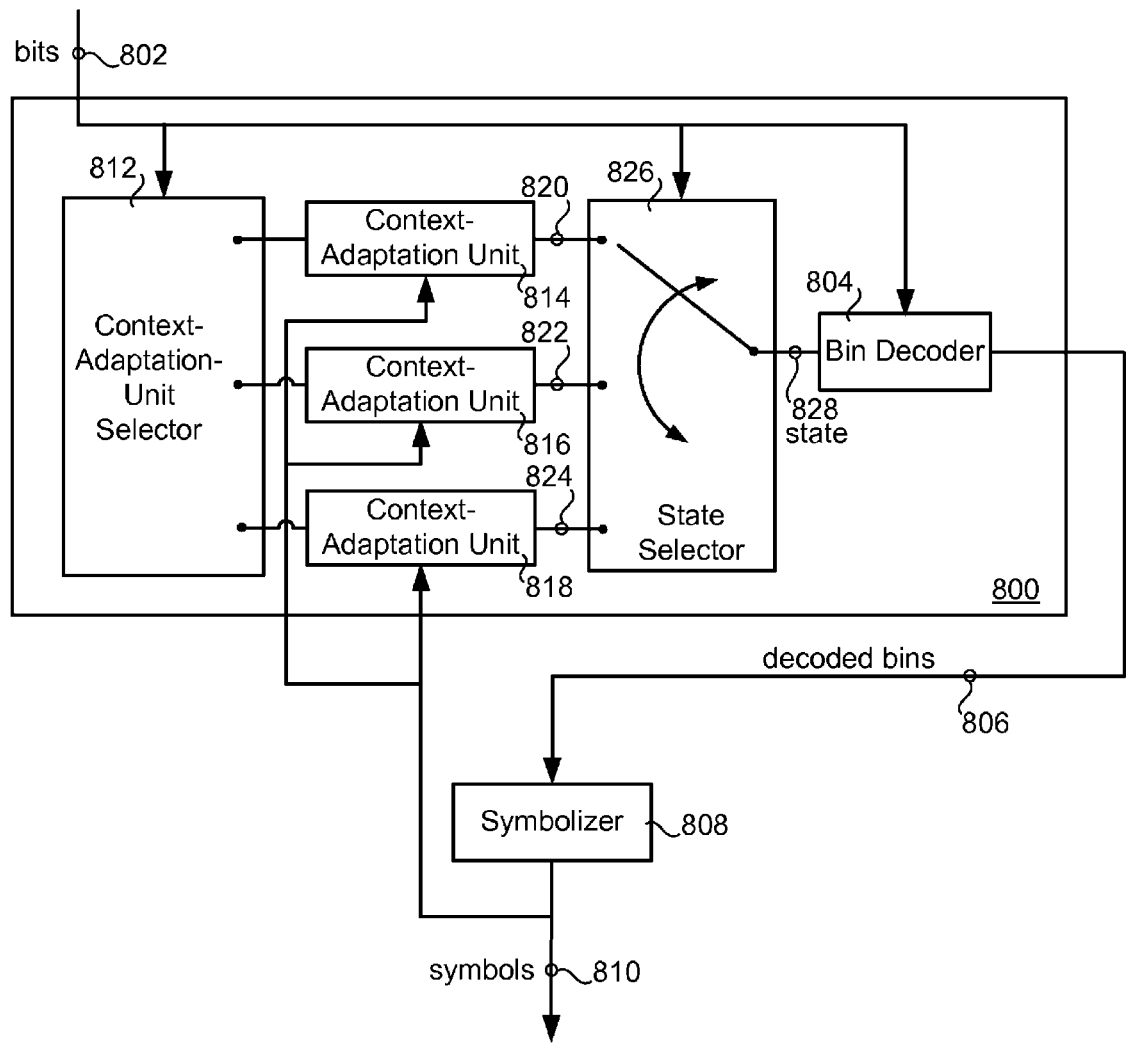
Figure 24:
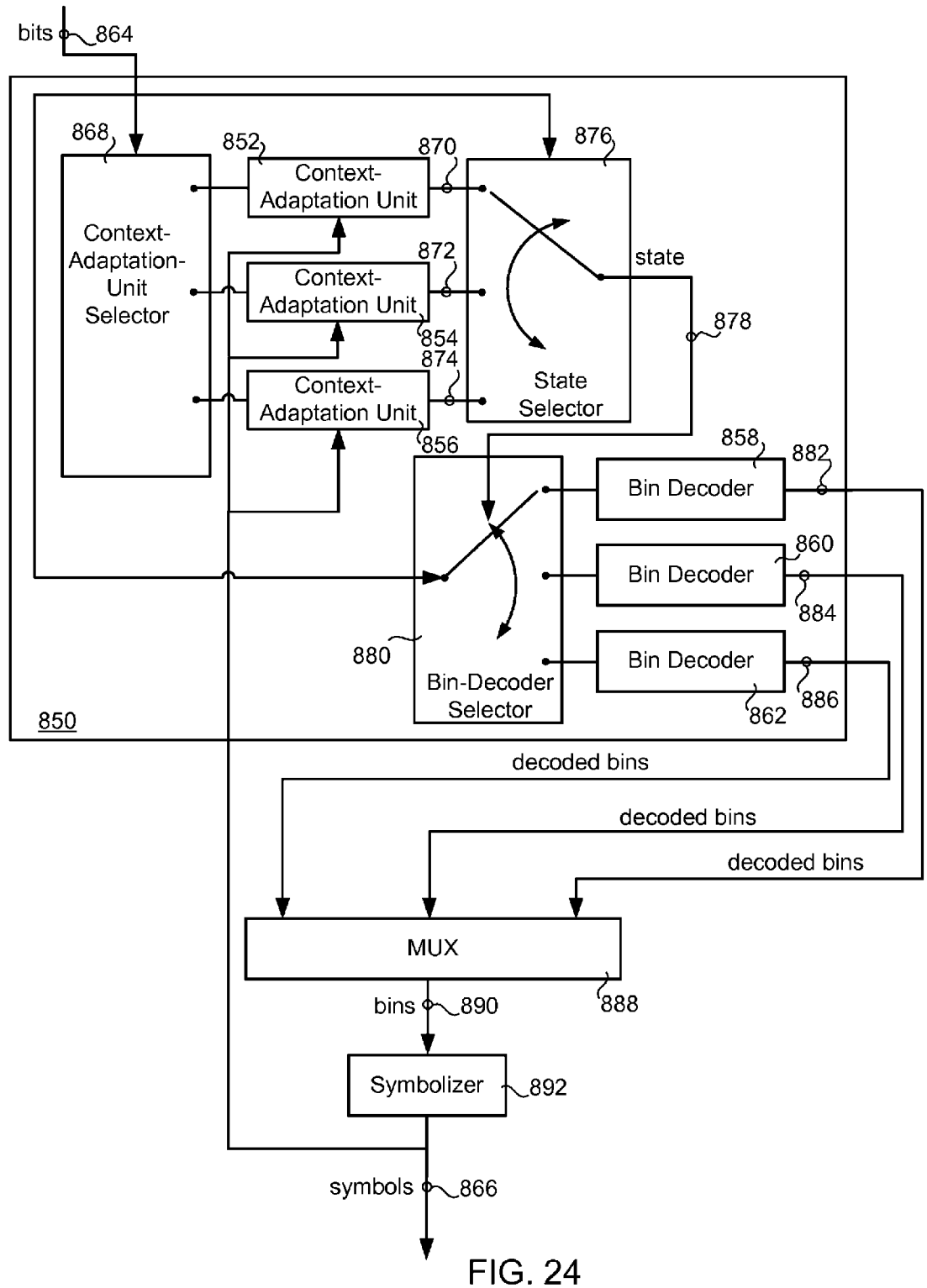
Figure 25:
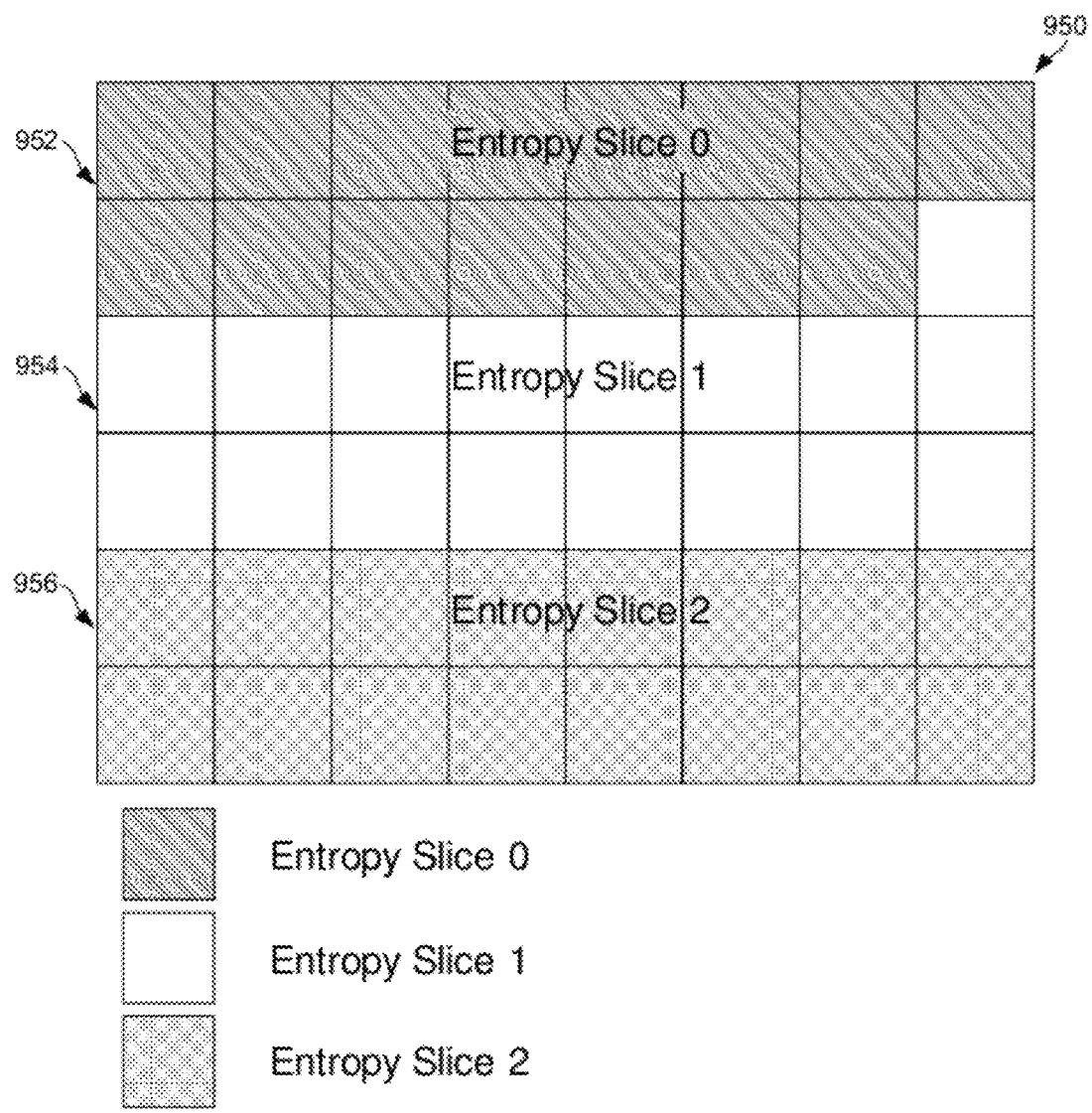
Figure 26:
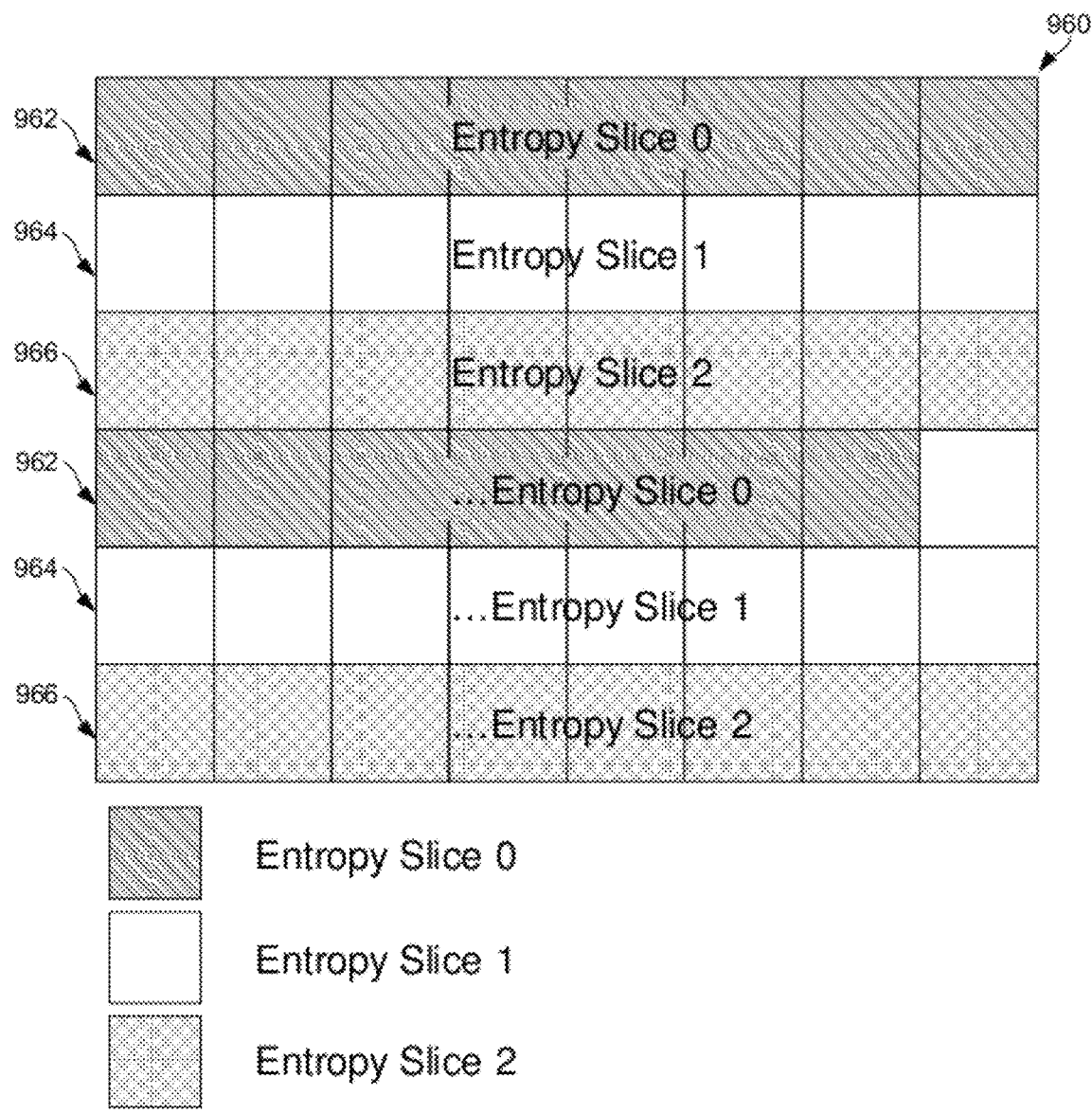
Figure 27:
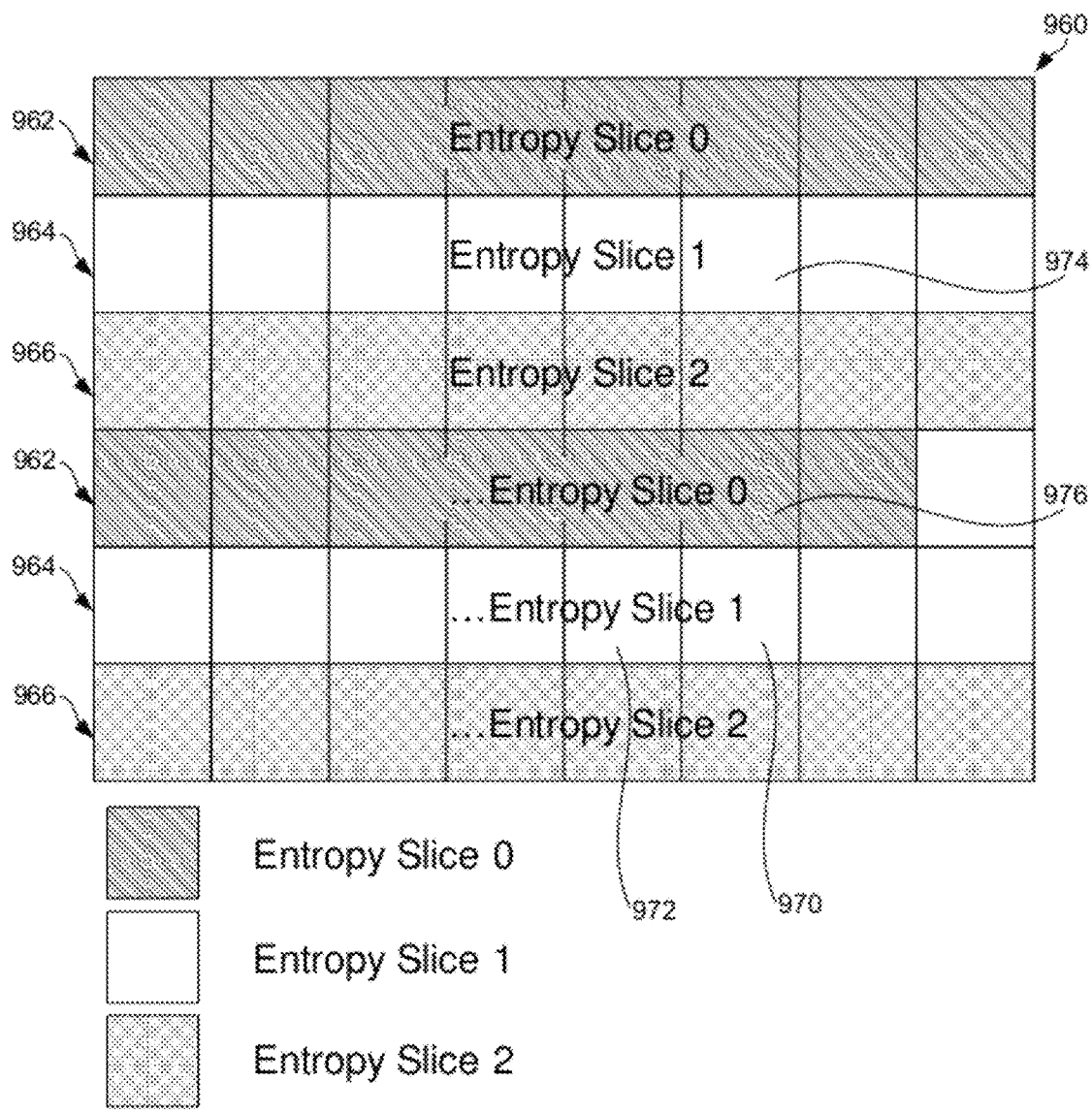
Figure 28:
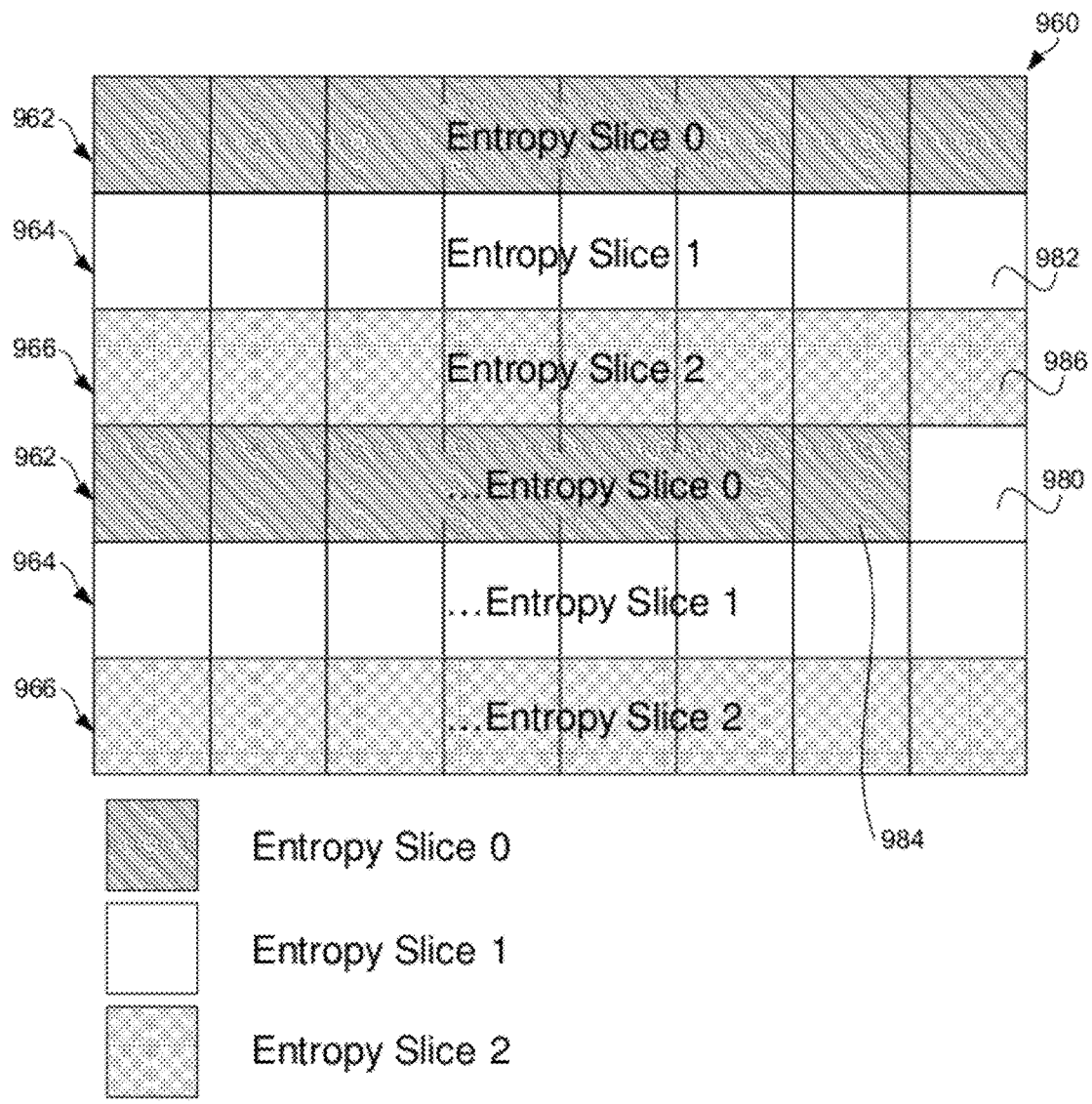
Figure 29:
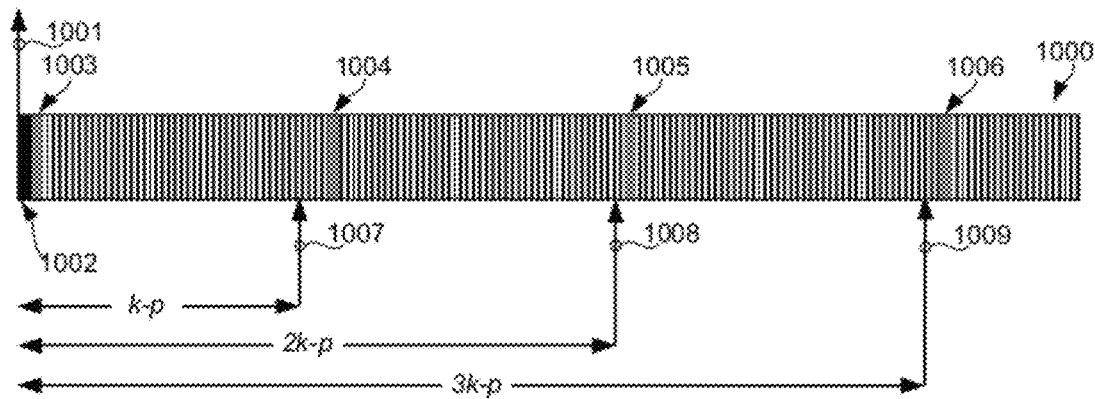
Figure 30:
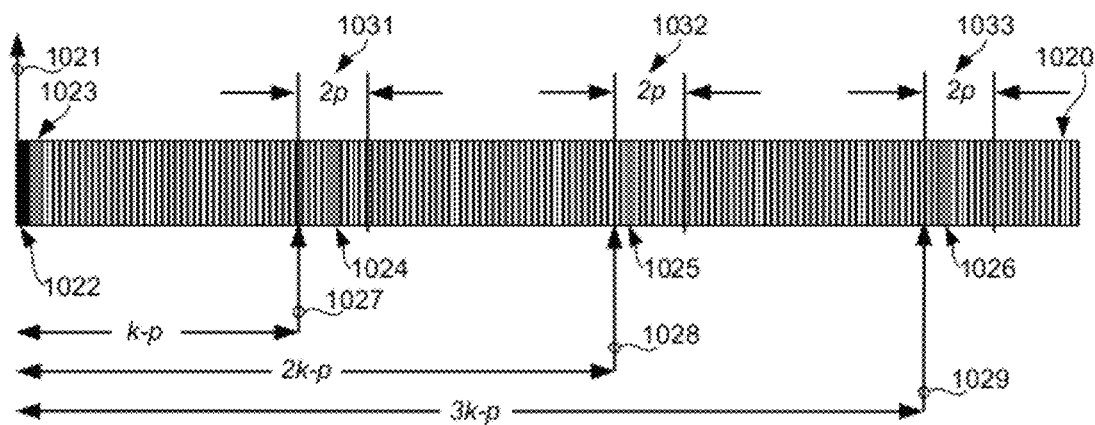
Figure 31:
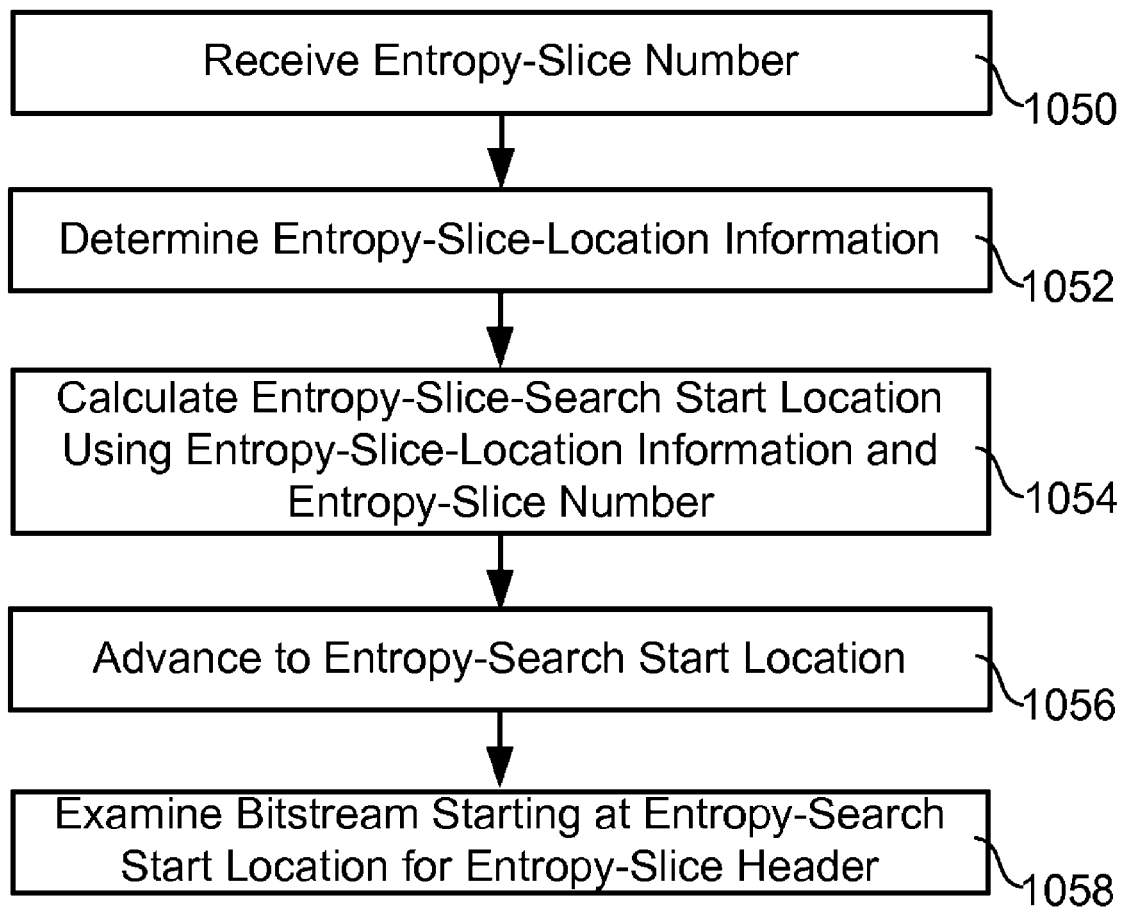
Figure 32:
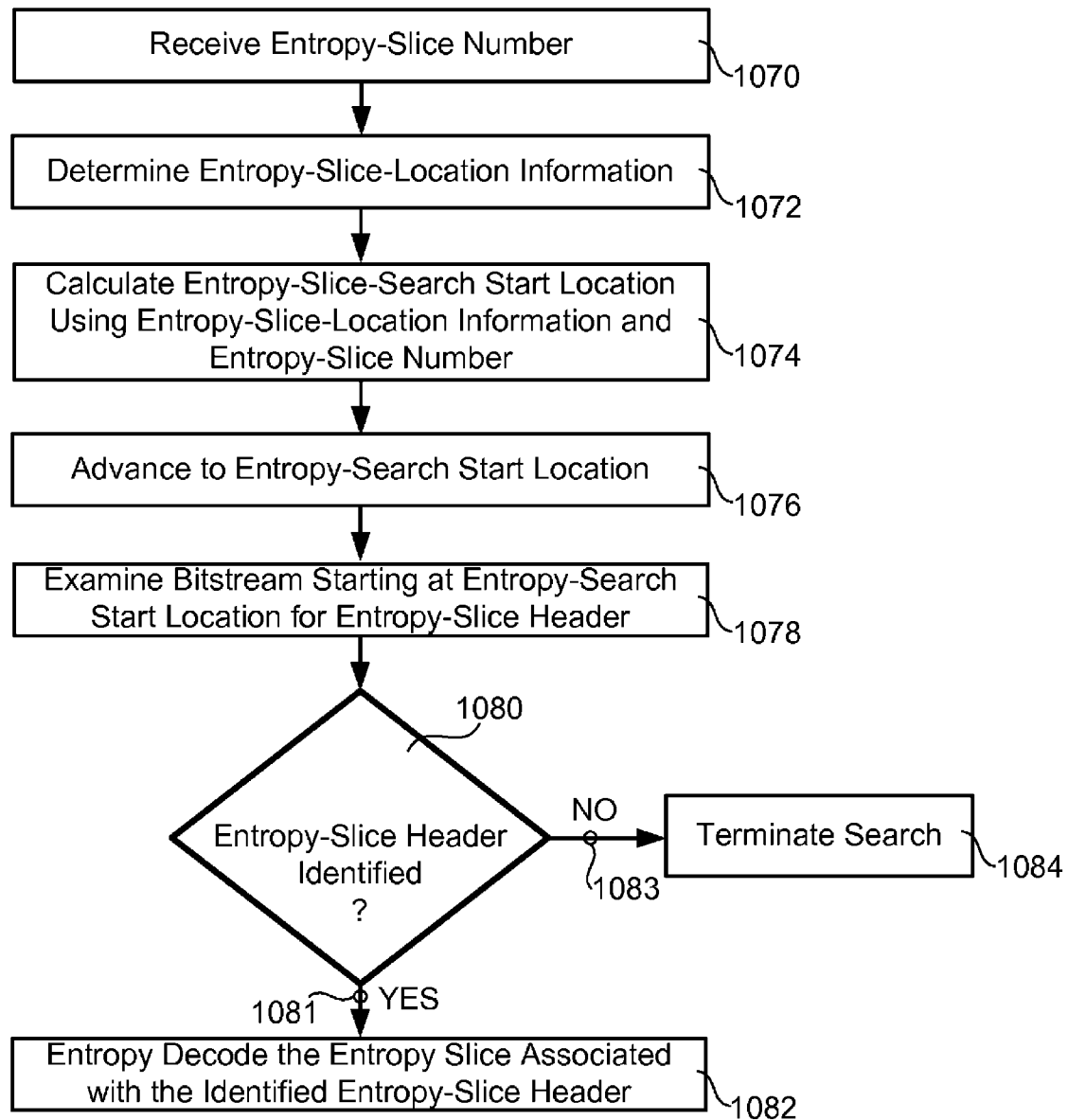
Figure 33:
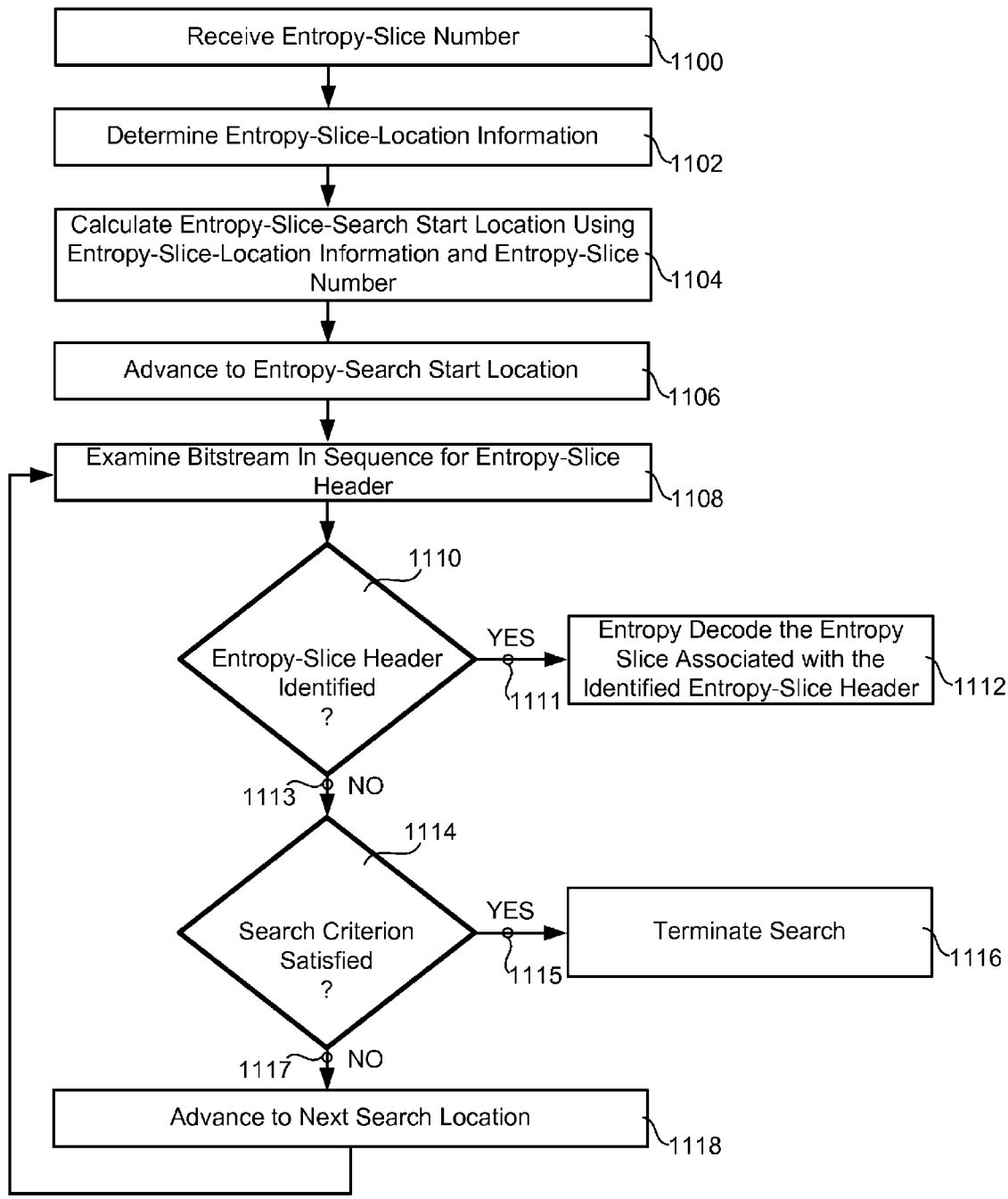
Figure 34:
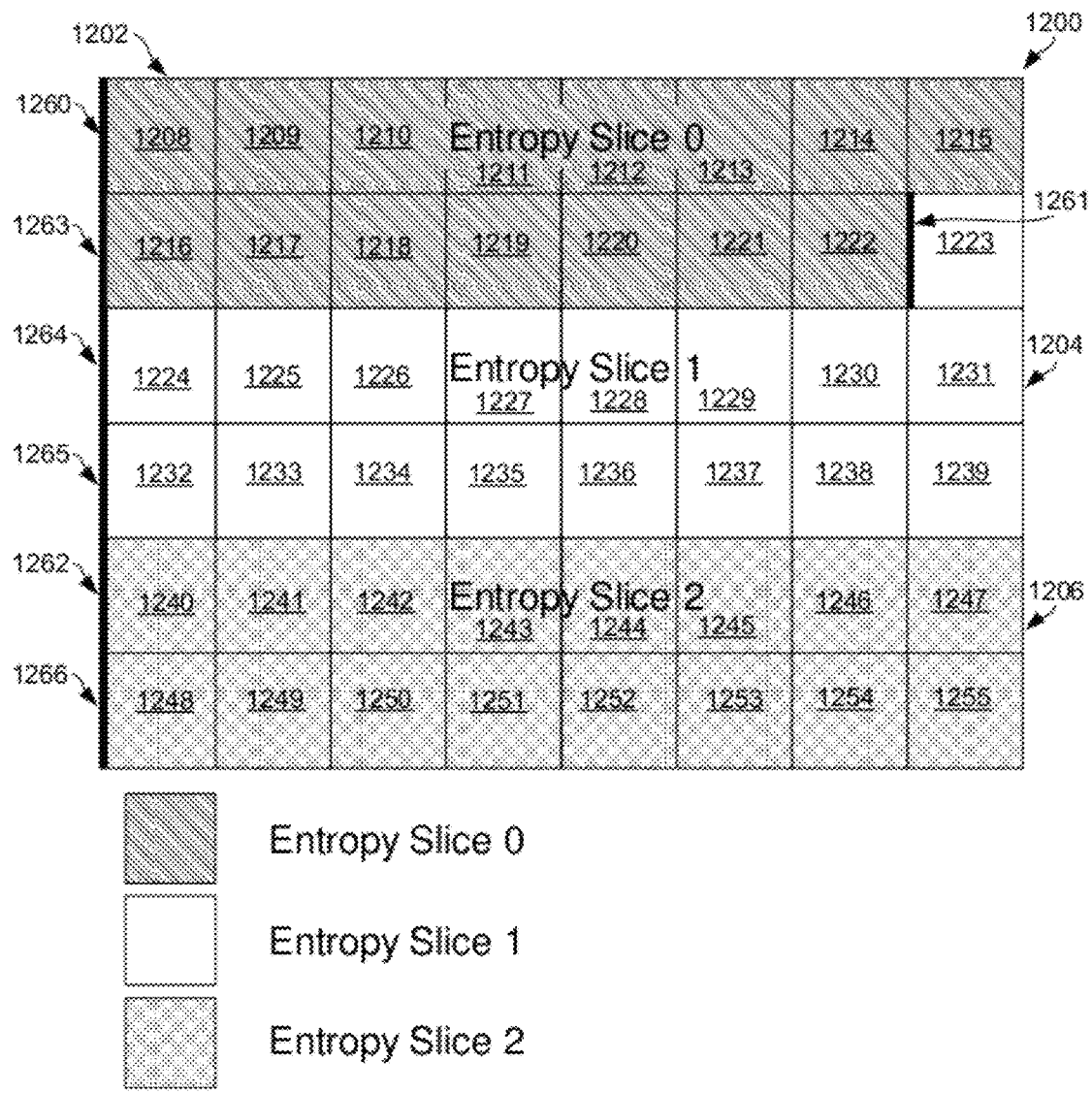

FIG. 14 is a chart showing exemplary embodiments of the present invention comprising partitioning a reconstruction slice into a plurality of entropy slices, wherein bins may be associated with an entropy slice until the number of bins in the entropy slice exceeds a threshold based on a predefined maximum number of bins and each reconstruction slice contains no more than a predefined number of macroblocks;

FIG. 15 is a chart showing exemplary embodiments of the present invention comprising partitioning a reconstruction slice into a plurality of entropy slices, wherein the number of bits associated with each entropy slice in the plurality of entropy slices does not exceed a predefined number of bits;

FIG. 16 is a chart showing exemplary embodiments of the present invention comprising partitioning a reconstruction slice into a plurality of entropy slices, wherein bits may be associated with an entropy slice until the number of bits in the entropy slices exceeds a threshold based on a predefined maximum number of bits;

FIG. 17 is a picture depicting exemplary embodiments of the present invention comprising multiple bin coders;

FIG. 18 is a picture depicting exemplary embodiments of the present invention comprising multiple context-adaptation units;

FIG. 19 is a picture depicting exemplary embodiments of the present invention comprising multiple bin coders and multiple context-adaptation units;

FIG. 20 is a chart showing exemplary embodiments of the present invention comprising partitioning a reconstruction slice into a plurality of entropy slices, wherein the size of an entropy slice is restricted to limit the number of bins operated on, in the entropy slice, by each restricted entropy-coder unit;

FIG. 21 is a chart showing exemplary embodiments of the present invention comprising partitioning a reconstruction slice into a plurality of entropy slices, wherein the size of an entropy slice is restricted to limit the number of bins operated on, in the entropy slice, by each restricted entropy-coder unit;

FIG. 22 is a picture depicting exemplary embodiments of the present invention comprising a plurality of bin decoders;

FIG. 23 is a picture depicting exemplary embodiments of the present invention comprising a plurality of context-adaptation units;

FIG. 24 is a picture depicting exemplary embodiments of the present invention comprising multiple bin decoders and multiple context-adaptation units;

FIG. 25 is a picture showing an exemplary partition of a reconstruction block into a plurality of entropy slices in which the macroblocks within an entropy slice are contiguous;

FIG. 26 is a picture showing an exemplary partition of a reconstruction block into a plurality of entropy slices in which the macroblocks within an entropy slice are not contiguous;

FIG. 27 is a picture illustrating non-contiguous neighboring blocks, used in entropy decoding, for an exemplary partition of a reconstruction block into a plurality of entropy slices in which the macroblocks within an entropy slice are not contiguous;

FIG. 28 is a picture illustrating neighboring blocks used in entropy decoding and reconstruction of a block within an entropy slice for an exemplary partition of a reconstruction block into a plurality of entropy slice in which the macroblocks within an entropy slice are not contiguous;

FIG. 29 is a pictorial representation of an exemplary portion of an exemplary bitstream depicting entropy-slice header location restrictions;

FIG. 30 is a pictorial representation of an exemplary portion of an exemplary bitstream depicting entropy-slice header location restrictions;

FIG. 31 is a chart showing exemplary embodiments of the present invention comprising an entropy decoder processing a restricted portion of a bitstream to identify an entropy-slice header;

FIG. 32 is a chart showing exemplary embodiments of the present invention comprising an entropy decoder processing a restricted portion of a bitstream to identify an entropy-slice header;

FIG. 33 is a chart showing exemplary embodiments of the present invention comprising an entropy decoder processing a restricted portion of a bitstream to identify an entropy-slice header; and FIG. 34 is a picture illustrating an exemplary context-model-initialization scheme within entropy slices according to embodiments of the present invention.

DETAILED DESCRIPTION OF EXEMPLARY EMBODIMENTS

Embodiments of the present invention will be best understood by reference to the drawings, wherein like parts are designated by like numerals throughout. The figures listed above are expressly incorporated as part of this detailed description.

It will be readily understood that the components of the present invention, as generally described and illustrated in the figures herein, could be arranged and designed in a wide variety of different configurations. Thus, the following more detailed description of the embodiments of the methods and systems of the present invention is not intended to limit the scope of the invention, but it is merely representative of the presently preferred embodiments of the invention.

Elements of embodiments of the present invention may be embodied in hardware, firmware and/or software. While exemplary embodiments revealed herein may only describe one of these forms, it is to be understood that one skilled in the art would be able to effectuate these elements in any of these forms while resting within the scope of the present invention.

While any video coder/decoder (codec) that uses entropy encoding/decoding may be accommodated by embodiments of the present invention, many exemplary embodiments of the present invention will be illustrated in relation to an H.264/AVC encoder and an H.264/AVC decoder. This is intended for illustration of embodiments of the present invention and not as a limitation.

Many exemplary embodiments of the present invention may be described in relation to a macroblock as an elementary unit. This is intended for illustration and not as a limitation.

U.S. patent application Ser. No. 12/058,301, entitled "Methods and Systems for Parallel Video Encoding and Decoding," filed on Mar. 28, 2008, is hereby incorporated by reference herein, in its entirety. U.S. patent application Ser. No. 12/579,236, entitled "Methods and Systems for Parallel Video Encoding and Decoding," filed on Oct. 14, 2009, is hereby incorporated by reference herein, in its entirety.

State-of-the-art video-coding methods and standards, for example, H.264/AVC and TMuC, may provide higher coding efficiency than older methods and standards at the expense of higher complexity. Increasing quality requirements and resolution requirements on video coding methods and standards may also increase their complexity. Decoders that support parallel decoding may improve decoding speeds and reduce memory requirements. Additionally, advances in multi-core processors may make encoders and decoders that support parallel decoding desirable.

H.264/AVC, and many other video coding standards and methods, are based on a block-based hybrid video-coding approach, wherein the source-coding algorithm is a hybrid of inter-picture, also considered inter-frame, prediction, intra-picture, also considered intra-frame, prediction and transform coding of a prediction residual. Inter-frame prediction may exploit temporal redundancies, and intra-frame and transform coding of the prediction residual may exploit spatial redundancies.

Figure 1:
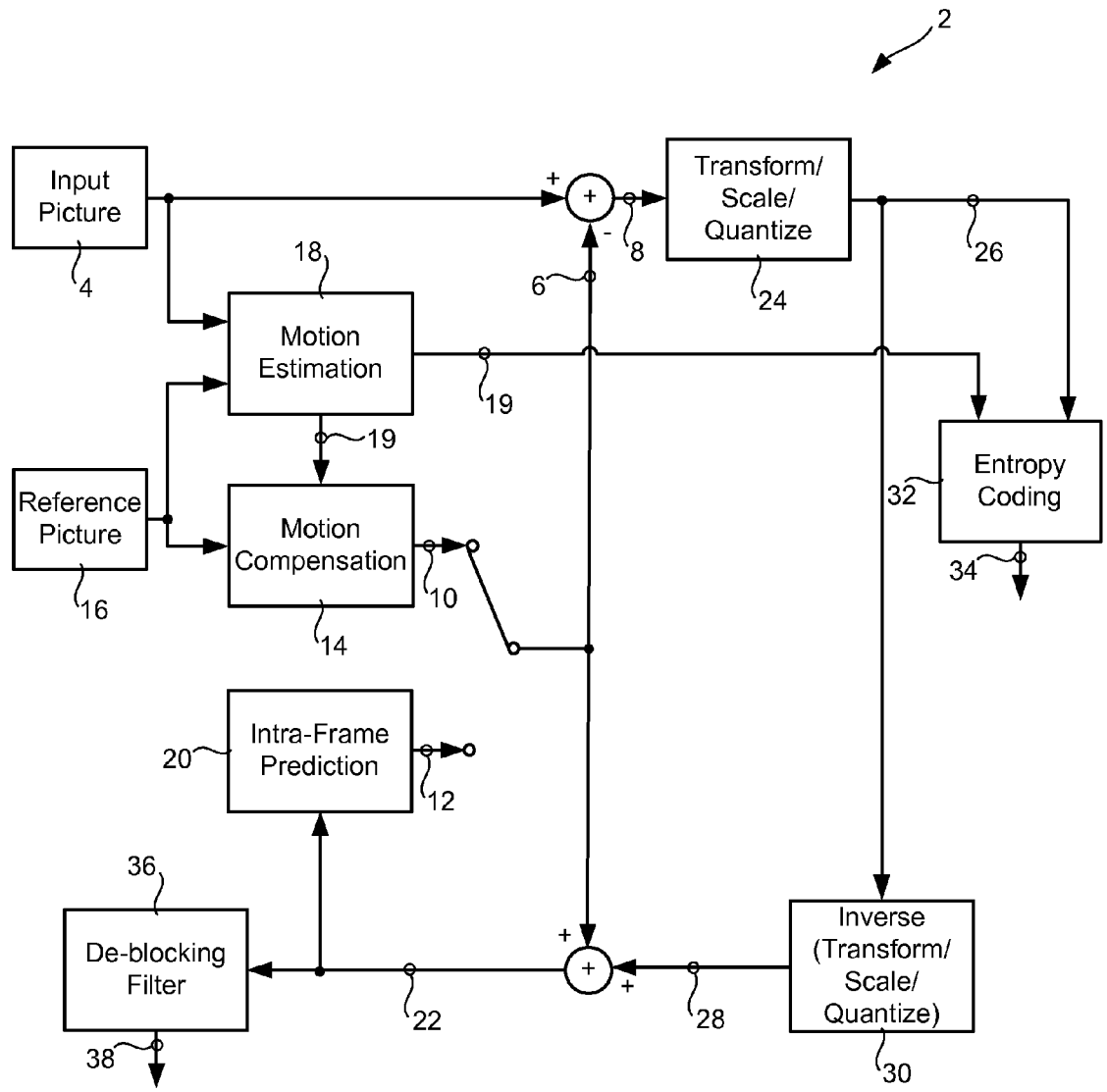
FIG. 1 is a picture showing an H.264/AVC video encoder (prior art)

FIG. 1 shows a block diagram of an exemplary H.264/AVC video encoder 2. An input picture 4, also considered a frame, may be presented for encoding. A predicted signal 6 and a residual signal 8 may be produced, wherein the predicted signal 6 may be based on either an inter-frame prediction 10 or an intra-frame prediction 12. The inter-frame prediction 10 may be determined by motion compensating 14 a stored, reference picture 16, also considered reference frame, using motion information 19 determined by a motion estimation 18 process between the input frame 4 and the reference frame 16. The intra-frame prediction 12 may be determined 20 using a decoded signal 22. The residual signal 8 may be determined by subtracting the input 4 from the prediction 6. The residual signal 8 is transformed, scaled and quantized 24, thereby producing quantized, transform coefficients 26. The decoded signal 22 may be generated by adding the predicted signal 6 to a signal 28 generated by inverse transforming, scaling and inverse quantizing 30 the quantized, transform coefficients 26. The motion information 19 and the quantized, transform coefficients 26 may be entropy coded 32 and written to the compressed-video bitstream 34. An output image region 38, for example a portion of the reference frame, may be generated at the encoder 2 by filtering 36 the reconstructed, pre-filtered signal 22.

Figure 2:
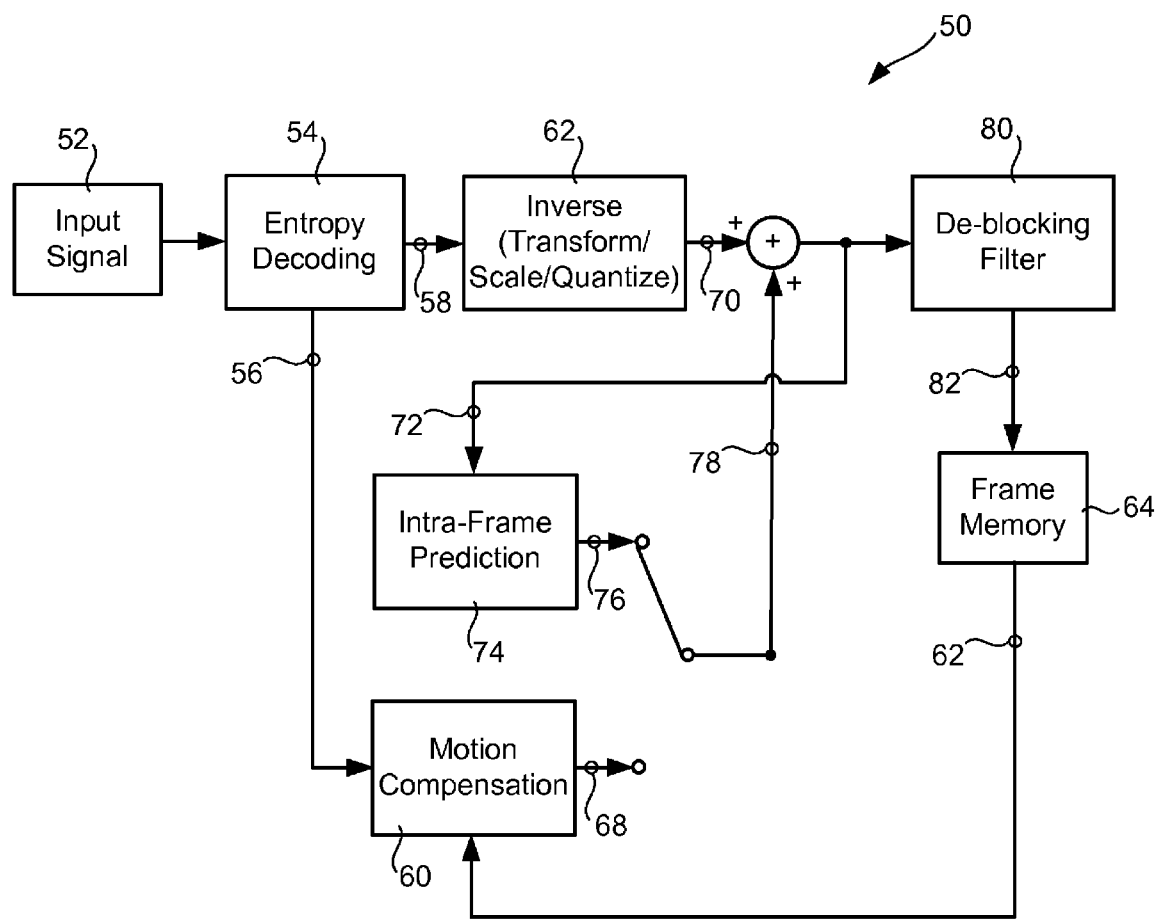
FIG. 2 is a picture showing an H.264/AVC video decoder (prior art)

FIG. 2 shows a block diagram of an exemplary H.264/AVC video decoder 50. An input signal 52, also considered a bitstream, may be presented for decoding. Received symbols may be entropy decoded 54, thereby producing motion information 56 and quantized, scaled, transform coefficients 58. The motion information 56 may be combined 60 with a portion of a reference frame 62 which may reside in frame memory 64, and an inter-frame prediction 68 may be generated. The quantized, scaled, transform coefficients 58 may be inverse quantized, scaled and inverse transformed 62, thereby producing a decoded residual signal 70. The residual signal 70 may be added to a prediction signal: either the inter-frame prediction signal 68 or an intra-frame prediction signal 76. The intra-frame prediction signal 76 may be predicted 74 from previously decoded information in the current frame 72. The combined signal 72 may be filtered 80 and the filtered signal 82 may be written to frame memory 64.

In H.264/AVC, an input picture is partitioned into fixed-size macroblocks, wherein each macroblock covers a rectangular picture area of 16×16 samples of the luma component and 8×8 samples of each of the two chroma components. In other codecs and standards, an elementary unit, or basic coding unit, different than a macroblock, for example, a coding tree block, may be used. The decoding process of the H.264/AVC standard is specified for processing units which are macroblocks. The entropy decoder 54 parses the syntax elements of the compressed-video bitstream 52 and de-multiplexes them. H.264/AVC specifies two alternative methods of entropy decoding: a low-complexity technique that is based on the usage of context-adaptively switched sets of variable length codes, referred to as CAVLC, and the computationally more demanding algorithm of context-based adaptively binary arithmetic coding, referred to as CABAC. In both entropy decoding methods, decoding of a current symbol may rely on previously, correctly decoded symbols and adaptively updated context models. In addition, different data information, for example, prediction data information, residual data information and different color planes, may be multiplexed together. De-multiplexing may not be done until elements are entropy decoded.

After entropy decoding, a macroblock may be reconstructed by obtaining: the residual signal through inverse quantization and the inverse transform, and the prediction signal, either the intra-frame prediction signal or the inter-frame prediction signal. Blocking distortion may be reduced by applying a de-blocking filter to every decoded macroblock. No processing may begin until the input signal is entropy decoded, thereby making entropy decoding a potential bottleneck in decoding.

Similarly, in codecs in which alternative prediction mechanisms may be allowed, for example, inter-layer prediction in H.264/AVC or inter-layer prediction in other scalable codecs, entropy decoding may be requisite prior to all processing at the decoder, thereby making entropy decoding a potential bottleneck.

In H.264/AVC, an input picture comprising a plurality of macroblocks may be partitioned into one or several slices. The values of the samples in the area of the picture that a slice represents may be correctly decoded without the use of data from other slices provided that the reference pictures used at the encoder and the decoder are identical. Therefore, entropy decoding and macroblock reconstruction for a slice do not depend on other slices. In particular, the entropy coding state is reset at the start of each slice. The data in other slices are marked as unavailable when defining neighborhood availability for both entropy decoding and reconstruction. In H.264/AVC, slices may be entropy decoded and reconstructed in parallel. No intra prediction and motion-vector prediction are allowed across the slice boundary. De-blocking filtering may use information across slice boundaries.

Figure 3:
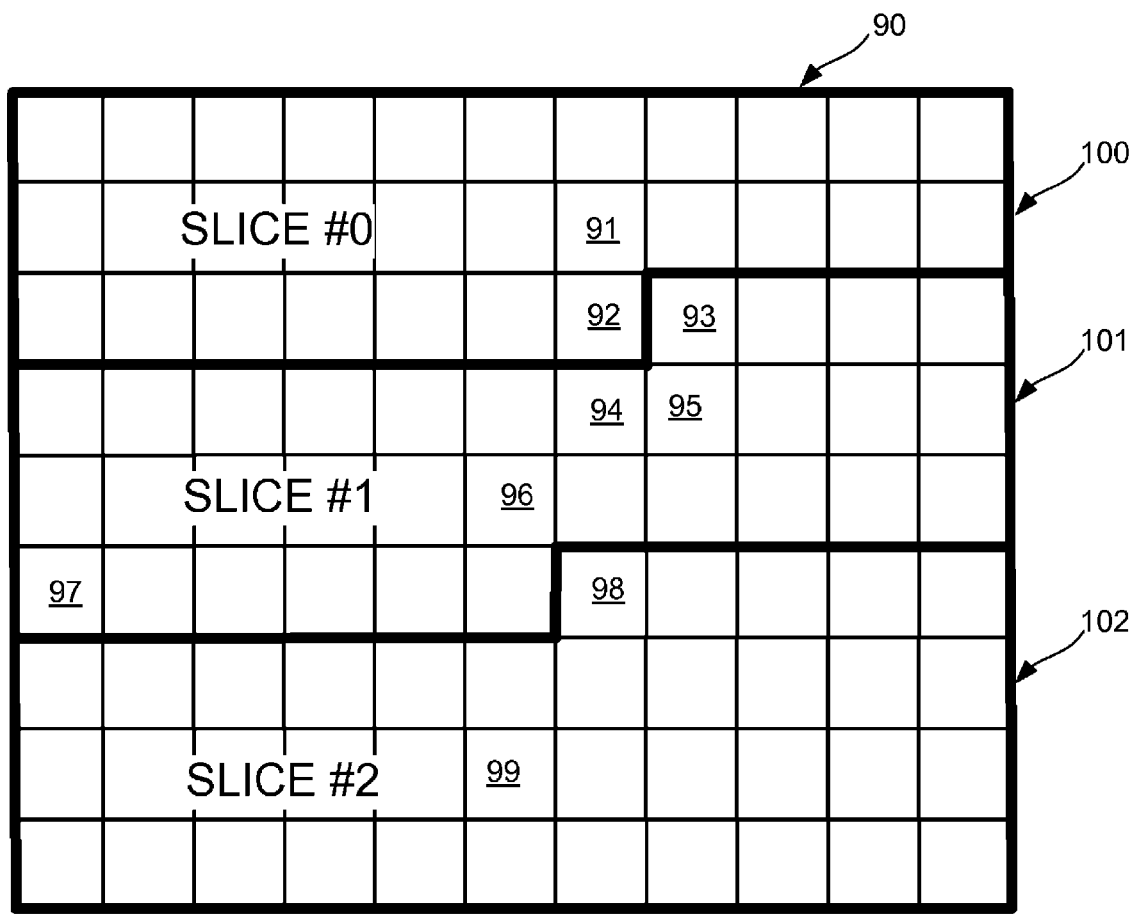
FIG. 3 is a picture showing an exemplary slice structure (prior art)

FIG. 3 shows an exemplary video picture 90 comprising eleven macroblocks in the horizontal direction and nine macroblocks in the vertical direction (nine exemplary macroblocks labeled 91-99). FIG. 3 shows three exemplary slices: a first slice denoted "SLICE #0" 100, a second slice denoted "SLICE #1" 101 and a third slice denoted "SLICE #2" 102. An H.264/AVC decoder may decode and reconstruct the three slices 100, 101, 102 in parallel. At the beginning of the decoding/reconstruction process for each slice, context models are initialized or reset and macroblocks in other slices are marked as unavailable for both entropy decoding and macroblock reconstruction. Thus, for a macroblock, for example, the macroblock labeled 93, in "SLICE #1," macroblocks (for example, macroblocks labeled 91 and 92) in "SLICE #0" may not be used for context model selection or reconstruction. Whereas, for a macroblock, for example, the macroblock labeled 95, in "SLICE #1," other macroblocks (for example, macroblocks labeled 93 and 94) in "SLICE #1" may be used for context model selection or reconstruction. Therefore, entropy decoding and macroblock reconstruction must proceed serially within a slice. Unless slices are defined using flexible macroblock ordering (FMO), macroblocks within a slice are processed in the order of a raster scan.

Flexible macroblock ordering defines a slice group to modify how a picture is partitioned into slices. The macroblocks in a slice group are defined by a macroblock-to-slice-group map, which is signaled by the content of the picture parameter set and additional information in the slice headers. The macroblock-to-slice-group map consists of a slice-group identification number for each macroblock in the picture. The slice-group identification number specifies to which slice group the associated macroblock belongs. Each slice group may be partitioned into one or more slices, wherein a slice is a sequence of macroblocks within the same slice group that is processed in the order of a raster scan within the set of macroblocks of a particular slice group. Entropy decoding and macroblock reconstruction must proceed serially within a slice.

Figure 4:
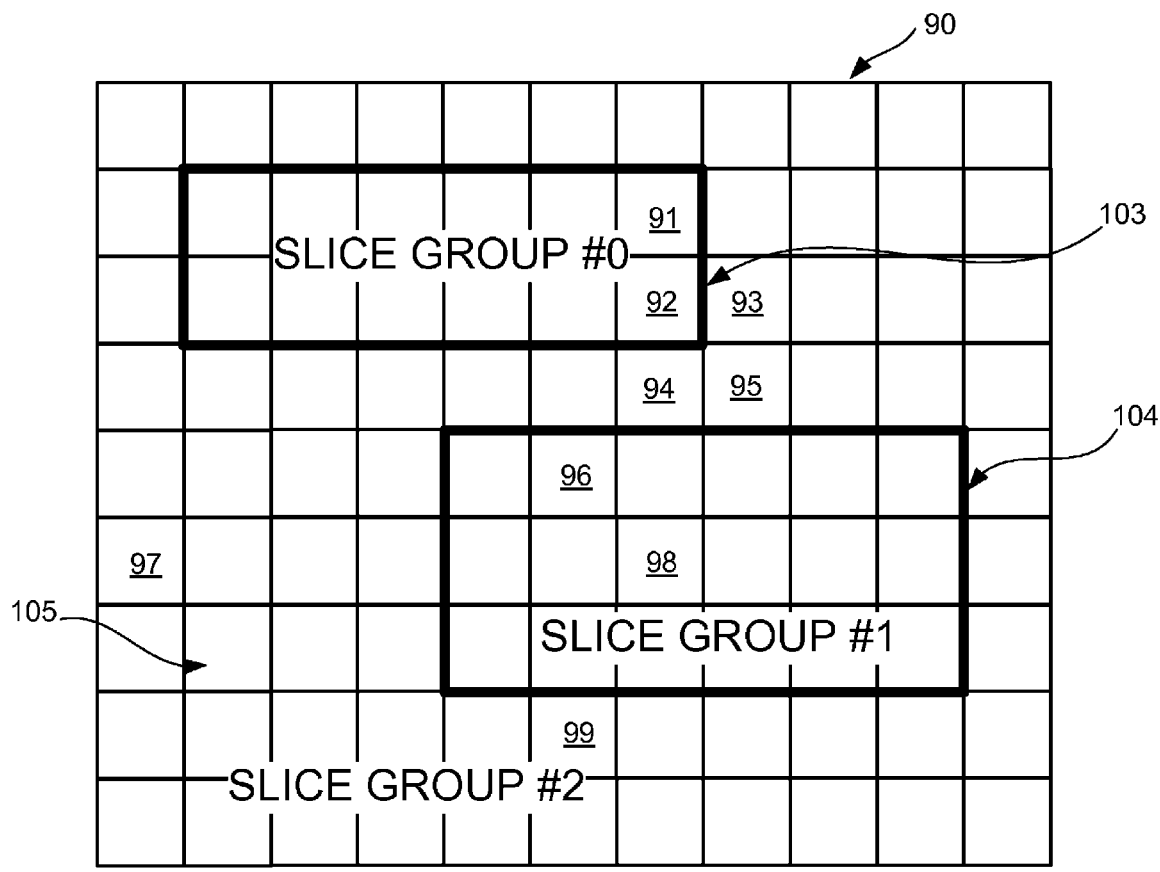
FIG. 4 is a picture showing an exemplary slice group structure (prior art)

FIG. 4 depicts an exemplary macroblock allocation into three slice groups: a first slice group denoted "SLICE GROUP #0" 103, a second slice group denoted "SLICE GROUP #1" 104 and a third slice group denoted "SLICE GROUP #2" 105. These slice groups 103, 104, 105 may be associated with two foreground regions and a background region, respectively, in the picture 90.

Some embodiments of the present invention may comprise partitioning a picture into one or more reconstruction slices, wherein a reconstruction slice may be self-contained in the respect that values of the samples in the area of the picture that the reconstruction slice represents may be correctly reconstructed without use of data from other reconstruction slices, provided that the references pictures used are identical at the encoder and the decoder. All reconstructed macroblocks within a reconstruction slice may be available in the neighborhood definition for reconstruction.

Some embodiments of the present invention may comprise partitioning a reconstruction slice into more than one entropy slice, wherein an entropy slice may be self-contained in the respect that symbol values in the area of the picture that the entropy slice represents may be correctly entropy decoded without the use of data from other entropy slices. In some embodiments of the present invention, the entropy coding state may be reset at the decoding start of each entropy slice. In some embodiments of the present invention, the data in other entropy slices may be marked as unavailable when defining neighborhood availability for entropy decoding. In some embodiments of the present invention, macroblocks in other entropy slices may not be used in a current block's context model selection. In some embodiments of the present invention, the context models may be updated only within an entropy slice. In these embodiments of the present invention, each entropy decoder associated with an entropy slice may maintain its own set of context models.

ITU Telecommunication Standardization Sector, Study Group 16—Contribution 405 entitled "Entropy slices for parallel entropy decoding," April 2008, is hereby incorporated by reference herein in its entirety.

Some embodiments of the present invention may comprise CABAC encoding/decoding. The CABAC encoding process includes the following four elementary steps: binarization; context model selection; binary arithmetic coding; and probability update.

Binarization: A non-binary-valued symbol (for example, a transform coefficient, a motion vector, or other coding data) is converted into a binary code, also referred to as a bin string or a binarized symbol. When a binary-valued syntax element is given, the initial step of binarization may be bypassed. A binary-valued syntax element or an element of a binarized symbol may be referred to as a bin.

For each bin, the following may be performed:

Context Model Selection: A context model is a probability model for one or more bins. The context model comprises, for each bin, the probability of the bin being a "1" or a "0." The model may be chosen for a selection of available models depending on the statistics of recently coded data symbols, usually based on the left and above neighboring symbols, if available.

Binary Arithmetic Coding: An arithmetic coder encodes each bin according to the selected probability model and is based on recursive interval subdivision.

Probability Update: The selected context model is updated based on the actual coded value.

Context adaptation may refer to the process of selecting, based on neighboring symbol values, a context model state, also referred to as a state, associated with a bin and updating a model probability distribution assigned to the given symbols. The location of the neighboring symbols may be defined according to a context template.

In some embodiments of the present invention comprising CABAC encoding/decoding, at the decoding start of an entropy slice, all of the context models may be initialized or reset to predefined models.

Figure 5:
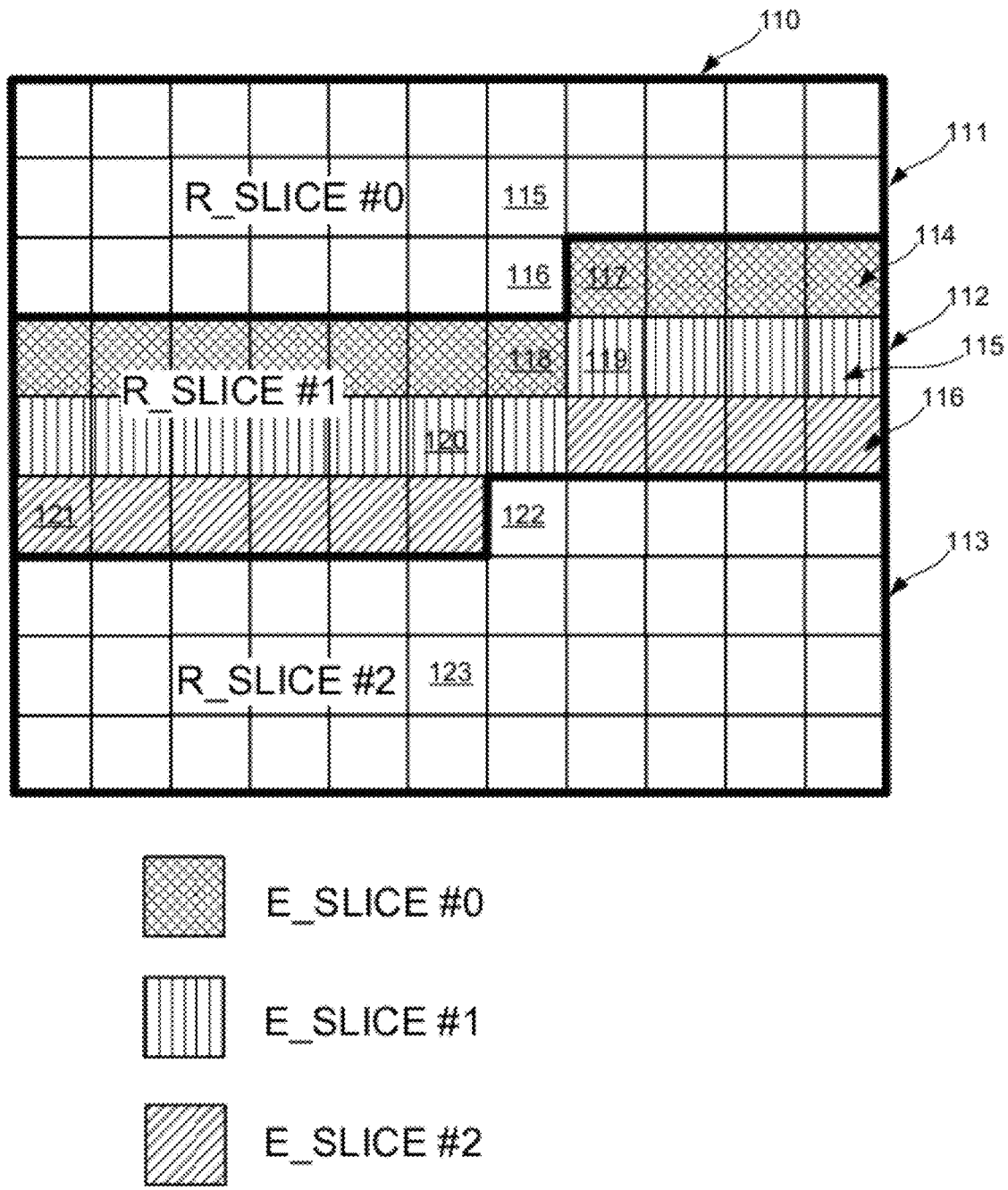
FIG. 5 is a picture showing an exemplary slice partition according to embodiments of the present invention, wherein a picture may be partitioned in at least one reconstruction slice and a reconstruction slice may be partitioned into more than one entropy slice.

Some embodiments of the present invention may be understood in relation to FIG. 5. FIG. 5 shows an exemplary video frame 110 comprising eleven macroblocks in the horizontal direction and nine macroblocks in the vertical direction (nine exemplary macroblocks labeled 115-123). FIG. 5 shows three exemplary reconstruction slices: a first reconstruction slice denoted "R_SLICE #0" 111, a second reconstruction slice denoted "R_SLICE #1" 112 and a third reconstruction slice denoted "R_SLICE #2" 113. FIG. 5 further shows a partitioning of the second reconstruction slice "R_SLICE #1" 112 into three entropy slices: a first entropy slice denoted "E_SLICE # 0" shown in cross-hatch 114, a second entropy slice denoted "E_SLICE #1" shown in vertical-hatch 115 and a third entropy slice denoted "E_SLICE #2" shown in angle-hatch 116. Each entropy slice 114, 115, 116 may be entropy decoded in parallel.

In some embodiments of the present invention, only data from macroblocks within an entropy slice may be available for context model selection during entropy decoding of the entropy slice. All other macroblocks may be marked as unavailable. For this exemplary partitioning, macroblocks labeled 117 and 118 are unavailable for context model selection when decoding symbols corresponding to the area of macroblock labeled 119 because macroblocks labeled 117 and 118 are outside of the entropy slice containing macroblock 119. However, these macroblocks 117, 118 are available when macroblock 119 is reconstructed.

In some embodiments of the present invention, an encoder may determine whether or not to partition a reconstruction slice into entropy slices, and the encoder may signal the decision in the bitstream. In some embodiments of the present invention, the signal may comprise an entropy-slice flag, which may be denoted "entropy_slice_flag" in some embodiments of the present invention.

Figure 6:
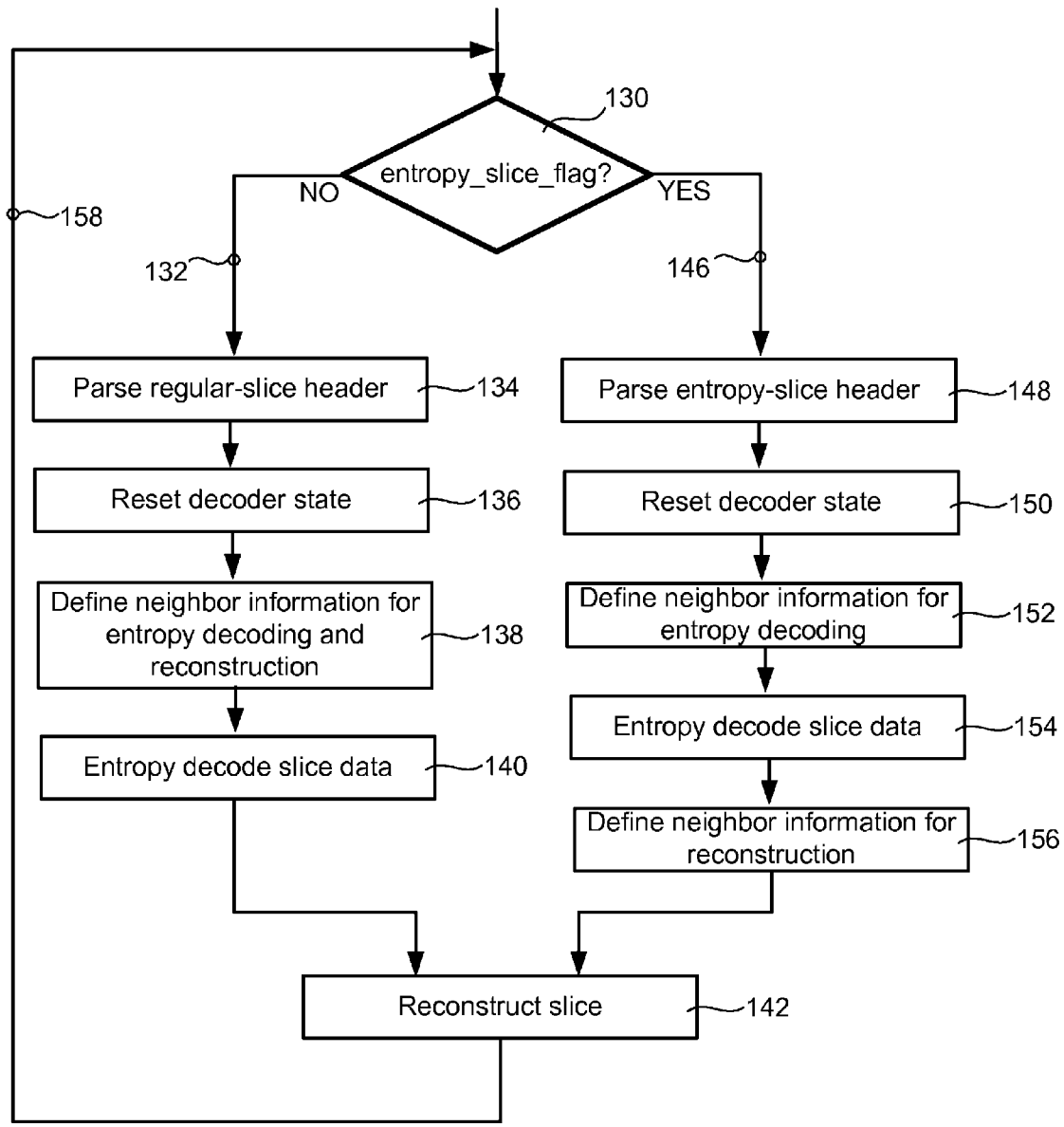
FIG. 6 is chart showing exemplary embodiments of the present invention comprising an entropy slice.

Some decoder embodiments of the present invention may be described in relation to FIG. 6. In these embodiments, an entropy-slice flag may be examined 130, and if the entropy-slice flag indicates that there are no 132 entropy slices associated with a picture, or a reconstruction slice, then the header may be parsed 134 as a regular slice header. The entropy decoder state may be reset 136, and the neighbor information for the entropy decoding and the reconstruction may be defined 138. The slice data may then be entropy decoded 140, and the slice may be reconstructed 142. If the entropy-slice flag indicates there are 146 entropy slices associated with a picture, or a reconstruction slice, then the header may be parsed 148 as an entropy-slice header. The entropy decoder state may be reset 150, the neighbor information for entropy decoding may be defined 152 and the entropy-slice data may be entropy decoded 154. The neighbor information for reconstruction may then be defined 156, and the slice may be reconstructed 142. After slice reconstruction 142, the next slice, or picture, may be examined 158.

Figure 7:
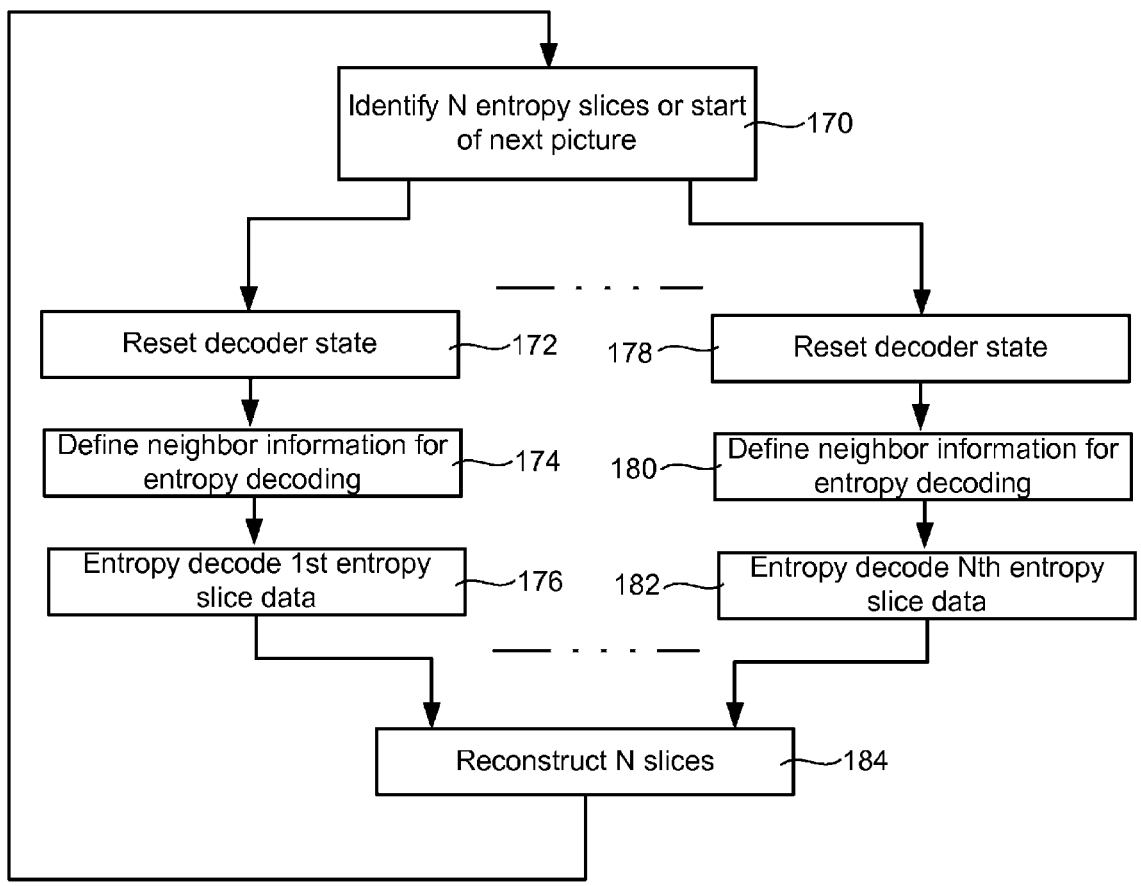
FIG. 7 is a chart showing exemplary embodiments of the present invention comprising parallel entropy decoding of multiple entropy slices followed by slice reconstruction.

Some alternative decoder embodiments of the present invention may be described in relation to FIG. 7. In these embodiments, the decoder may be capable of parallel decoding and may define its own degree of parallelism, for example, consider a decoder comprising the capability of decoding N entropy slices in parallel. The decoder may identify 170 N entropy slices. In some embodiments of the present invention, if fewer than N entropy slices are available in the current picture, or reconstruction slice, the decoder may decode entropy slices from subsequent pictures, or reconstruction slices, if they are available. In alternative embodiments, the decoder may wait until the current picture, or reconstruction slice, is completely processed before decoding portions of a subsequent picture, or reconstruction slice. After identifying 170 up to N entropy slices, each of the identified entropy slices may be independently entropy decoded. A first entropy slice may be decoded 172-176. The decoding 172-176 of the first entropy slice may comprise resetting the decoder state 172. In some embodiments comprising CABAC entropy decoding, the CABAC state may be reset. The neighbor information for the entropy decoding of the first entropy slice may be defined 174, and the first entropy slice data may be decoded 176. For each of the up to N entropy slices, these steps may be performed (178-182 for the Nth entropy slice). In some embodiments of the present invention, the decoder may reconstruct 184 the entropy slices when all of the entropy slices are entropy decoded. In alternative embodiments of the present invention, the decoder may begin reconstruction 184 after one or more entropy slices are decoded.

In some embodiments of the present invention, when there are more than N entropy slices, a decode thread may begin entropy decoding a next entropy slice upon the completion of entropy decoding of an entropy slice. Thus when a thread finishes entropy decoding a low complexity entropy slice, the thread may commence decoding additional entropy slices without waiting for other threads to finish their decoding.

In some embodiments of the present invention which may accommodate an existing standard or method, an entropy slice may share most of the slice attributes of a regular slice according to the standard or method. Therefore, an entropy slice may require a small header. In some embodiments of the present invention, the entropy slice header may allow a decoder to identify the start of an entropy slice and start entropy decoding. In some embodiments, at the start of a picture, or a reconstruction slice, the entropy slice header may be the regular header, or a reconstruction slice header.

In some embodiments of the present invention comprising an H.264/AVC codec, an entropy slice may be signaled by adding a new bit, "entropy_slice_flag" to the existing slice header. Table 1 lists the syntax for an entropy slice header according to embodiments of the present invention, wherein C indicates Category and Descriptor u(1), ue(v) indicate some fixed length or variable length coding methods. Embodiments of the present invention comprising an "entropy_slice_flag" may realize improved coding efficiency.

"first_mb_in_slice" specifies the address of the first macroblock in the entropy slice associated with the entropy-slice header. In some embodiments, the entropy slice may comprise a sequence of macroblocks.

"cabac_init_idc" specifies the index for determining the initialization table used in the initialization process for the context model.

TABLE 1

Exemplary Syntax Table for Entropy Slice Header

| slice_header( ) { | C | Descriptor |
|---|---|---|
|   entropy_slice_flag | 2 | u(1) |
|   if (entropy_slice_flag) { | | |
|     first_mb_in_slice | 2 | ue(v) |
|     if (entropy_coding_mode_flag && | | |
|     slice_type != I && slice_type != SI) | | |
|       cabac_init_idc | 2 | ue(v) |
|     } | | |
|   } | | |
|   else { | | |
|     a regular slice header . . . | | |
|   } | | |
| } | | |

In some embodiments of the present invention, an entropy slice may be assigned a different network abstraction layer (NAL) unit type from the regular slices. In these embodiments, a decoder may distinguish between regular slices and entropy slices based on the NAL unit type. In these embodiments, the bit field "entropy_slice_flag" is not required.

In some embodiments of the present invention, the bit field "entropy_slice_flag" may not be transmitted in all profiles. In some embodiments of the present invention, the bit field "entropy_slice_flag" may not be transmitted in a baseline profile, but the bit field "entropy_slice_flag" may be transmitted in higher profiles such as a main, an extended or a professional profile. In some embodiments of the present invention, the bit field "entropy_slice_flag" may only be transmitted in bitstreams associated with characteristics greater than a fixed characteristic value. Exemplary characteristics may include spatial resolution, frame rate, bit depth, bit rate and other bitstream characteristics. In some embodiments of the present invention, the bit field "entropy_slice_flag" may only be transmitted in bitstreams associated with spatial resolutions greater than 1920×1080 interlaced. In some embodiments of the present invention, the bit field "entropy_slice_flag" may only be transmitted in bitstreams associated with spatial resolutions greater than 1920×1080 progressive. In some embodiments of the present invention, if the bit field "entropy_slice_flag" is not transmitted, a default value may be used.

In some embodiments of the present invention, an entropy slice may be constructed by altering the data multiplexing. In some embodiments of the present invention, the group of symbols contained in an entropy slice may be multiplexed at the macroblock level. In alternative embodiments of the present invention, the group of symbols contained in an entropy slice may be multiplexed at the picture level. In other alternative embodiments of the present invention, the group of symbols contained in an entropy slice may be multiplexed by data type. In yet alternative embodiments of the present invention, the group of symbols contained in an entropy slice may be multiplexed in a combination of the above.

Figure 8:
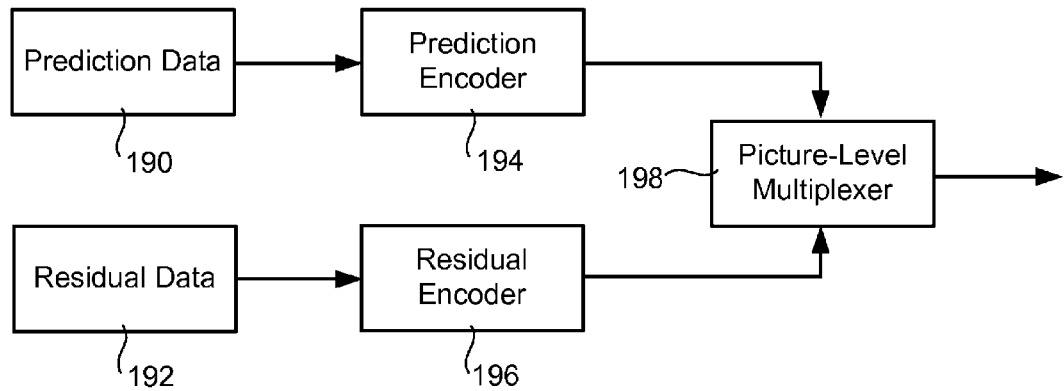
FIG. 8 is a chart showing exemplary embodiments of the present invention comprising prediction data/residual data multiplexing at the picture level for entropy slice construction.
Figure 9:
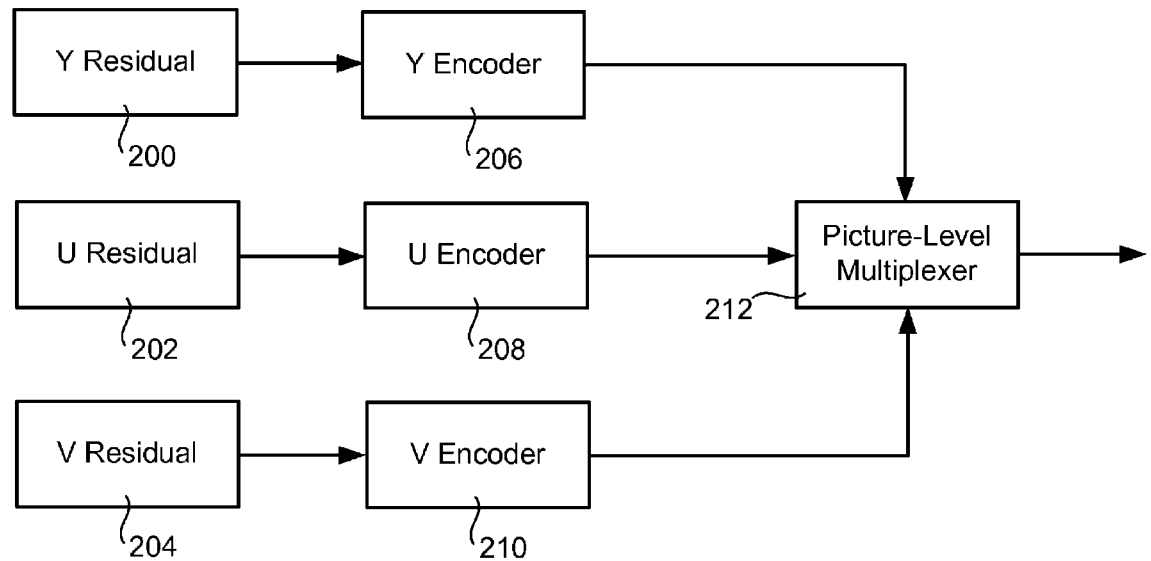
FIG. 9 is a chart showing exemplary embodiments of the present invention comprising color-plane multiplexing at the picture level for entropy slice construction.

Some embodiments of the present invention comprising entropy slice construction based on picture level multiplexing may be understood in relation to FIG. 8 and FIG. 9. In some embodiments of the present invention shown in FIG. 8, prediction data 190 and residual data 192 may be entropy encoded 194, 196 separately and multiplexed 198 at the picture level. In some embodiments of the present invention, the prediction data for a picture 190 may be associated with a first entropy slice, and the residual data for a picture 192 may be associated with a second entropy slice. The encoded prediction data and the encoded entropy data may be decoded in parallel. In some embodiments of the present invention, each partition comprising prediction data or residual data may be partitioned into entropy slices which may be decoded in parallel.

In some embodiments of the present invention shown in FIG. 9, the residual of each color plane, for example, the luma residual 200 and the two chroma residuals 202, 204, may be entropy encoded 206, 208, 210 separately and multiplexed 212 at the picture level. In some embodiments of the present invention, the luma residual for a picture 200 may be associated with a first entropy slice, the first chroma residual for a picture 202 may be associated with a second entropy slice, and the second residual for a picture 204 may be associated with a third entropy slice. The encoded residual data for the three color planes may be decoded in parallel. In some embodiments of the present invention, each partition comprising color-plane residual data may be partitioned into entropy slices which may be decoded in parallel. In some embodiments of the present invention, the luma residual 200 may have relatively more entropy slices compared to the chroma residuals 202, 204.

Figure 10:
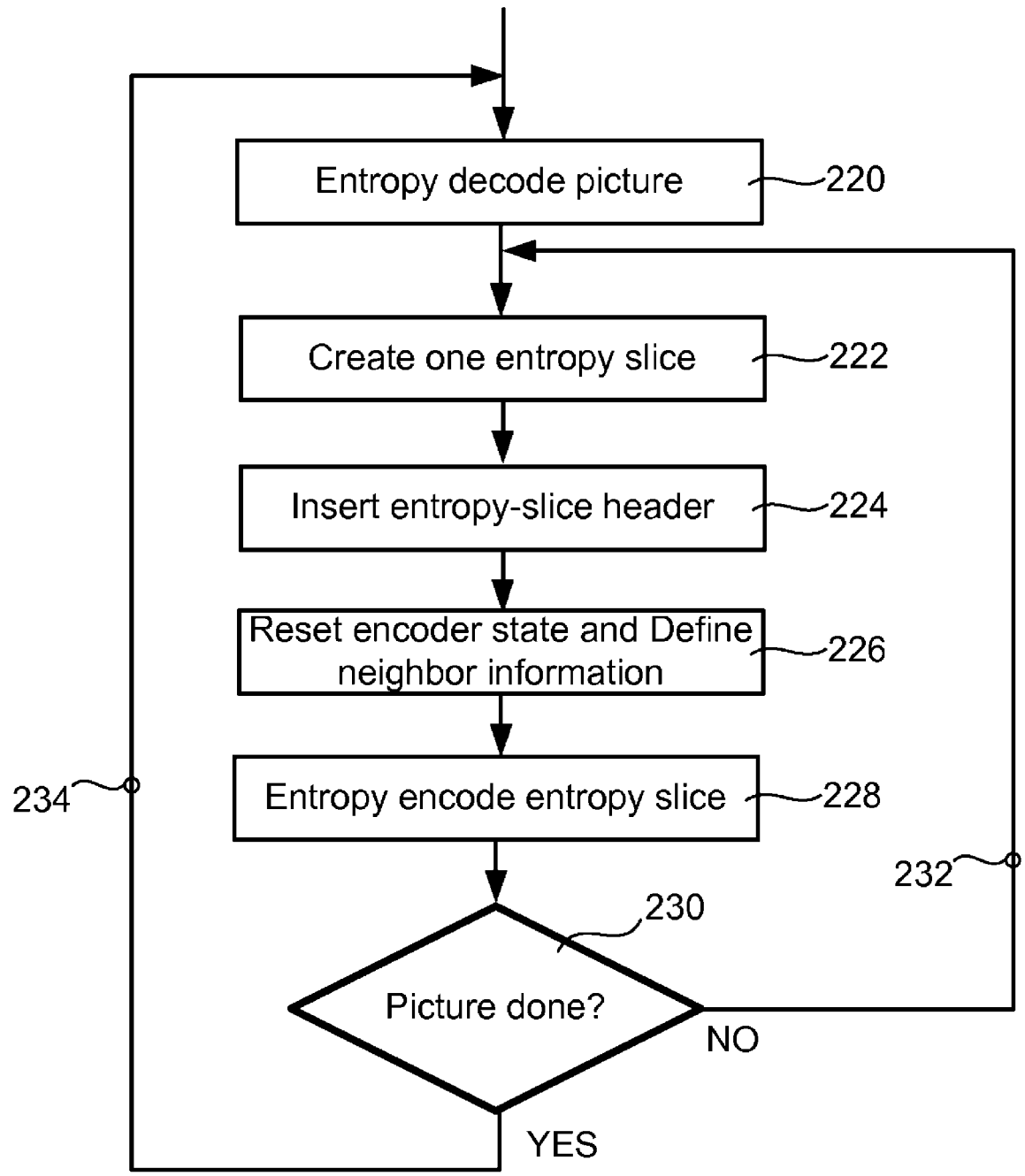
FIG. 10 is a chart showing exemplary embodiments of the present invention comprising trans-coding a bitstream by entropy decoding, forming entropy slices and entropy encoding.

In some embodiments of the present invention, an compressed-video bitstream may be trans-coded to comprise entropy slices, thereby allowing for parallel entropy decoding as accommodated by embodiments of the present invention described above. Some embodiments of the present invention may be described in relation to FIG. 10. An input bitstream without entropy slices may be processed picture-by-picture according to FIG. 10. In these embodiments of the present invention, a picture from the input bitstream may be entropy decoded 220. The data which had been coded, for example, mode data, motion information, residual information and other data, may be obtained. Entropy slices may be constructed 222 one at a time from the data. An entropy-slice header corresponding to an entropy slice may be inserted 224 in a new bitstream. The encoder state may be reset and the neighbor information defined 226. The entropy slice may be entropy encoded 228 and written to the new bitstream. If there is picture data that has not been consumed 232 by the constructed entropy slices, then another entropy slice may be constructed 222, and the process 224-230 may continue until all of the picture data has been consumed 234 by the constructed entropy slices, and then the next picture may be processed.

In some embodiments of the present invention, an encoder may partition a reconstruction slice into a plurality of entropy slices wherein the size of each entropy slice may be less than, or may not exceed, a fixed number of bins. In some embodiments wherein the encoder may restrict the size of each entropy slice, the maximum number of bins may be signaled in the bitstream. In alternative embodiments wherein the encoder may restrict the size of each entropy slice, the maximum number of bins may be defined by the profile and level conformance point of the encoder. For example, Annex A of the H.264/AVC video coding specification may be extended to comprise a definition of the maximum number of bins allowed in an entropy slice.

In some embodiments of the present invention, the maximum number of bins allowed in an entropy slice may be indicated for each level conformance point of the encoder according to a table, for example, as shown in Table 2, where $M_{m,n}$ denotes the maximum number of bins allowed in an entropy slice for a level m.n conformance point.

TABLE 2

Maximum Number of Bins per Entropy Slice for Each Level

| Level | Maximum Number of Bins per Entropy Slice |
|---|---|
| 1.1 | $M_{1.1}$ |
| 1.2 | $M_{1.2}$ |
| . | . |
| . | . |
| . | . |
| m.n | $M_{m,n}$ |
| . | . |
| . | . |
| . | . |
| 5.1 | $M_{5.1}$ |

Exemplary maximum number of bins allowed in an entropy slice are $M_{1.1}$=1,000 bins, $M_{1.2}$=2,000 bins, ..., and $M_{5.1}$=40,000 bins. Other exemplary maximum number of bins allowed in an entropy slice are $M_{1.1}$=2,500 bins, $M_{1.2}$=4,200 bins, ..., and $M_{5.1}$=150,000 bins.

In some embodiments, a set of maximum number of bins allowed in an entropy slice may be determined for all levels based on bit rate, image size, number of macroblocks and other encoding parameters. In some embodiments of the present invention the maximum number of bins allowed in an entropy slice may be the set to the same number for all levels. Exemplary values are 38,000 bins and 120,000 bins.

In some embodiments of the present invention, an encoder may determine a worst case number of bins associated with a macroblock, and the encoder may write the bins associated with:

$$\frac{ESLICE\_MaxNumberBins}{BinsPerMB},$$

macroblocks to each entropy slice, where ESLICE_MaxNumberBins may denote the maximum number of bins allowed in an entropy slice and BinsPerMB may denote the worst case number of bins associated with a macroblock. In some embodiments, the macroblocks may be selected in raster-scan order. In alternative embodiments, the macroblocks may be selected in another, predefined order. In some embodiments, the worst case number of bins associated with a macroblock may be a fixed number. In alternative embodiments, the encoder may update the worst case number based on measurements of the sizes of previously processed macroblocks.

Figure 11:
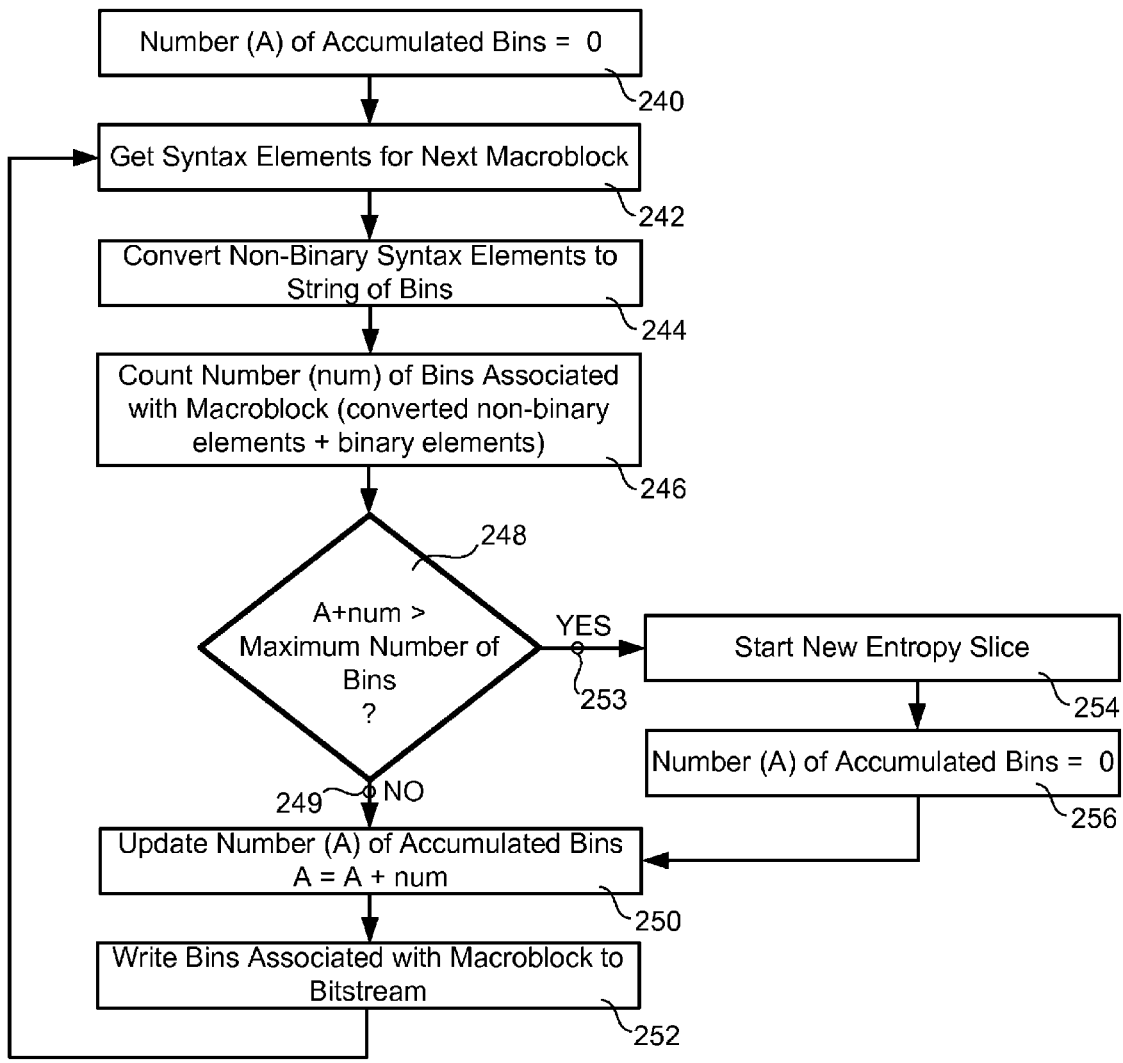
FIG. 11 is a chart showing exemplary embodiments of the present invention comprising partitioning a reconstruction slice into a plurality of entropy slices, wherein the number of bins associated with each entropy slice in the plurality of entropy slices does not exceed a predefined number of bins.

Some embodiments of the present invention may be described in relation to FIG. 11. In these embodiments, an encoder may, for a reconstruction slice, partition the reconstruction slice into a plurality of entropy slices wherein no entropy slice may be larger in size than a predetermined number of bins. The encoder may initialize 240 to zero a counter associated with the number of bins in a current entropy slice. The counter value may be denoted A for illustrative purposes in the remainder of the description of the embodiments of the present invention described in relation to FIG. 11. The syntax elements for a next macroblock may be obtained 242. The next macroblock may be determined according to a predefined macroblock processing order. In some embodiments, the macroblock processing order may correspond to a raster-scan ordering. Non-binary syntax elements in the macroblock may be converted 244 to a string of bins. Binary syntax elements may not require conversion. The number of bins associated with the macroblock may be determined 246. The number of bins associated with the macroblock may include the bins in the strings of bins associated with the non-binary syntax elements in addition to the binary syntax elements, and the number of bins associated with the macroblock may be denoted num for illustrative purposes in the remainder of the description of the embodiments of the present invention described in relation to FIG. 11.

If the number of bins associated with the macroblock may be added 248 to the number of already accumulated bins associated with the current entropy slice without 249 exceeding a maximum number of bins allowed for an entropy slice, then the number of accumulated bins associated with the current entropy slice may be updated 250 to include the bins associated with the macroblock, and the bins associated with the macroblock may be written 252, by the entropy encoder, to the bitstream and associated with the current entropy slice. The syntax elements for the next macroblock may be obtained 242, and the partitioning process may continue.

If the sum 248 of the number of bins associated with the macroblock and the number of already accumulated bins associated with the current entropy slice exceeds 253 the maximum number of bins allowed for an entropy slice, then the encoder may start 254 a new entropy slice associated with the current reconstruction slice and may terminate the current entropy slice. Then the counter associated with the number of bins in the new, now current, entropy slice may be initialized 256 to zero. The number of accumulated bins associated with the current entropy slice may be updated 250 to include the bins associated with the macroblock, and the bins associated with the macroblock may be written 252, by the entropy encoder, to the bitstream and associated with the current entropy slice. The syntax elements for the next macroblock may be obtained 242, and the partitioning process may continue.

Figure 12:
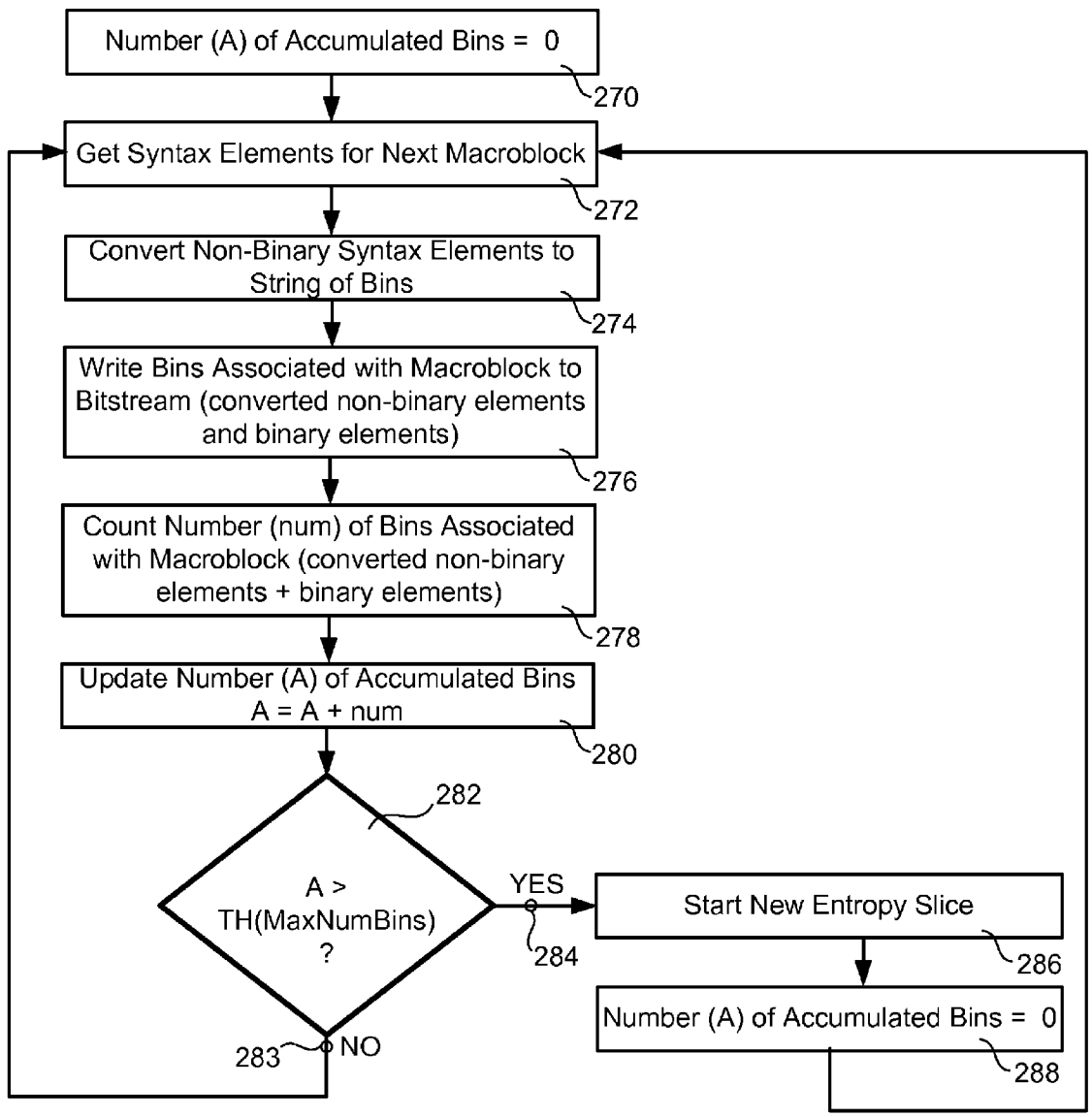
FIG. 12 is a chart showing exemplary embodiments of the present invention comprising partitioning a reconstruction slice into a plurality of entropy slices, wherein bins may be associated with an entropy slice until the number of bins in the entropy slice exceeds a threshold based on a predefined maximum number of bins.

Some embodiments of the present invention may be described in relation to FIG. 12. In these embodiments, an encoder may, for a reconstruction slice, partition the reconstruction slice into a plurality of entropy slices wherein no entropy slice may be larger in size than a predetermined maximum number of bins. In these embodiments, the encoder may associate macroblock syntax elements with an entropy slice until the size of the entropy slice reaches a threshold associated with the predetermined maximum number of bins allowed in an entropy slice. In some embodiments, the threshold may be a percentage of the maximum number of bins allowed in an entropy slice. In one exemplary embodiment, the threshold may be 90% of the maximum number of bins allowed in an entropy slice, supposing that the greatest number of bins expected in a macroblock is less than 10% of the maximum number of bins. In another exemplary embodiment, the threshold may be a percentage of the maximum number of bins allowed in an entropy slice wherein the percentage may be based on the greatest number of bins expected in a macroblock. In these embodiments, once the size of an entropy slice exceeds a threshold size, then another entropy slice may be created. The threshold size may be selected to ensure that the entropy slice does not exceed the maximum number of bins allowed in an entropy slice. In some embodiments, the threshold size may be a function of the maximum number of bins allowed in an entropy slice and an estimate of the maximum number of bins expected for a macroblock.

The encoder may initialize 270 to zero a counter associated with the number of bins in a current entropy slice. The counter value may be denoted A for illustrative purposes in the remainder of the description of the embodiments of the present invention described in relation to FIG. 12. The syntax elements for a next macroblock may be obtained 272. The next macroblock may be determined according to a predefined macroblock processing order. In some embodiments, the macroblock processing order may correspond to a raster-scan ordering. Non-binary syntax elements in the macroblock may be converted 274 to a string of bins. Binary syntax elements may not require conversion. The bins associated with the macroblock may be written 276, by the entropy encoder, to the bitstream and associated with the current entropy slice. The number of bins associated with the macroblock may be determined 278, and the number of accumulated bins associated with the current entropy slice may be updated 280 to include the bins associated with the macroblock. If the number of accumulated bins associated with the current entropy slice is greater than a threshold, which may be denoted TH (MaxNumBins), based on the maximum number of bins allowed in an entropy slice 284, then the encoder may start 286 a new entropy slice and may terminate the current entropy slice. Then the encoder may initialize 288 to zero the counter associated with the number of bins in the new, now current, entropy slice. The syntax elements for the next macroblock may be obtained 272, and the partitioning process may continue. If the number of accumulated bins associated with the current entropy slice is not greater than the threshold based on the maximum number of bins allowed in an entropy slice 283, then the syntax elements for the next macroblock may be obtained 272, and the partitioning process may continue.

In some embodiments of the present invention, an encoder may terminate the current reconstruction slice and start a new reconstruction slice when a predetermined number of macroblocks have been assigned to the current reconstruction slice.

Figure 13:
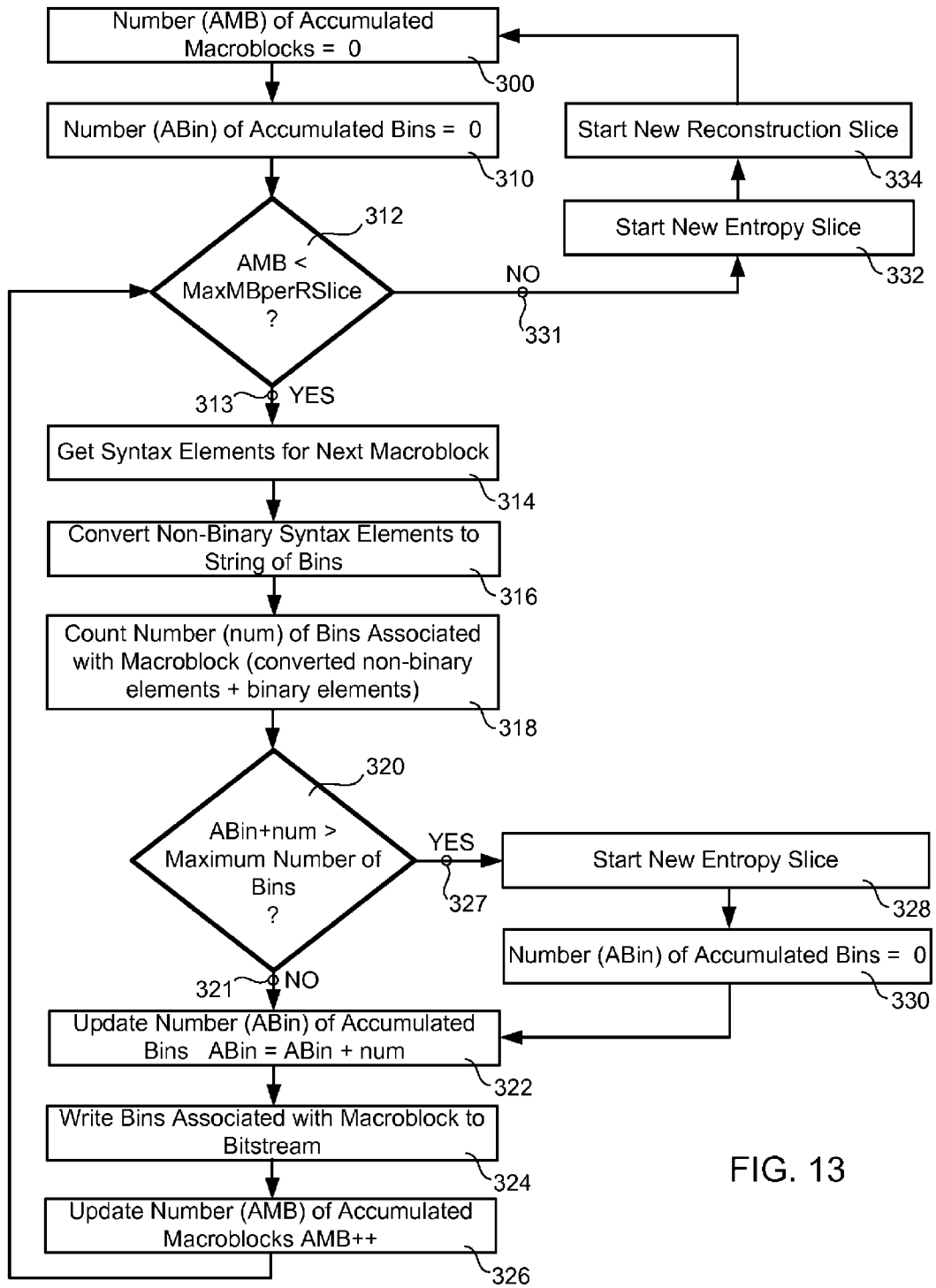
FIG. 13 is a chart showing exemplary embodiments of the present invention comprising partitioning a reconstruction slice into a plurality of entropy slices, wherein the number of bins associated with each entropy slice in the plurality of entropy slices does not exceed a predefined number of bins and each reconstruction slice contains no more than a predefined number of macroblocks.

Some embodiments of the present invention may be described in relation to FIG. 13. In these embodiments, an encoder may terminate the current reconstruction slice and start a new reconstruction slice when a predetermined number of macroblocks have been assigned to the current reconstruction slice. The encoder may initialize 300 to zero a counter associated with the number of macroblocks in a current reconstruction slice. The counter value may be denoted AMB for illustrative purposes in the remainder of the description of the embodiments of the present invention described in relation to FIG. 13. The encoder may initialize 310 to zero a counter associated with the number of bins in a current entropy slice. The counter value may be denoted ABin for illustrative purposes in the remainder of the description of the embodiments of the present invention described in relation to FIG. 13. If the counter value of the counter associated with the number of macroblocks in the current reconstruction slice is not less than a predetermined maximum number of macroblocks allowed in a reconstruction slice 331, then a new entropy slice may be started 332 and a new reconstruction slice may be started 334, terminating the current reconstruction slice and current entropy slice. The maximum number of macroblocks allowed in a reconstruction slice may be denoted MaxMBperRSlice for illustrative purposes in the remainder of the description of the embodiments of the present invention described in relation to FIG. 13.

If the counter value of the counter associated with the number of macroblocks in the current reconstruction slice is less than the predetermined maximum number of macroblocks allowed in a reconstruction slice 313, then the syntax elements for a next macroblock may be obtained 314. The next macroblock may be determined according to a predefined macroblock processing order. In some embodiments, the macroblock processing order may correspond to a raster-scan ordering. Non-binary syntax elements in the macroblock may be converted 316 to a string of bins. Binary syntax elements may not require conversion. The number of bins associated with the macroblock may be determined 318. The number of bins associated with the macroblock may include the bins in the strings of bins associated with the non-binary syntax elements in addition to the binary syntax elements, and the number of bins associated with the macroblock may be denoted num for illustrative purposes in the remainder of the description of the embodiments of the present invention described in relation to FIG. 13.

If the number of bins associated with the macroblock may be added 320 to the number of already accumulated bins associated with the current entropy slice without 321 exceeding a maximum number of bins allowed for an entropy slice, then the number of accumulated bins associated with the current entropy slice may be updated 322 to include the bins associated with the macroblock, the bins associated with the macroblock may be written 324, by the entropy encoder, to the bitstream and associated with the current entropy slice, and the number of macroblocks associated with the current reconstruction slice may be incremented 326. The number of macroblocks associated with the current reconstruction slice may be compared 312 to the predetermined maximum number of macroblocks allowed in a reconstruction slice, and the partitioning process may continue.

If the sum 320 of the number of bins associated with the macroblock and the number of already accumulated bins associated with the current entropy slice exceeds 327 the maximum number of bins allowed for an entropy slice, then the encoder may start 328 a new, now current, entropy slice associated with the current reconstruction slice, and the counter associated with the number of bins in the current entropy slice may be initialized 330 to zero. The number of accumulated bins associated with the current entropy slice may be updated 322 to include the bins associated with the macroblock, the bins associated with the macroblock may be written 324, by the entropy encoder, to the bitstream and associated with the current entropy slice, and the number of macroblocks associated with the current reconstruction slice may be incremented 326. The number of macroblocks associated with the current reconstruction slice may be compared 312 to the predetermined maximum number of macroblocks allowed in a reconstruction slice, and the partitioning process may continue.

Some embodiments of the present invention may be described in relation to FIG. 14. In these embodiments, an encoder may start a new reconstruction slice when a predetermined number of macroblocks have been assigned to the current reconstruction slice. In these embodiments, the encoder may associate macroblock syntax elements with an entropy slice until the size of the entropy slice reaches a threshold associated with the predetermined maximum number of bins allowed in an entropy slice. In some embodiments, the threshold may be a percentage of the maximum number of bins allowed in an entropy slice. In one exemplary embodiment, the threshold may be 90% of the maximum number of bins allowed in an entropy slice, supposing that the greatest number of bins expected in a macroblock is less than 10% of the maximum number of bins. In another exemplary embodiment, the threshold may be a percentage of the maximum number of bins allowed in an entropy slice wherein the percentage may be based on the greatest number of bins expected in a macroblock. In these embodiments, once the size of an entropy slice exceeds a threshold size, then another entropy slice may be created. The threshold size may be selected to ensure that the entropy slice does not exceed the maximum number of bins allowed in an entropy slice. In some embodiments, the threshold size may be a function of the maximum number of bins allowed in an entropy slice and an estimate of the maximum number of bins expected for a macroblock.

The encoder may initialize 350 to zero a counter associated with the number of macroblocks in a current reconstruction slice. The counter value may be denoted AMB for illustrative purposes in the remainder of the description of the embodiments of the present invention described in relation to FIG. 14. The encoder may initialize 352 to zero a counter associated with the number of bins in a current entropy slice. The counter value may be denoted ABin for illustrative purposes in the remainder of the description of the embodiments of the present invention described in relation to FIG. 14. If the counter value of the counter associated with the number of macroblocks in the current reconstruction slice is not less than a predetermined maximum number of macroblocks allowed in a reconstruction slice 373, then a new entropy slice may be started 374, and a new reconstruction slice may be started 376. The maximum number of macroblocks allowed in a reconstruction slice may be denoted MaxMBperRSlice for illustrative purposes in the remainder of the description of the embodiments of the present invention described in relation to FIG. 14.

If the counter value of the counter associated with the number of macroblocks in the current reconstruction slice is less than the predetermined maximum number of macroblocks allowed in a reconstruction slice 355, then the syntax elements for a next macroblock may be obtained 356. The next macroblock may be determined according to a predefined macroblock processing order. In some embodiments, the macroblock processing order may correspond to a raster-scan ordering. Non-binary syntax elements in the macroblock may be converted 358 to a string of bins. Binary syntax elements may not require conversion. The bins associated with the macroblock may be written 360, by the entropy encoder, to the bitstream and associated with the current entropy slice. The number of bins associated with the macroblock may be determined 362, and the number of accumulated bins associated with the current entropy slice may be updated 364 to include the bins associated with the macroblock. If the number of accumulated bins associated with the current entropy slice is greater than a threshold, which may be denoted TH (MaxNumBins), based on the maximum number of bins allowed in an entropy slice 369, then the encoder may start 370 a new entropy slice, and initialize 372 to zero the counter associated with the number of bins in a current entropy slice. The number of macroblocks associated with the current reconstruction slice may be incremented 368. The number of macroblocks associated with the current reconstruction slice may be compared 354 to the predetermined maximum number of macroblocks allowed in a reconstruction slice, and the partitioning process may continue. If the number of accumulated bins associated with the current entropy slice is not greater than the threshold based on the maximum number of bins allowed in an entropy slice 367, then the number of macroblocks associated with the current reconstruction slice may be incremented 368, and the number of macroblocks associated with the current reconstruction slice may be compared 354 to the predetermined maximum number of macroblocks allowed in a reconstruction slice, and the partitioning process may continue.

In alternative embodiments of the present invention, an encoder may partition a reconstruction slice into a plurality of entropy slices, wherein each entropy slice may be associated with no more than a predefined number of bits.

Some embodiments of the present invention may be described in relation to FIG. 15. In these embodiments, an encoder may, for a reconstruction slice, partition the reconstruction slice into a plurality of entropy slices wherein no entropy slice may be larger in size than a predetermined number of bits. The encoder may initialize 400 to zero a counter associated with the number of bits in a current entropy slice. The counter value may be denoted A for illustrative purposes in the remainder of the description of the embodiments of the present invention described in relation to FIG. 15. The syntax elements for a next macroblock may be obtained 402. The next macroblock may be determined according to a predefined macroblock processing order. In some embodiments, the macroblock processing order may correspond to a raster-scan ordering. Non-binary syntax elements in the macroblock may be converted 404 to a string of bins. Binary syntax elements may not require conversion. The bins, converted non-binary elements and binary elements, associated with the macroblock may be presented to the entropy encoder, and the bins may be entropy encoded 406. The number of bits associated with the macroblock may be determined 408. The number of bits associated with the macroblock may be denoted num for illustrative purposes in the remainder of the description of the embodiments of the present invention described in relation to FIG. 15.

If the number of bits associated with the macroblock may be added 410 to the number of already accumulated bits associated with the current entropy slice without 411 exceeding a maximum number of bits allowed for an entropy slice, then the number of accumulated bits associated with the current entropy slice may be updated 412 to include the bits associated with the macroblock, and the bits associated with the macroblock may be written 414 to the bitstream and associated with the current entropy slice. The syntax elements for the next macroblock may be obtained 402, and the partitioning process may continue.

If the sum 410 of the number of bits associated with the macroblock and the number of already accumulated bits associated with the current entropy slice exceeds 415 the maximum number of bits allowed for an entropy slice, then the encoder may start 416 a new entropy slice associated with the current reconstruction slice, and the counter associated with the number of bits in the current entropy slice may be initialized 418 to zero. The number of accumulated bits associated with the current entropy slice may be updated 412 to include the bits associated with the macroblock, and the bits associated with the macroblock may be written 414 to the bitstream and associated with the current entropy slice. The syntax elements for the next macroblock may be obtained 402, and the partitioning process may continue.

Some embodiments of the present invention may be described in relation to FIG. 16. In these embodiments, an encoder may, for a reconstruction slice, partition the reconstruction slice into a plurality of entropy slices wherein no entropy slice may be larger in size than a predetermined maximum number of bits. In these embodiments, the encoder may associate macroblock syntax elements with an entropy slice until the size of the entropy slice reaches a threshold associated with the predetermined maximum number of bits allowed in an entropy slice. In some embodiments, the threshold may be a percentage of the maximum number of bits allowed in an entropy slice. In one exemplary embodiment, the threshold may be 90% of the maximum number of bits allowed in an entropy slice, supposing that the greatest number of bits expected in a macroblock is less than 10% of the maximum number of bits. In another exemplary embodiment, the threshold may be a percentage of the maximum number of bits allowed in an entropy slice wherein the percentage may be based on the greatest number of bits expected in a macroblock. In these embodiments, once the size of an entropy slice exceeds a threshold size, then another entropy slice may be created. The threshold size may be selected to ensure that the entropy slice does not exceed the maximum number of bits allowed in an entropy slice. In some embodiments, the threshold size may be a function of the maximum number of bits allowed in an entropy slice and an estimate of the maximum number of bits expected for a macroblock.

The encoder may initialize 440 to zero a counter associated with the number of bits in a current entropy slice. The counter value may be denoted A for illustrative purposes in the remainder of the description of the embodiments of the present invention described in relation to FIG. 16. The syntax elements for a next macroblock may be obtained 442. The next macroblock may be determined according to a predefined macroblock processing order. In some embodiments, the macroblock processing order may correspond to a raster-scan ordering. Non-binary syntax elements in the macroblock may be converted 444 to a string of bins. Binary syntax elements may not require conversion. The bins associated with the macroblock may be entropy encoded 446, and the number of bins associated with the macroblock may be determined 448. The number of accumulated bits associated with the current entropy slice may be updated 450 to include the bins associated with the macroblock, and the entropy encoded bins associated with the macroblock may be written 452 to the bitstream. If the number of accumulated bits associated with the current entropy slice is greater than a threshold based on the maximum number of bits allowed in an entropy slice 456, then the encoder may start 458 a new entropy slice, and initialize 460 to zero the counter associated with the number of bits in a current entropy slice. The syntax elements for the next macroblock may be obtained 442, and the partitioning process may continue. If the number of accumulated bits associated with the current entropy slice is not greater than a threshold based on the maximum number of bits allowed in an entropy slice 455, then the syntax elements for the next macroblock may be obtained 442, and the partitioning process may continue.

In alternative embodiments of the present invention, an encoder may partition a reconstruction slice into a plurality of entropy slices, wherein each entropy slice may be associated with no more than a predefined number of macroblocks.

In some embodiments of the present invention, a restriction on the maximum number of macroblocks in a reconstruction slice may be imposed in addition to a restriction on the size of an entropy slice.

In some embodiments of the present invention, an encoder may partition a reconstruction slice into a plurality of entropy slices, wherein the size of each entropy slice may be restricted to less than a predefined number of macroblocks and to less than a predefined number of bins.

In some embodiments of the present invention, an encoder may partition a reconstruction slice into a plurality of entropy slices, wherein the size of each entropy slice may be restricted to less than a predefined number of macroblocks and to less than a predefined number of bits.

In some embodiments of the present invention, an encoder may partition a reconstruction slice into a plurality of entropy slices, wherein the size of each entropy slice may be restricted to less than a predefined number of macroblocks, to less than a predefined number of bins and to less than a predefined number of bits.

In some embodiments of the present invention, bin coding within an entropy coder may be parallelized allowing parallel encoding of more than one bin, which may reduce encoding time. These embodiments of the present invention may be understood in relation to an exemplary entropy coder depicted in FIG. 17. In these embodiments, the entropy coder 480 may comprise a context-adaptation unit 482, a state-based, bin-coder selector 484 and a plurality of bin coders, also considered bin-coder units, (three shown) 486, 488, 500 that may operate in parallel. Bins 502 may be made available to the entropy coder 480 from a binarizer 504 that may generate the bins 502 from input symbols 506. The bins 502 may be made available to the context-adaptation unit 482 and the state-based, bin-coder selector 484. The context-adaptation unit 482 may perform context adaptation and generate a model state, also referred to as a state, 508 that may be used to select the bin coder 486, 488, 500 to which a bin 502 may be directed. The state-based, bin-coder selector 484 may select the bin coder 486, 488, 500 associated with the generated model state 508 to encode the bin. In some embodiments (not shown), the generated state 508 may be made available to the selected bin coder. Output bits 510, 512, 514 may be generated by the bin coders 486, 488, 500, and the output bits 510, 512, 514 may be incorporated into a bitstream. In some embodiments of the present invention, the output bits 510, 512, 514 may be buffered and incorporated into the bitstream by concatenation. In alternative embodiments, the output bits 510, 512, 514 may be buffered and incorporated into the bitstream according to an interleaving scheme.

According to embodiments of the present invention described in relation to FIG. 17, a first bin may be sent to a first bin coder in response to a first model state generated in relation to the first bin. The context-adaptation unit 482, upon completion of processing the first bin, may begin processing of a second bin, sending the second bin to a second bin coder in response to a second model state generated in relation to the second bin, thereby allowing substantially parallel processing of more than one bin.

In alternative embodiments of the present invention, an entropy coder may comprise a plurality of context-adaptation units that may operate in parallel and a single bin coder. In systems wherein the context-adaptation units require longer processing time than the bin coder, a plurality of context-adaptation units operating in parallel may reduce encoding time. Some of these embodiments of the present invention may be understood in relation to an exemplary entropy coder depicted in FIG. 18. In these embodiments, the entropy coder 530 may comprise a plurality of context-adaptation units (three shown) 532, 534, 536, a context-adaptation-unit selector 538, a state selector 540 and a bin coder 542. Bins 544 may be made available to the entropy coder 530 from a binarizer 546 that may generate the bins 544 from input symbols 548. The bins 544 may be made available to the context-adaptation-unit selector 538, the state selector 540 and the bin coder 542. The context-adaptation-unit selector 538 may be used to select, or to schedule, a context-adaptation unit 532, 534, 536 to which a bin 544 may be directed and from which a state value 550, 552, 554 may be generated. In some exemplary embodiments, the context-adaptation-unit selector 538 may select a context-adaptation unit 532, 534, 536 based on the syntax associated with the bin, for example a context-adaptation unit identifier may be associated with a bin identifying the context-adaptation unit to which the bin may be directed for processing. In alternative exemplary embodiments, the context-adaptation-unit selector 538 may select a context-adaptation unit 532, 534, 536 based on a scheduling protocol or load-balancing constraint associated with the context-adaptation units 532, 534, 536. In some embodiments, the generated state value may be selected by the state selector 540, according to the criterion used at the context-adaptation unit selector 538, at the appropriate timing to be passed to the bin coder 542. The bin coder 542 may use the state value 556 passed by the state selector 540 in coding the bin 544. In alternative embodiments of the present invention (not shown), the state value may not be required by the bin coder and, therefore, not made available to the bin coder. Output bits 558 may be generated by the bin coder 542, and the output bits 558 may be incorporated into a bitstream. In some embodiments of the present invention, the output bits 558 may be buffered and incorporated into the bitstream by concatenation. In alternative embodiments, the output bits 558 may be buffered and incorporated into the bitstream according to an interleaving scheme.

In yet alternative embodiments of the present invention, an entropy coder may comprise a plurality of context-adaptation units that may operate in parallel and a plurality of bin coders that may operate in parallel. These embodiments of the present invention may be understood in relation to an exemplary entropy coder depicted in FIG. 19. In these embodiments, the entropy coder 570 may comprise a plurality of context-adaptation units (three shown) 572, 574, 576, a context-adaptation-unit selector 578, a state selector 580, a state-based, bin-coder selector 582 and a plurality of bin coders (three shown) 584, 586, 588. Bins 590 may be made available to the entropy coder 570 from a binarizer 592 that may generate the bins 590 from input symbols 594. The bins 590 may be made available to the context-adaptation-unit selector 578, the state selector 580 and the bin-coder selector 582. The context-adaptation-unit selector 578 may be used to select, or to schedule, a context-adaptation unit 572, 574, 576 to which a bin 590 may be directed and from which a state value 596, 598, 600 may be generated. The generated state value may be selected by the state selector 580 at the appropriate timing to be passed to the state-based, bin-coder selector 582. The state-based, bin-coder selector 582 may use the state value 602 passed by the state selector 580 to select the bin coder 584, 586, 588 to which a bin 590 may be directed. In alternative embodiments (not shown), the state value 602 may be made available to the selected bin coder. The selected bin coder may use the state value 602 in coding the bin 590. In alternative embodiments of the present invention (not shown), the state value may not be required by the bin coder and, therefore, not made available to the bin coder. Output bits 604, 606, 608 may be generated by the bin coders 584, 586, 588 and the output bits 604, 606, 608 may be incorporated into a bitstream. In some embodiments of the present invention, the output bits 604, 606, 608 may be buffered and incorporated into the bitstream by concatenation. In alternative embodiments, the output bits 604, 606, 608 may be buffered and incorporated into the bitstream according to an interleaving scheme An exemplary embodiment of the present invention may comprise a plurality of variable length coding codecs that may operate in parallel.

In one exemplary embodiment of the present invention, a bin coder may comprise binary arithmetic coding. In another exemplary embodiment of the present invention, a bin coder may comprise variable length coding. In yet another exemplary embodiment of the present invention, a bin coder may comprise fixed length coding.

In general, an entropy coder may comprise $N_{ca}$ context-adaptation units and $N_{bc}$ bin-coder units, where $N_{ca}$ is an integer greater than, or equal to, one and $N_{bc}$ is an integer greater than, or equal to, one.

In some embodiments of the present invention, an encoder may partition a reconstruction slice into a plurality of entropy slices, wherein the size of each entropy slice may be restricted such that one, or more, of $N_{ca}$ context-adaptation units and $N_{bc}$ bin-coder units may each operate on no more than a limited number of bins during the processing of the entropy slice. Context-adaptation units and bin-coder units with such a restriction may be referred to as restricted entropy-coder units.

In some embodiments of the present invention, an encoder may partition a reconstruction slice into a plurality of entropy slices, wherein the size of each entropy slice may be restricted such that none of the $N_{ca}$ context-adaptation units may operate on more than $B_{ca}$ bins during the processing of an entropy slice. In some embodiments of the present invention, the value of $B_{ca}$ may be signaled, for example, in a bitstream, profile constraint, level constraint or other normative mechanism.

In alternative embodiments of the present invention, an encoder may partition a reconstruction slice into a plurality of entropy slices, wherein the size of each entropy slice may be restricted such that none of the $N_{bc}$ bin-coder units may operate on more than $B_{bc}$ bins during the processing of an entropy slice. In some embodiments of the present invention, the value of $B_{bc}$ may be signaled, for example, in a bitstream, profile constraint, level constraint or other normative mechanism.

In yet alternative embodiments of the present invention, an encoder may partition a reconstruction slice into a plurality of entropy slices, wherein the size of each entropy slice may be restricted such that none of the $N_{ca}$ context-adaptation units may operate on more than $B_{ca}$ bins and none of the $N_{bc}$ bin-coder units may operate on more than $B_{bc}$ bins during the processing of an entropy slice. In some embodiments of the present invention, the value of $B_{bc}$ and the value of $B_{ca}$ may be signaled, for example, in a bitstream, profile constraint, level constraint or other normative mechanism.

In still alternative embodiments of the present invention, an encoder may partition a reconstruction slice into a plurality of entropy slices, wherein the size of each entropy slice may be restricted such that the ith $N_{ca}$ context-adaptation unit, denoted $N_{ca}(i)$, for i=1, ..., $N_{ca}$, may operate on no more than $B_{ca}(i)$ bins and the ith $N_{bc}$ bin-coder unit, $N_{bc}(i)$, for i= 1, ..., $N_{bc}$, may operate on no more than $B_{bc}(i)$ bins during the processing of an entropy slice. In some embodiments of the present invention, the values of the $B_{bc}(i)$ and the values of the $B_{ca}(i)$ may be signaled, for example, in a bitstream, profile constraint, level constraint or other normative mechanism.

Some exemplary embodiments of the present invention may be described in relation to FIG. 20. In these embodiments, an encoder may, for a reconstruction slice, partition the reconstruction slice into a plurality of entropy slices, wherein the size of each entropy slice may be restricted such that one, or more, of $N_{ca}$ context-adaptation units and $N_{bc}$ bin-coder units may operate on no more than a limited number of bins. The encoder may initialize 650 to zero a counter, for each restricted entropy-coder unit, associated with the number of bins processed in a current entropy slice. For illustrative purposes in the remainder of the description of the embodiments of the present invention described in relation to FIG. 20, the counter value may be denoted A, where A represents a vector with each entry in the vector corresponding to the accumulated number of processed bins, for the current entropy slice, by a restricted entropy-coder unit. The syntax elements for a next macroblock may be obtained 652. The next macroblock may be determined according to a predefined macroblock processing order. In some embodiments, the macroblock processing order may correspond to a raster-scan ordering. Non-binary syntax elements in the macroblock may be converted 654 to a string of bins. Binary syntax elements may not require conversion. The number of bins, associated with the macroblock, processed by each restricted entropy-coder unit may be determined 656. The number of bins associated with the macroblock may include the bins in the strings of bins associated with the non-binary syntax elements in addition to the binary syntax elements. For illustrative purposes in the remainder of the description of the embodiments of the present invention described in relation to FIG. 20, the number of bins, associated with the macroblock, processed by each restricted entropy-coder unit may be denoted num, where num represents a vector with each entry in the vector corresponding to the number of processed bins, for the current macroblock, by a restricted entropy-coder unit.

If the number of bins associated with the macroblock for each restricted entropy-coder unit may be added 658 to the number of already accumulated bins, associated with the current entropy slice, for each restricted entropy-coder unit, without 659 exceeding a maximum number of bins allowed for any restricted entropy-coder unit, then the number of accumulated bins associated with the current entropy slice may be updated 660 to include the bins associated with the macroblock, and the bins associated with the macroblock may be written 662, by the entropy encoder, to the bitstream and associated with the current entropy slice. The syntax elements for the next macroblock may be obtained 652, and the partitioning process may continue.

If the sum 658 of the number of bins associated with the macroblock and the number of already accumulated bins associated with the current entropy slice exceeds 663 the maximum number of bins allowed for any restricted entropy-coder unit, then the encoder may start 664 a new entropy slice associated with the current reconstruction slice, and the counter associated with the number of bins in the current entropy slice may be initialized 666 to zero. The number of accumulated bins associated with the current entropy slice may be updated 660 to include the bins associated with the macroblock, and the bins associated with the macroblock may be written 662, by the entropy encoder, to the bitstream and associated with the current entropy slice. The syntax elements for the next macroblock may be obtained 652, and the partitioning process may continue.

Some embodiments of the present invention may be described in relation to FIG. 21. In these embodiments, an encoder may, for a reconstruction slice, partition the reconstruction slice into a plurality of entropy slices, wherein the size of each entropy slice may be restricted such that one, or more, of $N_{ca}$ context-adaptation units and $N_{bc}$ bin-coder units may operate on no more than a limited number of bins. The encoder may initialize 700 to zero a counter, for each restricted entropy-coder unit, associated with the number of bins processed in a current entropy slice by the restricted entropy-coder unit. For illustrative purposes in the remainder of the description of the embodiments of the present invention described in relation to FIG. 21, the counter value may be denoted A, where A represents a vector with each entry in the vector corresponding to the accumulated number of processed bins, for the current entropy slice, by a restricted entropy-coder unit. In these embodiments, the encoder may associate macroblock syntax elements with an entropy slice until the number of bins processed by a restricted entropy-coder unit reaches a threshold associated with the predetermined maximum number of bins allowed to be processed, in an entropy slice, by the restricted entropy-coder unit. In some embodiments, the threshold may be a percentage of the maximum number of bins allowed to be processed, in an entropy slice, by the restricted entropy-coder unit. In one exemplary embodiment, the threshold may be 90% of the maximum number of bins allowed to be processed, in an entropy slice, by the restricted entropy-coder unit, supposing that the greatest number of bins expected in a macroblock to be processed by the restricted entropy-coder unit is less than 10% of the maximum number of bins allowed to be processed, in an entropy slice, by the restricted entropy-coder unit. In another exemplary embodiment, the threshold may be a percentage of the maximum number of bins allowed to be processed, in an entropy slice, by a restricted entropy-coder unit wherein the percentage may be based on the greatest number of bins expected in a macroblock to be processed by the restricted entropy-coder unit. In these embodiments, once the size of an entropy slice exceeds a threshold size, then another entropy slice may be created. The threshold size may be selected to ensure that the entropy slice does not exceed the maximum number of bins allowed to be processed by any one restricted entropy-coder unit in an entropy slice. In some embodiments, the threshold size may be a function of the maximum number of bins allowed in an entropy slice and an estimate of the maximum number of bins expected for a macroblock.

The syntax elements for a next macroblock may be obtained 702. The next macroblock may be determined according to a predefined macroblock processing order. In some embodiments, the macroblock processing order may correspond to a raster-scan ordering. Non-binary syntax elements in the macroblock may be converted 704 to a string of bins. Binary syntax elements may not require conversion. The bins associated with the macroblock may be written 706, by the entropy encoder, to the bitstream and associated with the current entropy slice. The number of bins, associated with the macroblock, processed by each restricted entropy-coder unit may be determined 708. The number of bins associated with the macroblock may include the bins in the strings of bins associated with the non-binary syntax elements in addition to the binary syntax elements. For illustrative purposes in the remainder of the description of the embodiments of the present invention described in relation to FIG. 21, the number of bins, associated with the macroblock, processed by each restricted entropy-coder unit may be denoted num, where num represents a vector with each entry in the vector corresponding to the number of processed bins, for the current macroblock, by a corresponding restricted entropy-coder unit. The number of accumulated bins, associated with the current entropy slice, processed by each restricted entropy-coder unit may be updated 710 to include the bins associated with the macroblock. If the number of accumulated bins, associated with the current entropy slice, processed by a restricted entropy-coder unit is greater than a threshold, which may be denoted TH (MaxNumBins)(i) for restricted entropy-coder unit i, 714, then the encoder may start 716 a new entropy slice, and initialize 718 to zero the counter associated with the number of bins processed by each restricted entropy-coder unit in a current entropy slice. The syntax elements for the next macroblock may be obtained 702, and the partitioning process may continue. If the number of accumulated bins, associated with the current entropy slice, processed by a restricted entropy-coder unit is not greater than the threshold 713, then the syntax elements for the next macroblock may be obtained 702, and the partitioning process may continue.

Some embodiments of the present invention may comprise a combination of the above-described criteria for entropy slice partitioning.

It is to be understood that while some embodiments of the present invention may restrict the size of an entropy slice to be less than a first predefined size, that the size of the entropy slice may be equivalently restricted to not exceed a second predefined size. The embodiments described herein are exemplary embodiments of the present invention, and a person of ordinary skill in the art will appreciate that there are equivalent embodiments of the present invention for restricting the size of an entropy slice.

In some embodiments of the present invention, starting a new entropy slice may comprise terminating the current slice and considering the new entropy slice the current entropy slice.

In some embodiments of the present invention, the decoding of a plurality of bits within an entropy slice may be parallelized within an entropy decoder comprising a plurality of bin decoders, which may reduce decoding time. Exemplary embodiments of the present invention may be understood in relation to an exemplary entropy decoder 750, depicted in FIG. 22, comprising a plurality (three shown) of bin decoders 762, 764, 766. Bits 752 within an entropy slice and previously decoded symbols 754 may be made available to an entropy decoder 750. The bits 752 may be made available to a bin-decoder selector 756 which may select, based on a context state 758 generated from a context-adaptation unit 760, a bin decoder 762, 764, 766. The context-adaptation unit 760 may generate the context state 758 based on the previously decoded symbols 754 made available to the context-adaptation unit 760. The bin-decoder selector 756 may assign a bin-decoder 762, 764, 766 based on the context state 756. The bit to be decoded 752 may be passed by the bin-decoder selector 756 to the selected bin decoder. The bin decoders 762, 764, 766 may generate decoded bins 768, 770, 772 which may be multiplexed by a multiplexer 774 and the multiplexed bins 776 may be sent to a symbolizer 778 which may generate the symbols 754 associated with the bins 776.

In some embodiments of the present invention, decoding of a plurality of bits within an entropy slice may be parallelized within an entropy decoder comprising a plurality of context-adaptation units, which may reduce decoding time. Exemplary embodiments of the present invention may be understood in relation to an exemplary entropy decoder 800, depicted in FIG. 23, comprising a plurality (three shown) of context-adaptation units 814, 816, 818. Bits 802 within an entropy slice and previously decoded symbols 810 may be made available to an entropy decoder 800. The bits 802 may be made available to a context-adaptation unit selector 812 that may select from a plurality of context-adaptation units 814, 816, 818 a context-adaptation unit for the decoding process of an input bit. In some embodiments of the present invention, the context-adaptation unit selector 812 may select the Nth context-adaptation unit when receiving every Nth bit. The selected context-adaptation unit may generate a context state 820, 822, 824 based on the previously decoded symbols 810 made available to the selected context-adaptation unit. A state selector 826, at the appropriate timing, may select the generated context state in associated with an input bit. In some embodiments of the present invention, state selector 826 may select the Nth context-adaptation unit when receiving every Nth bit according to the same procedure as the context-adaptation unit selector 812. The selected state 828 may be made available to the bin decoder 804. The bin decoder 804 may decode the bit 802 and send the decoded bin to a symbolizer 808 which may generate a symbol 810 associated with the decoded bin 806.

In some embodiments of the present invention, decoding of a plurality of bits within an entropy slice may be parallelized within an entropy decoder comprising a plurality of context-adaptation units and a plurality of bin decoders, which may reduce decoding time. Exemplary embodiments of the present invention may be understood in relation to an exemplary entropy decoder 850, depicted in FIG. 24, comprising a plurality (three shown) of context-adaptation units 852, 854, 856 and a plurality (three shown) of bin decoders 858, 860, 862. Bits 864 within an entropy slice and previously decoded symbols 866 may be made available to an entropy decoder 800. The bits 864 may be made available to a context-adaptation unit selector 868 that may select from the plurality of context-adaptation units 852, 854, 856 a context-adaptation unit for the decoding process of an input bit. In some embodiments of the present invention, the context-adaptation unit selector 868 may select the Nth context-adaptation unit when receiving every Nth bit. The selected context-adaptation unit may generate a context state 870, 872, 874 based on the previously decoded symbols 866 made available to the selected context-adaptation unit. A state selector 876, at the appropriate timing, may select the generated context state in associated with an input bit. In some embodiments of the present invention, state selector 876 may select the Nth context-adaptation unit when receiving every Nth bit according to the same procedure as the context-adaptation unit selector 868. The selected state 878 may be made available to a bin-decoder selector 880, which may select, based on the selected context state 878, a bin decoder 858, 860, 862. The bin-decoder selector 880 may assign a bin-decoder 858, 860, 862 based on the context state 878. The bit to be decoded 864 may be passed by the bin-decoder selector 880 to the selected bin decoder. The bin decoders 858, 860, 862 may generate decoded bins 882, 884, 778862 which may be multiplexed by a multiplexer 888 and the multiplexed bins 890 may be sent to a symbolizer 892 which may generate the symbols 866 associated with the bins 864.

In some embodiments of the present invention, an encoder may partition a reconstruction slice into a plurality of entropy slices, wherein the macroblocks within an entropy slice are contiguous. FIG. 25 depicts an exemplary reconstruction slice 950 partitioned into three entropy slices: entropy slice 0 shown in cross-hatch 952, entropy slice 1 shown in white 954 and entropy slice 2 shown in dot-hatch 956. The macroblocks within each entropy slice 952, 954, 956, in this exemplary reconstruction slice 950, are contiguous.

In alternative embodiments of the present invention, an encoder may partition a reconstruction slice into a plurality of entropy slices, wherein the macroblocks within an entropy slice may not be contiguous. FIG. 26 depicts an exemplary reconstruction slice 960 partitioned into three entropy slices: entropy slice 0 shown in cross-hatch 962, entropy slice 1 shown in white 964 and entropy slice 2 shown in dot-hatch 966. The macroblocks within each entropy slice 962, 964, 966, in this exemplary reconstruction slice 960, are not contiguous. A partition of a reconstruction slice in which the macroblocks within an entropy slice are not contiguous may be referred to as an interleaved partition.

In some embodiments of the present invention, during the entropy decoding of a current block within an entropy slice, the decoder may use other blocks from the same entropy slice to predict information related to the entropy decoding of the current block. In some embodiments of the present invention, during reconstruction of a current block within a reconstruction slice, other blocks from the same reconstruction slice may be used to predict information related to the reconstruction of the current block.

In some embodiments of the present invention in which a reconstruction slice comprises an interleaved partition, neighboring blocks within an entropy slice used in the decoding of a current block within the entropy slice may not be directly neighboring, or contiguous. FIG. 27 illustrates this situation for the exemplary interleaved partition depicted in FIG. 26.

In FIG. 27, for a current block 970 within an entropy slice 964, the left-neighbor block used for entropy decoding of the current block 970 is the contiguous, left-neighbor block 972 within the entropy slice 964. The upper-neighbor block used for entropy decoding of the current block 970 is the non-contiguous, upper-neighbor block 974 within the same entropy slice 964. For reconstruction of the current block 970, the left-neighbor block is the contiguous, left-neighbor block 972 within the reconstruction slice 960, and the upper-neighbor block is the contiguous, upper-neighbor block 976 within the reconstruction slice 960.

In some embodiments of the present invention in which a reconstruction slice comprises an interleaved partition, there may be no appropriate neighboring block within an entropy slice to be used in the decoding of a current block within the entropy slice. FIG. 28 illustrates this situation for the exemplary interleaved partition depicted in FIG. 26.

In FIG. 28, for a current block 980 within an entropy slice 964, there is no left-neighbor block within the entropy slice 964 to be used for entropy decoding of the current block 980. The upper-neighbor block used for entropy decoding of the current block 980 is the non-contiguous, upper-neighbor block 982 within the same entropy slice 964. For reconstruction of the current block 980, the left-neighbor block is the contiguous, left-neighbor block 984 within the reconstruction slice 960, and the upper-neighbor block is the contiguous, upper-neighbor block 986 within the reconstruction slice 960.

In some embodiments of the present invention, a decoder may pre-process a complete incoming bitstream to identify the locations of the entropy slices. In some embodiments of the present invention, a decoder may pre-process an entire reconstruction slice to identify the locations of the entropy slices within the reconstruction slice. In some embodiments, the locations of the entropy slices may be determined by identifying the locations of the entropy-slice headers. In these embodiments, the decoder may read the bits in the bitstream and pre-defined start-code values may be identified.

In alternative embodiments, entropy-slice headers may be constrained to a range of bits located at pre-defined positions within an incoming bitstream. In alternative embodiments, entropy-slice headers may be constrained to a range of bytes located at pre-defined positions within an incoming bitstream. In these embodiments, either bit aligned or byte aligned, a decoder need not pre-process significantly large portions of the incoming bitstream to locate the entropy slices.

In some embodiments of the present invention, an encoder may signal, in the bitstream, entropy-slice-location information, also referred to as entropy-slice-location parameters, for example, offset and range information, that may constrain the locations of the entropy-slice headers. In alternative embodiments, entropy-slice-location information may not be signaled in the bitstream, but may be determined from entropy-slice parameters, for example, a fixed number of bins allowed in any given entropy slice, a fixed number of bits allowed in any given entropy slice and other entropy-slice parameters. In still alternative embodiments of the present invention, entropy-slice-location information may be defined by other normative means, for example, the information may be specified in a profile constraint, a level constraint, an application constraint, or other constraint, or the information may be signaled as supplemental information or signaled by other out-of-bound means.

In some embodiments of the present invention, one set of entropy-slice-location parameter values may be used for all entropy slices within a bitstream. In alternative embodiments, entropy-slice-location parameter values may be defined for a group of pixels represented by a portion of a sequence. In alternative embodiments, entropy-slice-location parameter values may be defined for each picture within a bitstream and may be used for all entropy slices within the associated picture. In alternative embodiments, entropy-slice-location parameter values may be defined for each reconstruction slice within a bitstream and may be used for all entropy slices within the associated reconstruction slice. In yet alternative embodiments, multiple sets of entropy-slice-location parameter values may be used by the decoder. In still alternative embodiments, entropy-slice-location parameter values may be assigned to entropy-slice identifiers, for example, a first entropy-slice header may use a first set of entropy-slice-location parameter values, a second entropy-slice header may use a second set of entropy-slice-location parameter values and, in general, an Nth entropy-slice header may use an Nth set of entropy-slice-location parameter values. In some embodiments of the present invention, entropy-slice-parameter values may be assigned to frame identifiers. In one exemplary embodiment, a first picture may use a first set of entropy-slice-parameter values, a second picture may use a second set of entropy-slice-parameter values and, in general, an Nth picture may use an Nth set of entropy-slice-location parameter values. In another exemplary embodiment, a picture of a first type may use a first set of entropy-slice-location parameter values and a picture of a second type may use a second set of entropy-slice-location parameter values. Exemplary types of pictures are intra pictures, predicted pictures and other types of pictures.

In some embodiments of the present invention comprising an H.264/AVC codec, an entropy-slice offset and an entropy-slice range may be signaled in a sequence parameter set Raw Byte Sequence Payload (RBSP) by adding an "entropy_slice_offset" parameter and an "entropy_slice_range" to the sequence parameter set. Table 3 lists exemplary sequence parameter set RBSP syntax according to embodiments of the present invention.

In some embodiments of the present invention comprising an H.264/AVC codec, an entropy-slice offset and an entropy-slice range may be signaled in a picture parameter set Raw Byte Sequence Payload (RBSP) by adding an "entropy_slice_offset" parameter and an "entropy_slice_range" to the picture parameter set. Table 4 lists exemplary picture parameter set RBSP syntax according to embodiments of the present invention.

In some embodiments of the present invention comprising an H.264/AVC codec, an entropy-slice offset and an entropy-slice range may be signaled in a slice header by adding an "entropy_slice_offset" parameter and an "entropy_slice_range" to the slice header. Table 5 lists exemplary slice header syntax according to embodiments of the present invention.

In some embodiments of the present invention, an entropy-slice offset and an entropy-slice range may be indicated for each level conformance point of the encoder according to a table, for example, as shown in Table 6, where $O_{m.n}$ denotes the entropy-slice offset for a level m.n conformance point and $R_{m.n}$ denotes the entropy-slice range for a m.n conformance point.

TABLE 3

Exemplary Sequence Parameter Set RBSP Syntax Table

| seq_parameter_set_rbsp( ) { | C | Descriptor |
|---|---|---|
| profile_idc | 0 | u(8) |
| reserved_zero_8bits /* equal to 0 */ | 0 | u(8) |

TABLE 3-continued

Exemplary Sequence Parameter Set RBSP Syntax Table

| seq_parameter_set_rbsp( ) { | C | Descriptor |
|---|---|---|
| level_idc | 0 | u(8) |
| seq_parameter_set_id | 0 | ue(v) |
| bit_depth_luma_minus8 | 0 | ue(v) |
| bit_depth_chroma_minus8 | 0 | ue(v) |
| increased_bit_depth_luma | 0 | ue(v) |
| increased_bit_depth_chroma | 0 | ue(v) |
| log2_max_frame_num_minus4 | 0 | ue(v) |
| log2_max_pic_order_cnt_lsb_minus4 | 0 | ue(v) |
| max_num_ref_frames | 0 | ue(v) |
| gaps_in_frame_num_value_allowed_flag | 0 | u(1) |
| log2_min_coding_unit_size_minus3 | 0 | ue(v) |
| max_coding_unit_hierarchy_depth | 0 | ue(v) |
| log2_min_transform_unit_size_minus2 | 0 | ue(v) |
| max_transform_unit_hierarchy_depth | 0 | ue(v) |
| pic_width_in_luma_samples | 0 | u(16) |
| pic_height_in_luma_samples | 0 | u(16) |
| entropy_slice_offset | 0 | ue(v) |
| entropy_slice_range | 0 | ue(v) |
| rbsp_trailing_bits( ) | 0 | |
| } | | |

TABLE 4

Exemplary Picture Parameter Set RBSP Syntax Table

| pic_parameter_set_rbsp( ) { | C | Descriptor |
|---|---|---|
| pic_parameter_set_id | 1 | ue(v) |
| seq_parameter_set_id | 1 | ue(v) |
| entropy_coding_mode_flag | 1 | u(1) |
| num_ref_idx_l0_default_active_minus1 | 1 | ue(v) |
| num_ref_idx_l1_default_active_minus1 | 1 | ue(v) |
| pic_init_qp_minus26 /* relative to 26 */ | 1 | se(v) |
| constrained_intra_pred_flag | 1 | u(1) |
| entropy_slice_offset | 0 | ue(v) |
| entropy_slice_range | 0 | ue(v) |
| rbsp_trailing_bits( ) | 1 | |
| } | | |

TABLE 5

Exemplary Syntax Table for Slice Header

| slice_header( ) { | C | Descriptor |
|---|---|---|
| first_lctb_in_slice | 2 | ue(v) |
| slice_type | 2 | ue(v) |
| pic_parameter_set_id | 2 | ue(v) |
| frame_num | 2 | u(v) |
| if( IdrPicFlag ) | | |
|     idr_pic_id | 2 | ue(v) |
| pic_order_cnt_lsb | 2 | u(v) |
| if( slice_type = = P || slice_type = = B ) { | | |
|     num_ref_idx_active_override_flag | 2 | u(1) |
|     if( num_ref_idx_active_override_flag ) { | | |
|         num_ref_idx_l0_active_minus1 | 2 | ue(v) |
|         if( slice_type = = B ) | | |
|             num_ref_idx_l1_active_minus1 | 2 | ue(v) |
|     } | | |
| } | | |
| if( nal_ref_idc != 0 ) | | |
|     dec_ref_pic_marking( ) | 2 | |
| if( entropy_coding_mode_flag && slice_type != I ) | | |
|     cabac_init_idc | 2 | ue(v) |
| slice_qp_delta | 2 | se(v) |
| alf_param( ) | | |
| if( slice_type = = P || slice_type = = B ) { | | |
|     mc_interpolation_idc | 2 | ue(v) |

TABLE 5-continued

Exemplary Syntax Table for Slice Header

| slice_header( ) { | C | Descriptor |
|---|---|---|
|     mv_competition_flag | 2 | u(1) |
|     if ( mv_competition_flag ) { | | |
|         mv_competition_temporal_flag | 2 | u(1) |
|     } | | |
| } | | |
| if ( slice_type = = B && mv_competition_flag) | | |
| collocated_from_l0_flag | 2 | u(1) |
| entropy_slice_offset | 0 | ue(v) |
| entropy_slice_range | 0 | ue(v) |
| } | | |

TABLE 6

Exemplary Entropy-Slice Offset and Entropy-Slice Range for Each Level

| Level | Entropy Slice Offset | Entropy Slice Range |
|---|---|---|
| 1.1 | $O_{1.1}$ | $R_{1.1}$ |
| 1.2 | $O_{1.2}$ | $R_{1.2}$ |
| . | . | . |
| . | . | . |
| . | . | . |
| m.n | $O_{m.n}$ | $R_{m.n}$ |
| . | . | . |
| . | . | . |
| . | . | . |
| 5.1 | $O_{5.1}$ | $R_{5.1}$ |

In some embodiments, entropy-slice-location information may comprise information that may constrain the locations of the entropy-slice headers. In one example, entropy-slice-location information may comprise an offset, also referred to as a period or base offset, value and a range, also referred to as a deviation or offset for a period, value. An entropy-slice-header location may be constrained based on the offset value and the range value. In some embodiments of the present invention, an offset value and a range value may be defined explicitly. In alternative embodiments of the present invention, an offset value and a range value may be implicitly defined as a minimum offset value and a maximum offset value. In still alternative embodiments of the present invention, an offset value and a range value may be implicitly defined as a maximum offset value and the difference between the maximum offset value and a minimum offset value. In yet alternative embodiments of the present invention, an offset value and a range value may be implicitly defined as a minimum offset value and the difference between the minimum offset value and a maximum offset value. In alternative embodiments, an offset value and a range value may be implicitly defined as a third value and the difference between the third value and a maximum offset value and a minimum offset value. In still alternative embodiments, an offset value and a range value may be defined through an index into a look-up table that contains the corresponding minimum and maximum bit-values. In some embodiments, an offset value and a range value may be defined using an offset based look-up tree. In some embodiments, an offset value and a range value may be defined using cost-minimizing indexing. A person having ordinary skill in the art will recognize that there are many methods known in the art for implicitly defining a range value and an offset value and for assuring that an encoder and a decoder operate with the same value for the pre-defined offset and range values.

In some embodiments of the present invention, signaling a range value may be optional. In some embodiments, when a range value is not signaled, then the range value may be set to a pre-defined value. In an exemplary embodiment, the pre-defined value may be zero. In another exemplary embodiment, the pre-defined value may be a non-zero integer value.

In an exemplary embodiment described in relation to FIG. 29, the entropy-slice header associated with an entropy slice, slice number N within a reconstruction slice, may be constrained to start after Nk–p bits from the start of, or other fixed location within, the reconstruction-slice header, where k denotes the offset value and p denotes the range. The location from which the Nk–p bits may be measured may be referred to as the reference location. In alternative embodiments, a reference location may not be associated with a particular reconstruction slice and may be the same fixed location within a bitstream for all entropy slices. In alternative embodiments, the entropy-slice header may be byte aligned, and the constraint may be associated with a number of bytes. While the example illustrated in relation to FIG. 29 is described in terms of bits, a person having ordinary skill in the art may appreciate the alternative byte-aligned embodiments.

FIG. 29 is a pictorial representation of an exemplary portion 1000 of an exemplary bitstream. The bitstream portion 1000 comprises a reconstruction-slice header 1002, represented by a solid black rectangle, four entropy-slice headers (the entropy-slice header corresponding to the zeroth entropy slice 1003, referred to as the zeroth entropy-slice header, the entropy-slice header corresponding to the first entropy slice 1004, referred to as the first entropy-slice header, the entropy-slice header corresponding to the second entropy slice 1005, referred to as the second entropy-slice header, the entropy-slice header corresponding to the third entropy slice 1006, referred to as the third entropy-slice header), represented by solid gray rectangles, and remaining portions of the entropy slices, represented by thin, black-and-white stripes. In this example, the reference location may be the start 1001 of the reconstruction-slice header 1002. In some embodiments of the present invention, the entropy-slice header corresponding to the zeroth entropy slice 1003 may be constrained to be located immediately after the reconstruction-slice header 1002. In some embodiments of the present invention, the entropy-slice header corresponding to the zeroth entropy slice may be a part of the reconstruction-slice header. In these embodiments, the reconstruction-slice header may comprise a reconstruction portion and an entropy portion. In some embodiments of the present invention depicted in FIG. 29, the first entropy-slice header 1004 may be constrained to be located after k–p bits 1007 from the reference location 1001, the second entropy-slice header 1005 may be constrained to be located after 2k–p bits 1008 from the reference location 1001, the second entropy-slice header 1006 may be constrained to be located after 3k−p bits 1009 from the reference location 1001. In these embodiments, an entropy decoder assigned to decode entropy slice N may begin searching for the corresponding entropy-slice header after Nk−p bits from the reference location 1001.

In alternative embodiments of the present invention, the entropy-slice-location information may not comprise a range parameter. In these embodiments, an entropy decoder may begin searching for the Nth entropy-slice header after Nk bits from a reference location.

In another exemplary embodiment described in relation to FIG. 30, the entropy-slice header associated with entropy slice, slice number N within a reconstruction slice, may be constrained to start after Nk−p bits from the start of, or other fixed location within, the reconstruction-slice header, where k denotes the offset value and p denotes the range, and the entropy-slice header may further be constrained to be within a 2p range of bits from the constrained starting location. The location from which the Nk−p bits may be measured may be referred to as the reference location. In alternative embodiments, a reference location may not be associated with a particular reconstruction slice and may be the same fixed location within a bitstream for all entropy slices. In alternative embodiments, the entropy-slice header may be byte aligned, and the constraint may be associated with a number of bytes. While the example illustrated in relation to FIG. 30 is described in terms of bits, a person having ordinary skill in the art may appreciate the alternative byte-aligned embodiments.

FIG. 30 is a pictorial representation of an exemplary portion 1020 of an exemplary bitstream. The bitstream portion 1020 comprises a reconstruction-slice header 1022, represented by a solid black rectangle, four entropy-slice headers (the entropy-slice header corresponding to the zeroth entropy slice 1023, referred to as the zeroth entropy-slice header, the entropy-slice header corresponding to the first entropy slice 1024, referred to as the first entropy-slice header, the entropy-slice header corresponding to the second entropy slice 1025, referred to as the second entropy-slice header, the entropy-slice header corresponding to the third entropy slice 1026, referred to as the third entropy-slice header), represented by solid gray rectangles, and remaining portions of the entropy slices, represented by thin, black-and-white stripes. In this example, the reference location may be the start 1021 of the reconstruction-slice header 1022. In some embodiments of the present invention, the entropy-slice header corresponding to the zeroth entropy slice 1023 may be constrained to be located immediately after the reconstruction-slice header 1022. In some embodiments of the present invention, the entropy-slice header corresponding to the zeroth entropy slice may be a part of the reconstruction-slice header. In these embodiments, the reconstruction-slice header may comprise a reconstruction portion and an entropy portion. In some embodiments of the present invention depicted in FIG. 30, the first entropy-slice header 1024 may be constrained to be located within 2p bits 1031 after k−p bits 1027 from the reference location 1021, the second entropy-slice header 1025 may be constrained to be located within 2p bits 1032 after 2k−p bits 1028 from the reference location 1021, the second entropy-slice header 1026 may be constrained to be located within 2p bits 1033 after 3k−p bits 1029 from the reference location 1021. In these embodiments, an entropy decoder assigned to decode entropy slice N may begin searching for the corresponding entropy-slice header after Nk−p bits from the reference location and may terminate the search after identifying the entropy-slice header or after searching 2p bits.

Some embodiments of the present invention may be described in relation to FIG. 31. In these embodiments, an entropy decoder may receive 1050 an entropy-slice number indicating the number of the entropy slice in the current reconstruction block to entropy decode. The entropy decoder may determine 1052 the entropy-slice-location information. In some embodiments of the present invention, the entropy-slice-location information, also referred to as entropy-slice-location parameters, may be signaled in the bitstream, and the decoder may determine 1052 the entropy-slice information by examining the bitstream. In alternative embodiments, the entropy-slice-location information may not be signaled in the bitstream, but may be determined 1052, by the decoder, from entropy-slice parameters, for example, a fixed number of bins allowed in any given entropy slice, a fixed number of bits allowed in any given entropy slice and other entropy-slice parameters. In still alternative embodiments of the present invention, the entropy-slice-location information may be defined and determined 1052 by other normative means, for example, the information may be specified in a profile constraint, a level constraint, an application constraint, or other constraint, or the information may be signaled as supplemental information or signaled by other out-of-bound means.

The entropy decoder may calculate 1054 an entropy-slice-search start location at before which, in the bitstream, the entropy-slice header is restricted from having been written by the encoder. In some embodiments of the present invention, the entropy-slice-search start location may be calculated 1054 using an offset value and a range value determined from the entropy-slice-location information. In alternative embodiments of the present invention, the entropy-slice-search start location may be calculated 1054 using an offset value determined from the entropy-slice-location information. The entropy decoder may advance 1056, in the bitstream, to the entropy-slice-search start location, and may examine 1058 the bitstream for an entropy-slice header. In some embodiments of the present invention, an entropy-slice header may be indicated by a start code.

Some embodiments of the present invention may be described in relation to FIG. 32. In these embodiments, an entropy decoder may receive 1070 an entropy-slice number indicating the number of the entropy slice in the current reconstruction block to entropy decode. The entropy decoder may determine 1072 the entropy-slice-location information. In some embodiments of the present invention, the entropy-slice-location information, also referred to as entropy-slice-location parameters, may be signaled in the bitstream, and the decoder may determine 1072 the entropy-slice information by examining the bitstream. In alternative embodiments, the entropy-slice-location information may not be signaled in the bitstream, but may be determined 1072, by the decoder, from entropy-slice parameters, for example, a fixed number of bins allowed in any given entropy slice, a fixed number of bits allowed in any given entropy slice and other entropy-slice parameters. In still alternative embodiments of the present invention, the entropy-slice-location information may be defined and determined 1072 by other normative means, for example, the information may be specified in a profile constraint, a level constraint, an application constraint, or other constraint, or the information may be signaled as supplemental information or signaled by other out-of-bound means.

The entropy decoder may calculate 1074 an entropy-slice-search start location before which, in the bitstream, the entropy-slice header is restricted from having been written by the encoder. In some embodiments of the present invention, the entropy-slice-search start location may be calculated 1074 using an offset value and a range value determined from the entropy-slice-location information. In alternative embodiments of the present invention, the entropy-slice-search start location may be calculated 1074 using an offset value determined from the entropy-slice-location information. The entropy decoder may advance 1076, in the bitstream, to the entropy-slice-search start location and may examine 1078 the bitstream for an entropy-slice header. In some embodiments of the present invention, an entropy-slice header may be indicated by a start code.

The bits, in the bitstream, may be examined 1078 in sequence starting at said entropy-slice-search start location. If 1080 an entropy-slice header is identified 1081, then the entropy decoder may entropy decode 1082 the entropy slice associated with the identified entropy-slice header. If 1080 an entropy-slice header is not identified 1083, then the entropy decoder may terminate 1084 the search. In some embodiments, the entropy decoder may indicate an error when no entropy-slice header is identified 1083.

Some embodiments of the present invention may be described in relation to FIG. 33. In these embodiments, an entropy decoder may receive 1100 an entropy-slice number indicating the number of the entropy slice, in the current reconstruction, block to entropy decode. The entropy decoder may determine 1102 the entropy-slice-location information. In some embodiments of the present invention, the entropy-slice-location information, also referred to as entropy-slice-location parameters, may be signaled in the bitstream, and the decoder may determine 1102 the entropy-slice information by examining the bitstream. In alternative embodiments, the entropy-slice-location information may not be signaled in the bitstream, but may be determined 1102, by the decoder, from entropy-slice parameters, for example, a fixed number of bins allowed in any given entropy slice, a fixed number of bits allowed in any given entropy slice and other entropy-slice parameters. In still alternative embodiments of the present invention, the entropy-slice-location information may be defined and determined 1102 by other normative means, for example, the information may be specified in a profile constraint, a level constraint, an application constraint, or other constraint, or the information may be signaled as supplemental information or signaled by other out-of-bound means.

The entropy decoder may calculate 1104 an entropy-slice-search start location before which, in the bitstream, the entropy-slice header is restricted from having been written by the encoder. In some embodiments of the present invention, the entropy-slice-search start location may be calculated 1104 using an offset value and a range value determined from the entropy-slice-location information. In alternative embodiments of the present invention, the entropy-slice-search start location may be calculated 1104 using an offset value determined from the entropy-slice-location information. The entropy decoder may advance 1106, in the bitstream, to the entropy-slice-search start location and may examine 1108 the bitstream for an entropy-slice header. In some embodiments of the present invention, an entropy-slice header may be indicated by a start code.

The bits, in the bitstream, may be examined 1108 in sequence starting at said entropy-slice-search start location. If 1110 an entropy-slice header is identified 1111, then the entropy decoder may entropy decoder 1112 the entropy slice associated with the identified entropy-slice header. If 1110 an entropy-slice header is not identified 1113, then if 1114 a search criterion is satisfied 1115, the entropy decoder may terminate 1116. The search criterion may provide a standard by which a determination may be made as to whether, or not, valid locations for the start of entropy-slice header remain to be searched. In some embodiments (not shown), a search criterion may be satisfied if valid locations remain to be examined. In alternative embodiments, a search criterion may be satisfied if there are no valid locations remaining to be examined 1115, and the search may terminate 1116. In some embodiments, the entropy decoder may indicate an error when no entropy-slice header is identified 1115. If 1114 the search criterion is not satisfied 1117, the examination 1108 of the bitstream may continue after advancing 1118, in the bitstream to the next search location.

In some embodiments of the present invention, the search criterion may be related to a range value, for example, the location of the start of an entropy-slice header may be restricted to a range of 2p bits centered at Nk, where k denotes the offset value, p denotes the range value and N is the entropy slice number within a reconstruction slice. In these embodiments, the location of the start of the entropy-slice header associated with entropy slice N may be restricted to the range Nk−p to Nk+p. In some embodiments, the search criterion may be related to a restriction, or restrictions, on the size of an entropy slice. In some embodiments, the search criterion may be related to a combination of restrictions.

In some embodiments of the present invention, an encoder may pad an entropy slice in order to meet a restriction on the location of the next entropy-slice header.

In some embodiments of the present invention, an encoder may terminate an entropy slice prior to other entropy-slice size restrictions being met in order to meet a restriction on the location of the next entropy-slice header.

In some embodiments of the present invention, when the last entropy slice within a reconstruction slice does not contain the number of bits (or bytes, in a byte-aligned embodiment) necessary to satisfy the constraint on the location of the next entropy-slice header, an encoder may pad the last entropy slice within the reconstruction slice to satisfy the constraint on the location of the next entropy-slice header.

In alternative embodiments, an entropy-slice header may comprise a last-entropy-slice flag, wherein the value of the last-entropy-slice flag may indicate whether or not the entropy slice associated with the entropy-slice header is the last entropy slice in a reconstruction slice. In some embodiments, a last-entropy-slice flag value of zero may be associated with the last entropy slice. In alternative embodiments, a last-entropy-slice flag value of one may be associated with the last entropy slice. In some embodiments, when the value of the last-entropy-slice flag indicates that the entropy slice is the last entropy slice in a reconstruction slice, then the subsequent entropy-slice header may be located immediately following the current entropy slice without padding.

Table 7 shows exemplary syntax and semantics for signaling a last-entropy-slice flag, referred to as a "next_entropy_slice_flag." In an exemplary embodiment comprising the exemplary syntax and semantics shown in Table 7, the "next_entropy_slice_flag" flag signals if there are additional entropy slices for a current reconstruction slice. If the "next_entropy_slice_flag" flag indicates that there are no additional entropy slices for the current reconstruction slice, then the location of the next entropy-slice header in the bitstream may not be constrained by the entropy-slice-location parameters.

In some embodiments of the present invention, the location of entropy-slice headers may be organized in a tree format with the root node pointing to an entropy-slice header location. In some embodiments, the entropy-slice header location pointed to by the root node may be relative. In alternative embodiments, the entropy-slice header location pointed to by the root node may be absolute. The remaining nodes of the tree may contain offset distances with respect to their parent node. The tree may be designed according to a design constraint, for example, to reduce an average time for determining entropy-slice header location, to bound a worst-case time required for determining entropy-slice header location, to signal a preferred order of entropy slice decoding, to minimize a storage cost for the tree and other design constraints. In some embodiments, the number of children of each node in the tree may be controlled based on a desired level of parallelism in entropy-slice header location determination.

TABLE 7

Exemplary Syntax Table for Last-Entropy-Slice Flag

| slice_header( ) { | C | Descriptor |
|---|---|---|
|     entropy_slice_flag | 2 | u(1) |
|     next_entropy_slice_flag | 2 | ue(v) |
|     if (entropy_slice_flag) { | | |
|         first_mb_in_slice | 2 | ue(v) |
|         if( entropy_coding_mode_flag && | | |
|         slice_type != I && slice_type != | | |
|         SI ) | | |
|             cabac_init_idc | 2 | ue(v) |
|         } | | |
|     } | | |
|     else { | | |
|         a regular slice header . . . | | |
|     } | | |
| } | | |

In some embodiments of the present invention, the context models may be reset within an entropy slice whenever a context-model-reset condition is met. In some of these embodiments, the values to which the context models may be reset may be based on the context model of a neighboring elementary unit within the entropy slice, and if the neighboring elementary unit is not within the entropy slice, then default values may be used. In alternative embodiments, the context models may be reset to default values. In yet alternative embodiments, the context models may be reset based on a context model whose identifier may be signaled within the bitstream, said identifier indicating one of a plurality of predefined context models. A predefined context model may depend on one, or more, parameters in the bitstream. In exemplary embodiments, the context models may be reset based on a signaled "cabac_init_idc" value, within the bitstream, indicating one of a plurality of predefined context models.

In some embodiments, a context table may be used to initialize a plurality of context models, wherein a context table refers to a set of context models. In some embodiments, the set of context models in a context table may undergo adaptation based on one, or more, parameters in the bitstream, for example, a quantization parameter, a slice type parameter or other parameter.

In one exemplary embodiment illustrated in FIG. 34, the context models may be reset, within an entropy slice, when a current macroblock is the first macroblock in a row, in addition to being reset at the starting macroblock in an entropy slice. FIG. 34 depicts an exemplary reconstruction slice 1200 containing 48 macroblocks 1208-1255 partitioned into three entropy slices: entropy slice "0" (shown in cross-hatch) 1202, entropy slice "1" (shown in white) 1204 and entropy slice "2" (shown in dot-hatch) 1206. Entropy slice "0" 1202 contains 15 macroblocks 1208-1222. Entropy slice "1" 1204 contains 17 macroblocks 1223-1239, and entropy slice "2" 1206 contains 16 macroblocks 1240-1255. The macroblocks at which the context models may be reset are indicated with a thick black edge 1260-1266 and are those macroblocks 1208, 1223, 1240 at the start of each entropy slice and the first macroblock in each row 1216, 1224, 1232, 1240, 1248.

The elementary unit, for example, the macroblock, at the start of an entropy slice may be referred to as the slice-start elementary unit. For example, for the entropy slices 1202, 1204, 1206 in the exemplary reconstruction slice 1200 in FIG. 34, the respective slice-start elementary units are 1208, 1223 and 1240. An elementary unit that is the first elementary unit in a row in an entropy slice may be referred to as a row-start elementary unit, for example, macroblocks 1208, 1216, 1224, 1232, 1240 and 1248 in FIG. 34.

In some embodiments, the context models may be reset based on the context models of a neighboring macroblock if the neighboring macroblock is within the entropy slice and default values if the neighboring macroblock is not within the entropy slice. For example, the context models may be reset based on the context models of the macroblock above the current macroblock if the macroblock above the current macroblock is in the same entropy slice, but set to default values if the macroblock above the current macroblock is not in the same entropy slice.

In another exemplary embodiment, the context models may be reset, within an entropy slice, when a current elementary unit is the first elementary unit in a row. In alternative embodiments, the context-model-reset condition may be based on other criteria, for example, the number of bins processed within the entropy slice, the number of bits processed within the slice, the spatial location of the current elementary unit and other criterion.

In some embodiments of the present invention, a context-model-reset flag may be used to indicate whether or not the context models may be reset within an entropy slice whenever a context-model-reset condition is met. In some embodiments, the context-model-reset flag may be in the entropy-slice header. In alternative embodiments, the context-model-reset flag may be in the reconstruction-slice header. In some embodiments, the context-model-reset flag may be a binary flag, and the context-model-reset condition may be a default condition. In alternative embodiments, the context-model-reset flag may by a multi-valued flag further indicating the context-model-reset condition.

In one exemplary embodiment comprising context-adaptive coding, for example, CABAC coding, CAV2V coding and other context-adaptive coding, an "lcu_row_cabac_init_flag" flag may signal if entropy decoding may be initialized at the start of the largest coding unit (LCU) row. In some embodiments, an LCU is a generalization of the macroblock concept used in H.264 to high efficiency video coding (HEVC), and a picture is divided into slices, wherein a slice is made up of a sequence of LCUs. In alternative embodiments, an LCU is the largest block of pixel value locations that may be represented with a single, transmitted mode value. In alternative embodiments, an LCU is the largest block of pixel value locations that may be represented with a single, transmitted prediction mode value. In some embodiments of the present invention, an "lcu_row_cabac_init_flag" flag value of "1" may signal that the entropy coding context is reset. An entropy coding context may represent the set of all context models associated with an entropy coder. In some embodiments of the present invention, an "lcu_row_cabac_init_flag" flag value of "1" may signal that the entropy coding context is reset and the adaptive scanning is reset. Adaptive scanning may refer to a process in which a codec adapts a scan ordering of transform coefficients based on previously transmitted transform coefficient values. In one embodiment, the scan ordering is determined by generating a coefficient significance map, and the transform coefficient values corresponding to coefficient significance values larger than a pre-determined value may be transmitted prior to the transform coefficient values corresponding to coefficient significance values less than or equal to the pre-determined value. In one embodiment, the coefficient significance values that correspond to transform coefficient values that are greater than a pre-determined value may subsequently be increased. In an alternative embodiment, the coefficient significance values that correspond to transform coefficient values that are less than or equal to a pre-determined value may subsequently be decreased. The adaptive scanning process may be reset by setting the coefficient significant map to a pre-defined value. In some embodiments, the default value, assumed when the flag is not sent, for the "lcu_row_cabac_init_flag" flag may be "0." An "lcu_row_cabac_init_idc_flag" flag may signal if cabac_init_idc values will be transmitted at the start of each LCU row. In some embodiments, when the value of the "lcu_row_cabac_init_idc_flag" flag is "1" values will be transmitted at the start of each LCU row. In some embodiments, the default value, assumed when the flag is not sent, for the "lcu_row_cabac_init_idc_flag" flag may be "0." In some embodiments, a "cabac_init_idc_present_flag" flag may signal if a cabac_init_idc value is transmitted for the LCU. In some embodiments, when a cabac_init_idc value is not transmitted for the LCU then the entropy coding context is reset using the preceding value for cabac_init_idc in the bit-stream In some embodiments of the present invention, "lcu_row_cabac_init_flag" and "lcu_row_cabac_init_idc_flag" may be signaled in a regular slice header, for example, when the value of "entropy_slice_flag" is "0". Table 8 and Table 9 show exemplary syntax for these embodiments. Table 8 shows exemplary slice header syntax, and Table 9 shows exemplary slice data syntax.

TABLE 8

Exemplary Syntax Table for Signaling the Initialization of Entropy Coding at the Start of the LCU Row

| slice_header( ) { | C | Descriptor |
|---|---|---|
|   entropy_slice_flag | 2 | u(1) |
|   if (entropy_slice_flag) { | | |
|     first_lcu_in_slice | 2 | ue(v) |
|     if (entropy_coding_mode_flag) { | | |
|       lcu_row_cabac_init_flag | 1 | u(1) |
|       if( lcu_row_cabac_init_flag ){ | | |
|         lcu_row_cabac_init_idc_flag | 1 | u(1) |
|       } | | |
|     } | | |
|     if( entropy_coding_mode_flag && | | |
|       slice_type != I) { | | |
|       cabac_init_idc | 2 | ue(v) |
|     } | | |
|   } | | |
|   else { | | |
|     lcu_row_cabac_init_flag | 1 | u(1) |
|     if( lcu_row_cabac_init_flag ){ | | |
|       lcu_row_cabac_init_idc_flag | 1 | u(1) |
|     } | | |
|     a regular slice header . . . | | |
|   } | | |
| } | | |

TABLE 9

Exemplary Syntax Table for Signaling the Initial Context for the LCU

| coding_unit( x0, y0, currCodingUnitSize ) { | C | Descriptor |
|---|---|---|
|   if (x0==0 && | | |
|     currCodingUnitSize==MaxCodingUnitSize && | | |
|     lcu_row_cabac_init_idc_flag==true && | | |
|     lcu_id!=first_lcu_in_slice) { | | |
|       cabac_init_idc_present_flag | 1 | u(1) |
|     if( cabac_init_idc_present_flag ) | | |
|       cabac_init_idc | 2 | ue(v) |
|   } | | |
|   a regular coding unit . . . | | |
| } | | |

In another exemplary embodiment comprising context-adaptive coding, for example, CABAC coding, CAV2V coding and other context-adaptive coding, an "mb_row_cabac_init_flag" flag may signal if entropy decoding may be initialized at the first macroblock in a row. In some embodiments of the present invention, an "mb_row_cabac_init_flag" flag value of "1" may signal that the entropy coding context is reset at the start of each macroblock row. In alternative embodiments of the present invention, an "mb_row_cabac_init_flag" flag value of "1" may signal that the entropy coding context is reset and the adaptive scanning is reset at the start of each macroblock row. In some embodiments, the default value, assumed when the flag is not sent, for the "mb_row_cabac_init_flag" flag may be "0." An "mb_row_cabac_init_idc_flag" flag may signal if cabac_init_idc values will be transmitted at the start of each macroblock row. In some embodiments, when the value of the "mb_row_cabac_init_idc_flag" flag is "1" values will be transmitted at the start of each macroblock row. In some embodiments, the default value, assumed when the flag is not sent, for the "mb_row_cabac_init_idc_flag" flag may be "0." In some embodiments, a "cabac_init_idc_present_flag" flag may signal if a cabac_init_idc value is transmitted for the macroblock. In some embodiments, when a cabac_init_idc value is not transmitted for the macroblock, then the entropy coding context is reset using the preceding value for cabac_init_idc in the bit-stream. In some embodiments of the present invention, the "mb_row_cabac_init_flag" flag and the "mb_row_cabac_init_idc_flag" flag may be signaled in a regular slice header, for example, when the value of "entropy_slice_flag" is "0". Table 10 and Table 11 show exemplary syntax for these embodiments. Table 10 shows exemplary slice header syntax, and Table 11 shows exemplary slice data syntax.

TABLE 10

Exemplary Syntax Table for Signaling the Initialization of Entropy Coding at the Start of the Macroblock Row

| slice_header( ) { | C | Descriptor |
|---|---|---|
|   entropy_slice_flag | 2 | u(1) |
|   if (entropy_slice_flag) { | | |
|     first_mb_in_slice | 2 | ue(v) |
|     if (entropy_coding_mode_flag) { | | |
|       mb_row_cabac_init_flag | 1 | u(1) |
|       if( mb_row_cabac_init_flag ){ | | |
|         mb_row_cabac_init_idc_flag | 1 | u(1) |
|       } | | |
|     } | | |
|     if( entropy_coding_mode_flag && | | |
|       slice_type != I) { | | |
|       cabac_init_idc | 2 | ue(v) |
|     } | | |

TABLE 10-continued

Exemplary Syntax Table for Signaling the Initialization
of Entropy Coding at the Start of the Macroblock Row

| slice_header( ) { | C | Descriptor |
|---|---|---|
|     } | | |
|     else { | | |
|         mb_row_cabac_init_flag | 1 | u(1) |
|         if( mb_row_cabac_init_flag ){ | | |
|             mb_row_cabac_init_idc_flag | 1 | u(1) |
|         } | | |
|         a regular slice header . . . | | |
|     } | | |
| } | | |

TABLE 11

Exemplary Syntax Table for Signaling the
Initial Context for the Macroblock

| coding_unit( x0, y0, currCodingUnitSize ) { | C | Descriptor |
|---|---|---|
|     if (x0==0 && | | |
|     currCodingUnitSize==MaxCodingUnitSize && | | |
|     mb_row_cabac_init_idc_flag==true && | | |
|     mb_id!=first_mb_in_slice) { | | |
|         cabac_init_idc_present_flag | 1 | u(1) |
|         if( cabac_init_idc_present_flag ) | | |
|             cabac_init_idc | 2 | ue(v) |
|     } | | |
|     a regular coding unit . . . | | |
| } | | |

In some embodiments of the present invention, the locations, in a bitstream, of the entropy slices may be signaled in the bitstream. In some embodiments, a flag may be used to signal that the locations, in the bitstream, of the entropy slices are going to be signaled in the bitstream. Some exemplary embodiments may comprise an "entropy_slice_locations_flag" that if "true" may indicate that the locations, in the bitstream, of the entropy-slice headers are going to be signaled in the bitstream. In some embodiments, the location data may be differentially encoded. In some embodiments, the location data may be sent in each reconstruction slice. In alternative embodiments, the location data may be sent once per picture.

In some embodiments of the present invention, the locations, in a bitstream, of the rows may be signaled in the bitstream. In some embodiments, a flag may be used to signal that the location, in the bitstream, of the first LCU in each row is going to be signaled in the bitstream. Some exemplary embodiments may comprise an "lcu_row_location_flag" that if "true" may indicate that the location, in the bitstream, of the first LCU in each row is going to be signaled in the bitstream. In some embodiments, the location data may be differentially encoded. In some embodiments, the location data may be sent in each entropy slice. In alternative embodiments, the location data may be sent once per reconstruction slice.

Table 12 shows exemplary syntax for signaling the locations, in the bitstream, of the rows and the entropy slices. For this exemplary syntax, the semantics are:

"entropy_slice_locations_flag" signals if entropy slice header location is transmitted. If the value of "entropy_slice_locations_flag" is set to "1", then the entropy slice header location is transmitted, otherwise it is not transmitted. The default value for the "entropy_slice_locations_flag" is "0".

"num_of entropy_slice_minus1" signals the number of entropy slices in the reconstruction slice minus 1.

"entropy_slice_offset [i]" indicates the offset of the $i^{th}$ entropy slice from the previous entropy slice.

"lcu_row_locations_flag" signals if LCU row location information is being transmitted or not. If the value of "lcu_row_locations_flag" is "1", then the LCU row location information is transmitted, otherwise it is not transmitted. The default value for "lcu_row_locations_flag" is "0".

"num_of lcu_rows_minus1" signals the number of LCU rows in the entropy slice minus 1.

"lcu_row_offset [i]" indicates the offset of the $i^{th}$ LCU row from the previous LCU row.

TABLE 12

Exemplary Syntax Table for Signaling the Locations,
in the Bitstream, of the First LCU in a Row

| slice_header( ) { | C | Descriptor |
|---|---|---|
|     entropy_slice_flag | 2 | u(1) |
|     if (entropy_slice_flag) { | | |
|         first_lcu_in_slice | 2 | ue(v) |
|         lcu_row_cabac_init_flag | 1 | u(1) |
|         if( lcu_row_cabac_init_flag ){ | | |
|             lcu_row_cabac_init_idc_flag | 1 | u(1) |
|             lcu_row_locations_flag | 1 | u(1) |
|             if (lcu_row_locations_flag) { | | |
|                 lcu_row_locations ( ) | | |
|             } | | |
|         } | | |
|         if( entropy_coding_mode_flag && slice_type != I) { | | |
|             cabac_init_idc | 2 | ue(v) |
|         } | | |
|     } | | |
|     else { | | |
|         entropy_slice_locations_flag | 1 | u(1) |
|         if (entropy_slice_locations_flag) { | | |
|             entropy_slice_locations( ) | | |
|         } | | |
|         lcu_row_cabac_init_flag | 1 | u(1) |
|         if( lcu_row_cabac_init_flag ){ | | |
|             lcu_row_cabac_init_idc_flag | 1 | u(1) |
|             lcu_row_locations_flag | 1 | u(1) |
|             if (lcu_row_locations_flag) { | | |

TABLE 12-continued

Exemplary Syntax Table for Signaling the Locations,
in the Bitstream, of the First LCU in a Row

```
        lcu_row_ locations ( )
          }
        }
        a regular slice header . . .
      }
}
```

| entropy_slice_ locations( ) | C | Descriptor |
|---|---|---|
| { | | |
|    num_entropy_slices_minus1 | 2 | ue(v) |
|    for (i=0; i<num_of_entropy_slices_minus1; i++) | | |
|      entropy_slice_offset[i] | 2 | ue(v) |
| } | | |

| lcu_row_ locations( ) | C | Descriptor |
|---|---|---|
| { | | |
|    num_of_lcu_rows_minus1 | 2 | ue(v) |
|    for (i=0; i<num_of_lcu_rows_minus1_slice; i++) { | | |
|      lcu_row_offset[i] | 2 | ue(v) |
|    } | | |
| } | | |

Table 13 shows a comparison of rate distortion performance for all-intra coding. The first comparison, shown in the two sub-columns of column three, is a comparison, using the H.264/AVC Joint Model (JM) software, version 13.0, between encoding using multiple slices, wherein entropy decoding and macroblock reconstruction for a slice does not depend on other slices, and encoding using no slices. On average, for the same bit rate, the quality is degraded by −0.3380 dB encoding using multiple slices over using no slices. On average, for the same quality level, the bit rate is increased by 7% by encoding using multiple slices over using no slices.

The second comparison, shown in the two sub-columns of column four, is a comparison between encoding using one reconstruction slice partitioned, according to embodiments of the present invention, into multiple entropy slices (two rows of macroblocks per entropy slice) and encoding using JM 13.0 with no slices. On average, for the same bit rate, the quality is degraded by −0.0860 dB using one reconstruction slice with multiple entropy slices over encoding using no slices. On average, for the same quality level, the bit rate is increased by 1.83% by encoding using one reconstruction slice with multiple entropy slices over encoding using no slices.

Table 14 shows a comparison of rate distortion performance for IBBP coding. The first comparison, shown in the two sub-columns of column three, is a comparison, using the H.264/AVC Joint Model (JM) software, version 13.0, between encoding using multiple slices, wherein entropy decoding and macroblock reconstruction for a slice does not depend on other slices, and encoding using no slices. On average, for the same bit rate, the quality is degraded by −0.5460 dB encoding using multiple slices. On average, for the same quality level, the bit rate is increased by 21.41% by encoding using multiple slices over using no slices.

The second comparison, shown in the two sub-columns of column four, is a comparison between encoding using one reconstruction slice partitioned, according to embodiments of the present invention, into multiple entropy slices (two rows of macroblocks per entropy slice) and encoding using JM 13.0 with no slices. On average, for the same bit rate, the quality is degraded by −0.31 dB using one reconstruction slice with multiple entropy slices over encoding using no slices. On average, for the same quality level, the bit rate is increased by 11.45% by encoding using one reconstruction slice with multiple entropy slices over encoding using no slices.

TABLE 13

Comparison of rate distortion performance - all-intra encoding
All Intra Coding

| Sequence | Resolution | JM 13.0 slices compared to JM 13.0 no slices | | One reconstruction slice with multiple entropy slices compared to JM 13.0 no slices | |
|---|---|---|---|---|---|
| | | BD SNR [dB] | BD Bit rate [%] | BD SNR [dB] | BD Bit rate [%] |
| BigShip | 720p | −0.22 | 4.54 | −0.08 | 1.61 |
| City | 720p | −0.28 | 4.03 | −0.06 | 0.84 |
| Crew | 720p | −0.42 | 11.67 | −0.11 | 2.98 |
| Night | 720p | −0.38 | 5.64 | −0.06 | 0.91 |
| ShuttleStart | 720p | −0.39 | 9.12 | −0.12 | 2.81 |
| AVERAGE | | −0.3380 | 7.00 | −0.0860 | 1.83 |

TABLE 14

Comparison of rate distortion performance - IBBP encoding
IBBP Coding

| Sequence | Resolution | JM 13.0 slices compared to JM 13.0 no slices | | One reconstruction slice with multiple entropy slices compared to JM 13.0 no slices | |
|---|---|---|---|---|---|
| | | BD SNR [dB] | BD Bit rate [%] | BD SNR [dB] | BD Bit rate [%] |
| BigShip | 720p | −0.45 | 19.34 | −0.26 | 10.68 |
| City | 720p | −0.48 | 17.83 | −0.22 | 7.24 |
| Crew | 720p | −0.62 | 30.10 | −0.33 | 14.93 |
| Night | 720p | −0.36 | 11.11 | −0.19 | 5.5 |
| ShuttleStart | 720p | −0.82 | 28.69 | −0.55 | 18.89 |
| AVERAGE | | −0.5460 | 21.41 | −0.31 | 11.45 |

Comparing the results, encoding using multiple entropy slices in one reconstruction slice provides a bit rate savings of 5.17% and 9.96% for all-intra and IBBP coding, respectively, over encoding using slices, wherein entropy decoding and macroblock reconstruction for a slice does not depend on other slices, although both allow for parallel decoding.

Table 15 shows a comparison of rate distortion performance for all-intra and IBBP coding. In this table, the comparison is a comparison between encoding using no slices and encoding using one reconstruction slice partitioned into entropy slices, according to embodiments of the present invention, of maximum size 26 k bins per entropy slice. The first comparison, shown in the two sub-columns of column two, is a comparison using all-intra coding. On average, for the same bit rate, the quality is degraded by −0.062 dB by encoding using a reconstruction slice with multiple entropy slices. On average, for the same quality level, the bit rate is increased by 1.86% by encoding using a reconstruction slice with multiple entropy slices. Thus, for all-intra coding using entropy slices of maximum size 26 k bins per entropy slice, there is an average bit rate savings of approximately 0.64% over that of fixed entropy slice sizes of two rows of macroblocks.

The second comparison, shown in the two sub-columns of column three, is a comparison using IBBP coding. On average, for the same bit rate, the quality is degraded by −0.022 dB using one reconstruction slice with multiple entropy slices over encoding using no slices. On average, for the same quality level, the bit rate is increased by 0.787% by encoding using one reconstruction slice with multiple entropy slices over encoding using no slices. Thus, for IBBP coding using entropy slices of maximum size 26 k bins per entropy slice, there is an average bit rate savings of approximately 10.66% over that of fixed entropy slice sizes of two rows of macroblocks.

TABLE 15

Comparison of rate distortion performance - all-intra and IBBP encoding using entropy slices with less than 26k bins per entropy slice Entropy Slice Compared to JM 15.1 No Slice.
Experiment (1): 26k bins maximum per entropy slice

| | All Intra Coding | | IBBP Coding | |
|---|---|---|---|---|
| Sequence (720p) | BD SNR [dB] | BD Bit rate [%] | BD SNR [dB] | BD Bit rate [%] |
| BigShip | −0.07 | 1.40 | −0.02 | 0.70 |
| City | −0.07 | 1.02 | −0.02 | 0.51 |
| Crew | −0.05 | 1.31 | −0.03 | 1.25 |
| Night | −0.07 | 1.00 | −0.02 | 0.66 |
| ShuttleStart | −0.05 | 1.20 | −0.03 | −0.82 |
| AVERAGE | −0.062 | 1.187 | −0.022 | 0.787 |

The use of entropy slices allows for parallel decoding, and encoder partitioning of a reconstruction slice into entropy slices, wherein each entropy slice is less than a maximum number of bins may provide considerable bit rate savings over entropy slices of a fixed number of macroblocks.

Although the charts and diagrams in the figures may show a specific order of execution, it is understood that the order of execution may differ from that which is depicted. For example, the order of execution of the blocks may be changed relative to the shown order. Also, as a further example, two or more blocks shown in succession in a figure may be executed concurrently, or with partial concurrence. It is understood by those with ordinary skill in the art that software, hardware and/or firmware may be created by one of ordinary skill in the art to carry out the various logical functions described herein.

Some embodiments of the present invention may comprise a computer program product comprising a computer-readable storage medium having instructions stored thereon/in which may be used to program a computing system to perform any of the features and methods described herein. Exemplary computer-readable storage media may include, but are not limited to, flash memory devices, disk storage media, for example, floppy disks, optical disks, magneto-optical disks, Digital Versatile Discs (DVDs), Compact Discs (CDs), micro-drives and other disk storage media, Read-Only Memory (ROMs), Programmable Read-Only Memory (PROMs), Erasable Programmable Read-Only Memory (EPROMS), Electrically Erasable Programmable Read-Only Memory (EEPROMs), Random-Access Memory (RAMS), Video Random-Access Memory (VRAMs), Dynamic Random-Access Memory (DRAMs) and any type of media or device suitable for storing instructions and/or data.

The terms and expressions which have been employed in the foregoing specification are used therein as terms of description and not of limitation, and there is no intention in the use of such terms and expressions of excluding equivalence of the features shown and described or portions thereof, it being recognized that the scope of the invention is defined and limited only by the claims which follow.

What is claimed is:

1. A method for decoding a video frame in a video sequence, said method comprising:
   in a video decoder, receiving an entropy slice;
   identifying a slice-start elementary unit in said entropy slice;
   initializing a context model associated with entropy decoding said slice-start elementary unit to a first context model;
   identifying a first row-start elementary unit in said entropy slice; and
   initializing a context model associated with entropy decoding said first row-start elementary unit to a second context model.

2. The method as described in claim 1, wherein said first row-start elementary unit is a macroblock.

3. The method as described in claim 1, wherein said second context model is signaled in a bitstream associated with said entropy slice.

4. The method as described in claim 3, wherein said second context model is one of a plurality of context models associated with said bitstream.

5. The method as described in claim 1, wherein said second context model is determined from a neighboring context model associated with a neighboring elementary unit in said entropy slice to said first row-start elementary unit.

6. The method as described in claim 1, wherein said second context state is a default context model.

7. The method as described in claim 1 further comprising:
   identifying a second row-start elementary unit in said entropy slice; and
   initializing a context model associated with entropy decoding said second row-start elementary unit to a third context model.

8. The method as described in claim 1, wherein said start-slice elementary unit is a macroblock.

9. A method for decoding a video frame in a video sequence, said method comprising:
   in a video decoder, receiving an entropy slice;
   receiving a context-table-reset flag value for a context-table-reset flag;
   identifying a first row-slice elementary unit in said entropy slice; and when said context-table-reset flag value is a first value, initializing a context model associated with entropy decoding said first row-start elementary unit to a first context model.

10. The method as described in claim 9, further comprising:
identifying a slice-start elementary unit in said entropy slice; and
initializing a context model associated with entropy decoding said slice-start elementary unit to a second context model.

11. The method as described in claim 9 wherein said first row-start elementary unit is a macroblock.

12. The method as described in claim 9, wherein said first context model is signaled in a bitstream associated with said entropy slice.

13. The method as described in claim 12, wherein said first context model is one of a plurality of context models associated with said bitstream.

14. The method as described in claim 9, wherein said first context model is determined from a neighboring context model associated with a neighboring elementary unit in said entropy slice to said first row-start elementary unit.

15. The method as described in claim 9, wherein said first context model is a default context model.

16. The method as described in claim 9 further comprising:
identifying a second row-start elementary unit in said entropy slice; and
when said context-table-reset flag value is said first value, initializing a context model associated with entropy decoding said second row-start elementary unit to a second context model.

17. A method for encoding a video frame of a video sequence, said method comprising:
in an encoder, partitioning a frame of a video sequence into at least one reconstruction slice, thereby producing a first reconstruction slice;
forming a first entropy slice associated with said reconstruction slice;
identifying a first row-start elementary unit associated with said first entropy slice; and
signaling, in a bitstream associated with said video frame, a first context model associated with said first row-start elementary unit.

18. The method as described in claim 17, wherein said first context model is one of a plurality of context models associated with said bitstream.

19. The method as described in claim 17 further comprising signaling a context-model-reset flag value for a context-model-reset flag in said bitstream.

* * * * *